United States Patent [19]

Agrawal et al.

[11] Patent Number: 5,255,203
[45] Date of Patent: Oct. 19, 1993

[54] INTERCONNECT STRUCTURE FOR PROGRAMMABLE LOGIC DEVICE

[75] Inventors: Om P. Agrawal, San Jose; Michael J. Wright, Fresno City, both of Calif.

[73] Assignee: Advanced Micro Devices, Inc., Sunnyvale, Calif.

[21] Appl. No.: 538,211

[22] Filed: Jun. 14, 1990

Related U.S. Application Data

[63] Continuation-in-part of Ser. No. 394,221, Aug. 15, 1989, Pat. No. 5,212,652.

[51] Int. Cl.5 .......................................... H03K 17/693
[52] U.S. Cl. ..................................... 364/489; 364/488; 307/465.1; 307/242
[58] Field of Search ................ 364/488, 489, 490, 491; 307/465.1, 242

[56] References Cited

U.S. PATENT DOCUMENTS

| | | | |
|---|---|---|---|
| 4,642,487 | 2/1987 | Carter | 307/465 |
| 4,706,216 | 11/1987 | Carter | 365/94 |
| 4,713,557 | 12/1987 | Carter | 307/242 |
| 4,724,531 | 2/1988 | Angleton et al. | 364/490 |
| 4,758,985 | 7/1988 | Carter | 365/94 |
| 4,786,904 | 11/1988 | Graham, III et al. | 364/488 |
| 4,845,633 | 7/1989 | Furtek | 364/490 |
| 5,036,473 | 7/1991 | Butt et al. | 364/490 |

FOREIGN PATENT DOCUMENTS 0177261 4/1986 European Pat. Off. .
0415542 3/1991 European Pat. Off. .

OTHER PUBLICATIONS

"The Programmable Gate Array Design Handbook"; 1st Ed.; published by Xilinx; pp. 1-1 to 1-31.
"XC3000 Logic Cell Array Family"; Published by Xilinx; p. 1-31 (FIG. 15b).
"XC3000 Family of User-Programmable Gate Arrays" by R. H. Freedman, vol. 13, No. 5, Microprocessors and Microsystems, Jun. 1989, pp. 313-320.
"Reconfigurable Architectures for VLSI Processing Arrays" by Sanu et al., Proc. of IEEE, vol. 74, No. 5, May 1986, pp. 712-722.

*Primary Examiner*—Vincent N. Trans
*Attorney, Agent, or Firm*—Fliesler, Dubb, Meyer & Lovejoy

[57] ABSTRACT

A programmable gate array with an improved interconnect structure facilitates multi-source networks, communication of signals long distances across the array, and creation of networks in a symmetrical interconnect structure. The interconnect includes direct connections for each configurable logic block in the array to eight neighbors, including adjacent configurable logic blocks and next adjacent configurable logic blocks. Also, the interconnect includes uncommitted long lines which are driven by outputs of configurable logic blocks but not committed through the interconnect to inputs of any specific logic block. Rather, the uncommitted long lines are committed to connections to other segments of the interconnect. The interconnect structure also includes staggered switching matrices at the intersections of the horizontal and vertical buses in the interconnect. Repowering buffers that are configurable in both directions are associated with bidirectional lines in the interconnect, and include a bypass path. The interconnect provides for communication of control signals from off the chip, from any configurable logic block in the array, and from the input/output structures in the array to any or all other configurable logic blocks and input/output blocks in the array. Further, the interconnect structure has programmable interconnection between long lines and bidirectional general interconnect segments.

47 Claims, 41 Drawing Sheets

FIG.—1

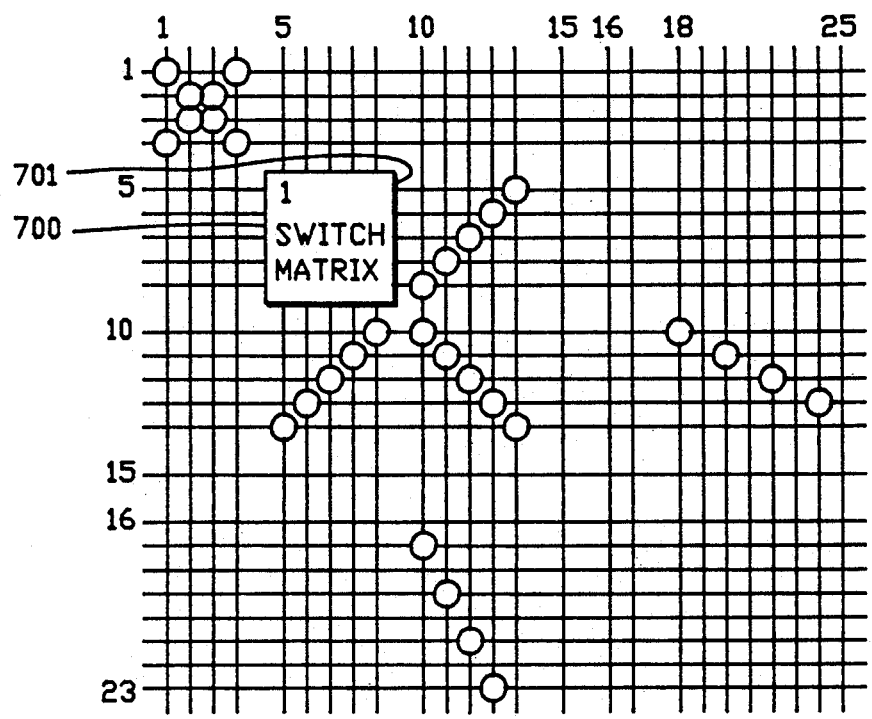
FIG.—7
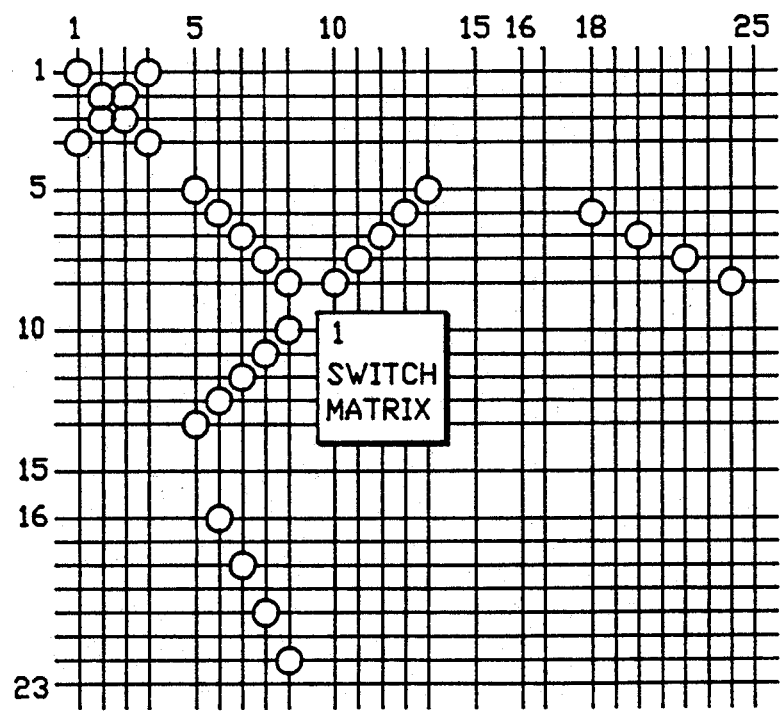
FIG.—8

SEGMENT BOX PLACEMENT ON
BUSES 1 & 9

CORNER INTERCONNECTS

HBUS1 TO VBUS1 INTERCONNECT

HBUS1 TO VBUS9 INTERCONNECT

HBUS9 TO VBUS1 INTERCONNECT

HBUS9 TO VBUS9 INTERCONNECT

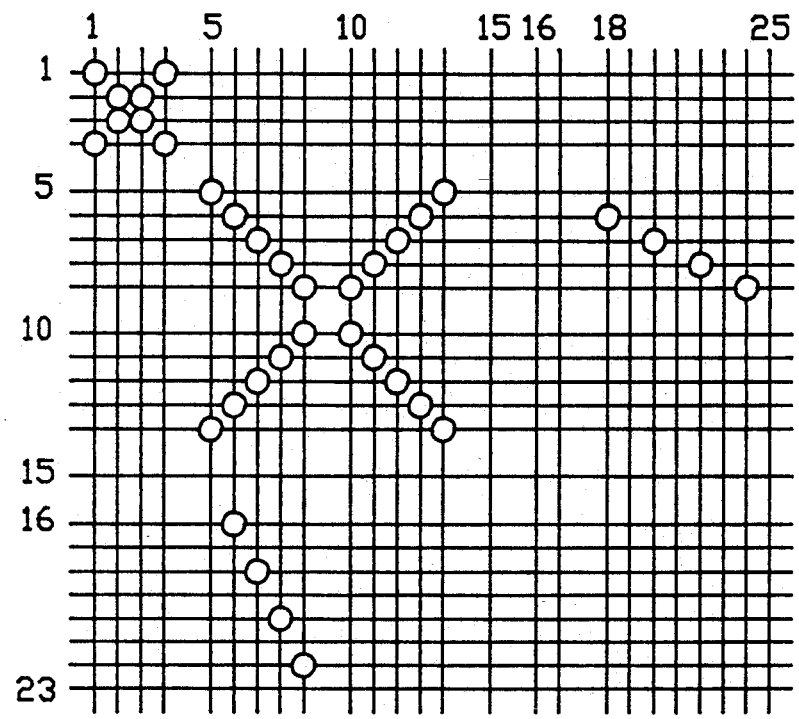
FIG.—14A

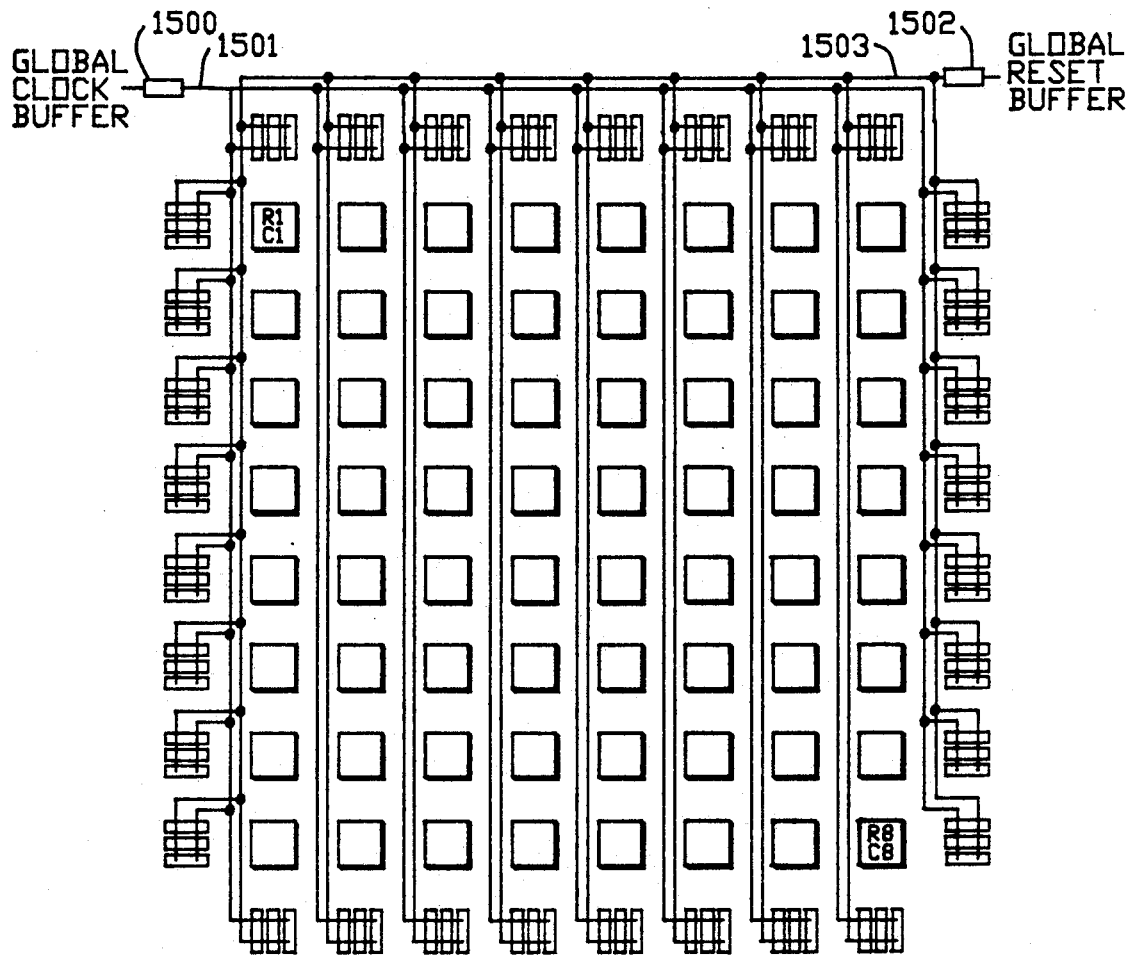
FIG.—15
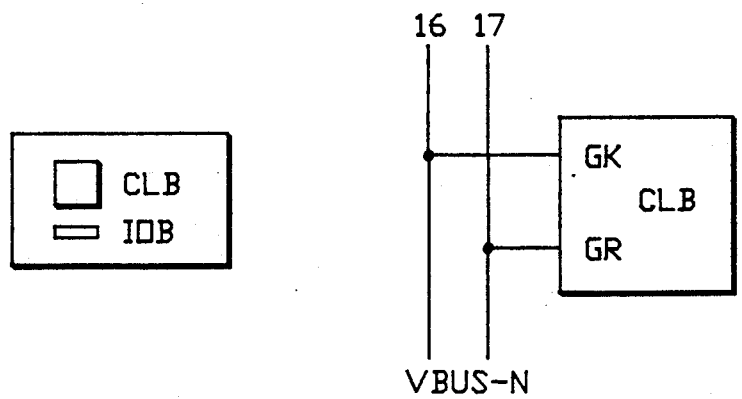
FIG.—15A

SPECIAL INPUT TO GLOBAL BUFFERS

INPUTS TO THE GLOBAL CLOCK BUFFER

ALTERNATE GLOBAL BUFFERS
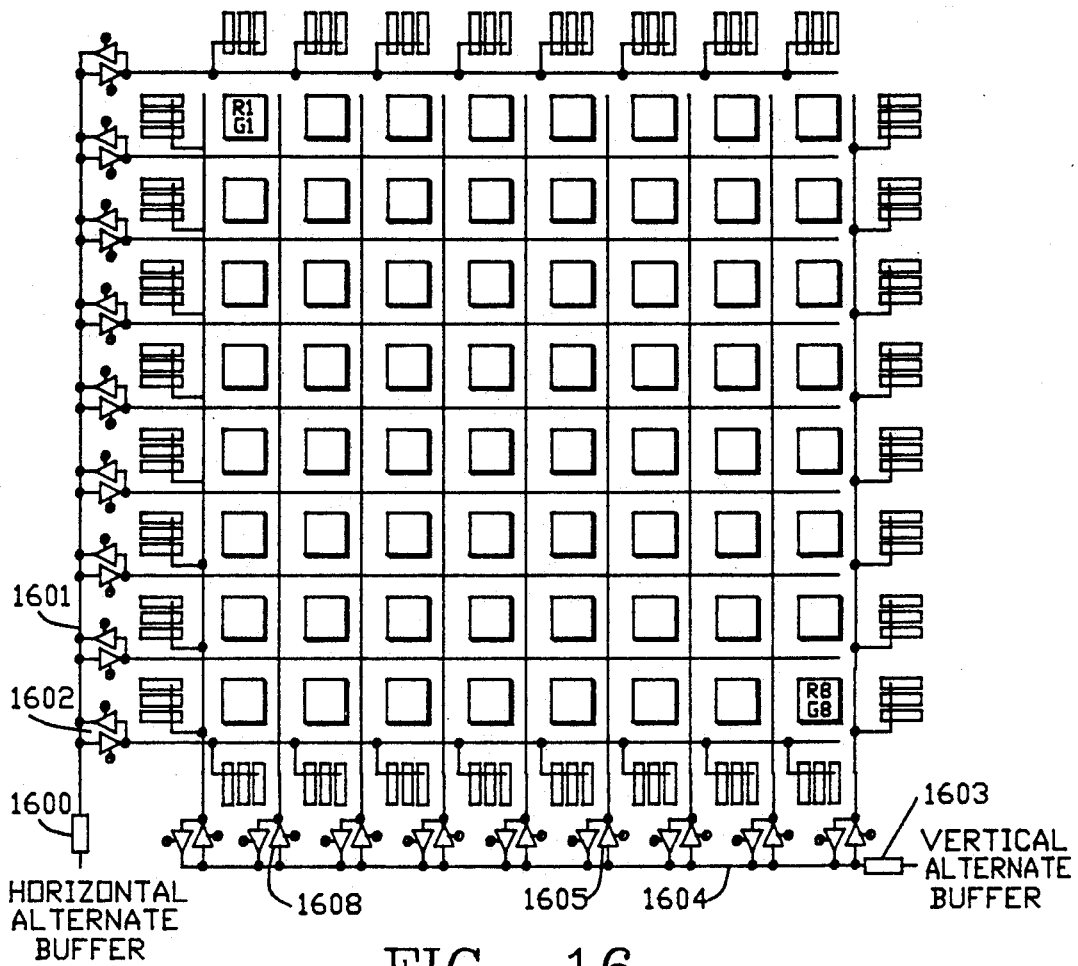
FIG.—16
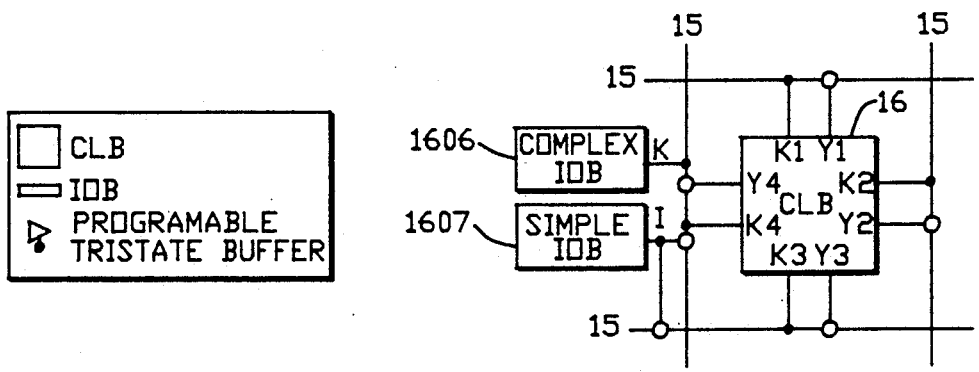
FIG.—16A

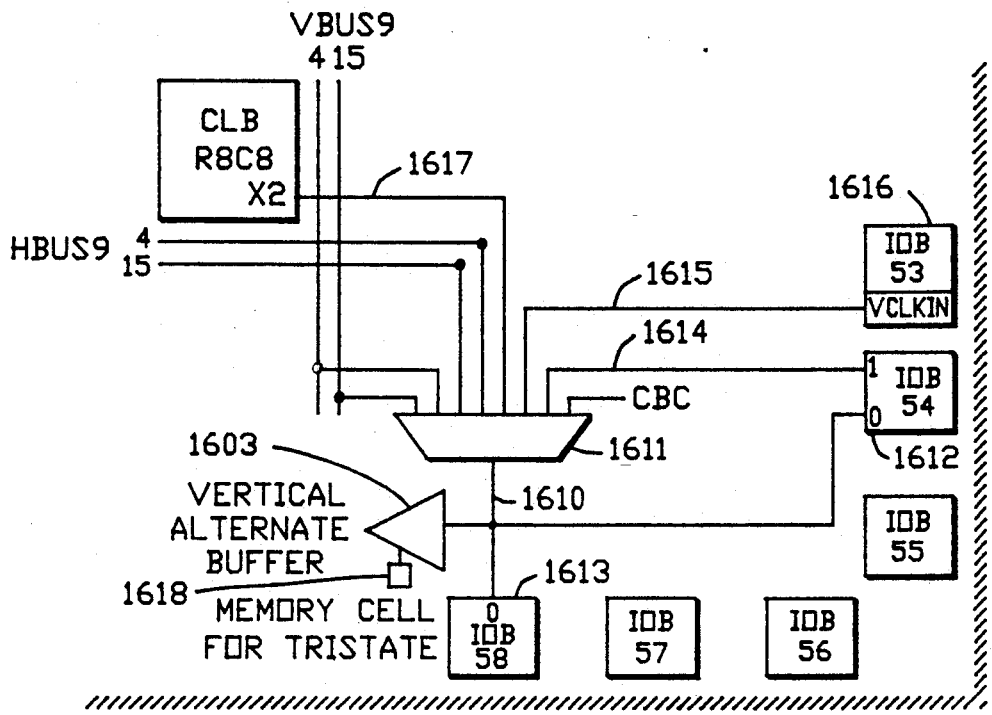
FIG.—16B
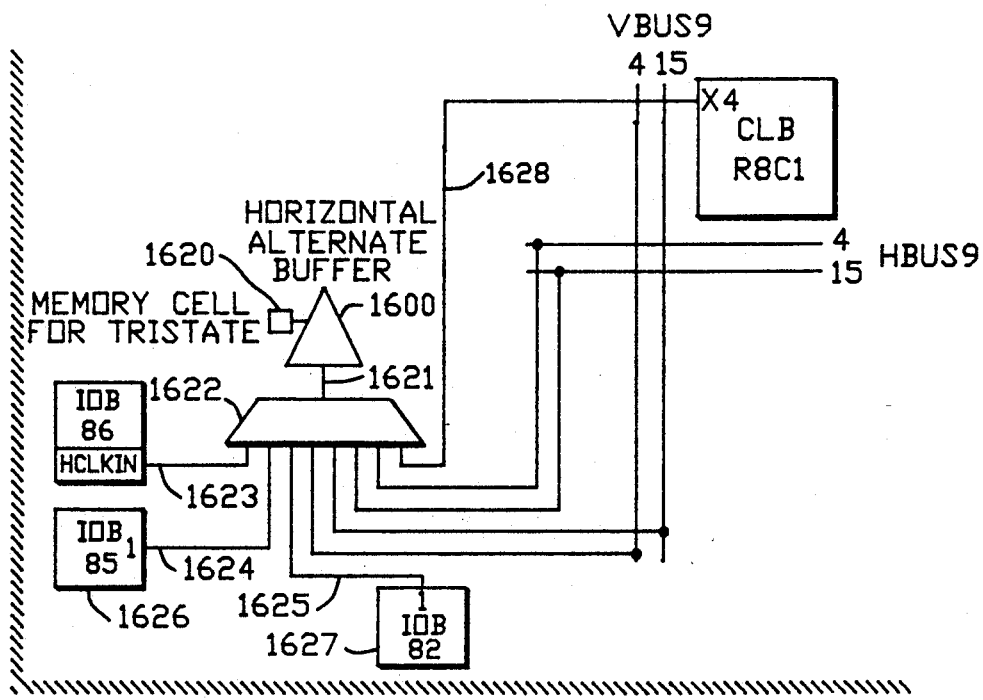
FIG.—16C

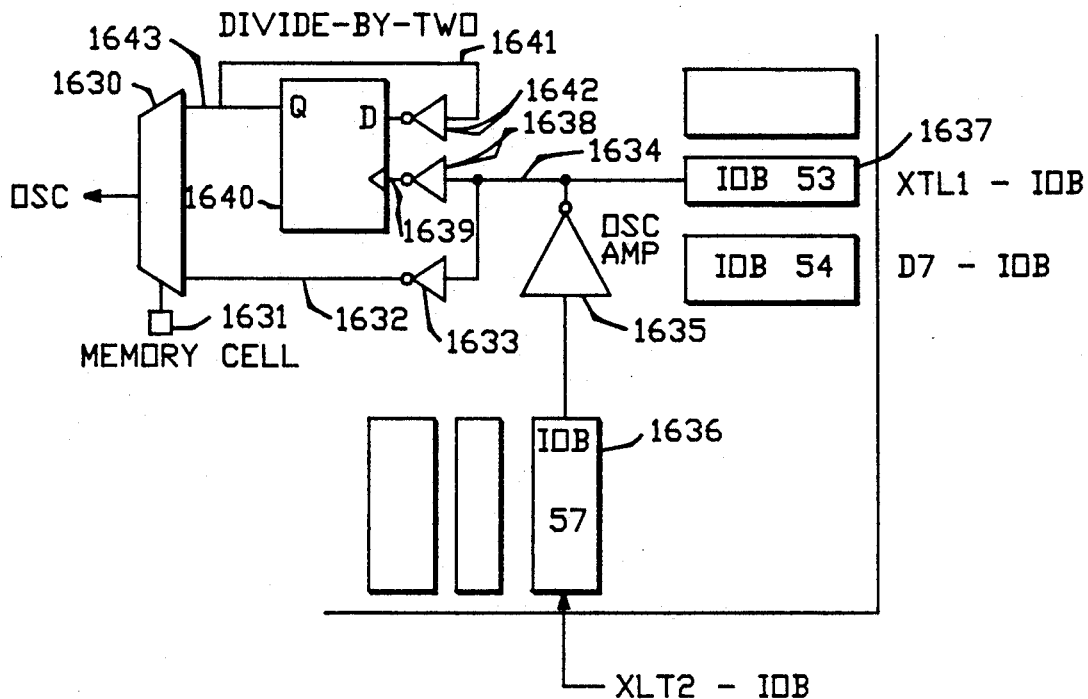
FIG.—16D
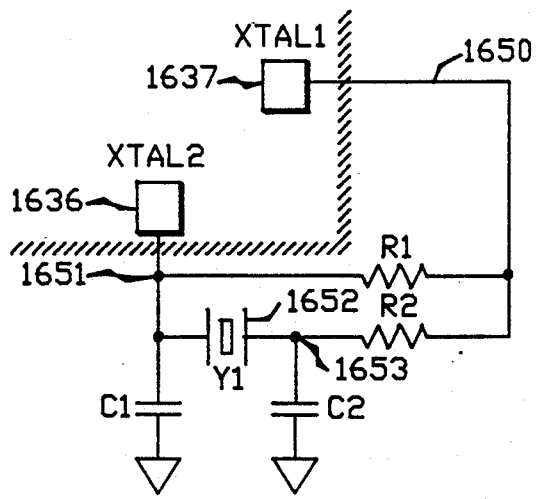
FIG.—16E

SWITCH MATRIX INTERCONNECTION OPTIONS FOR EACH TERMINAL

OUTER BUS SEGMENT BOXES

VERTICAL SEGMENT BOX

HORIZONTAL SEGMENT BOX

SEGMENT BOX INTERCONNECTIONS FOR EACH PIN

CLB TO UNCOMMITED LONG LINES

FIG.−38

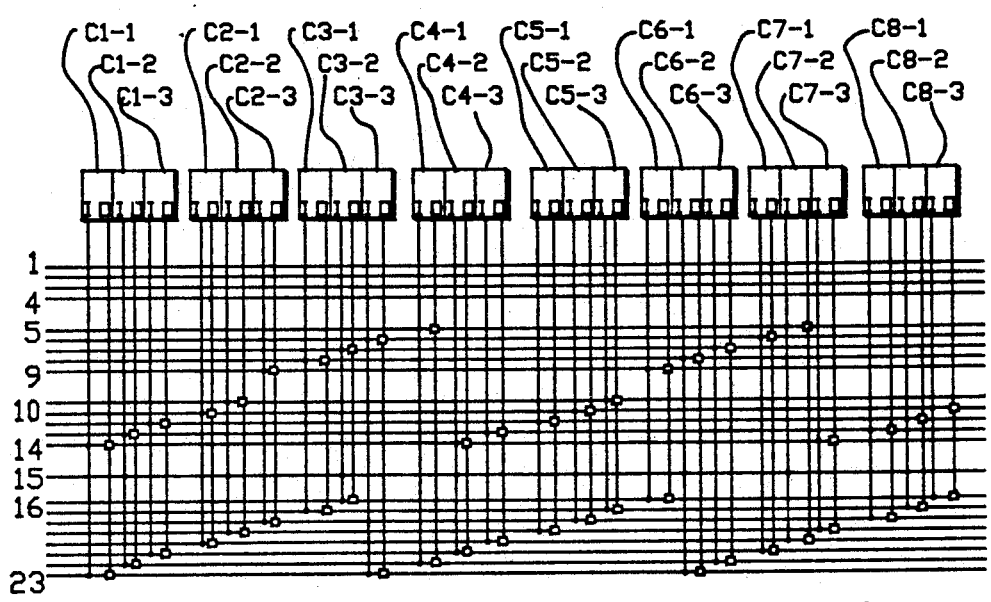
FIG.—40
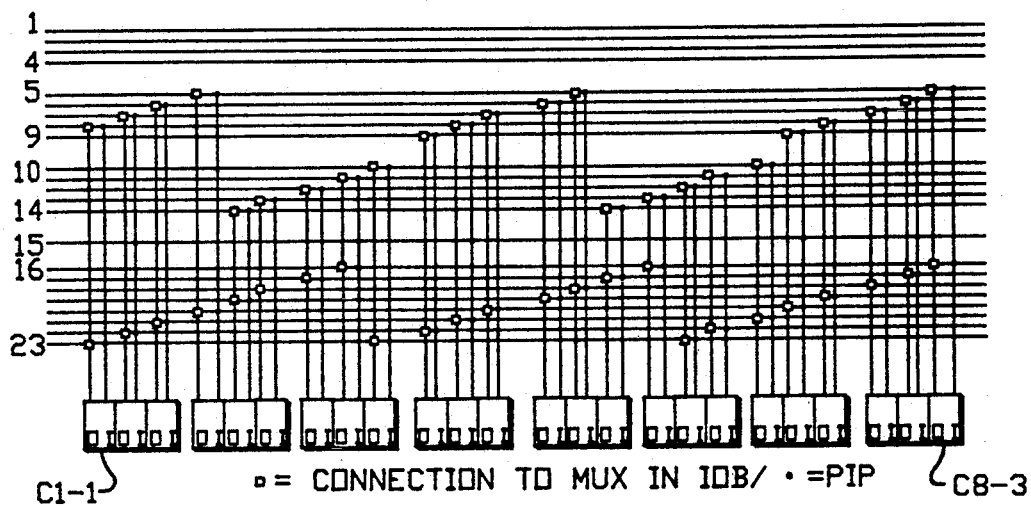
FIG.—41

IOB CONNECTIONS-LEFT SIDE
TO VERTICAL BUS1
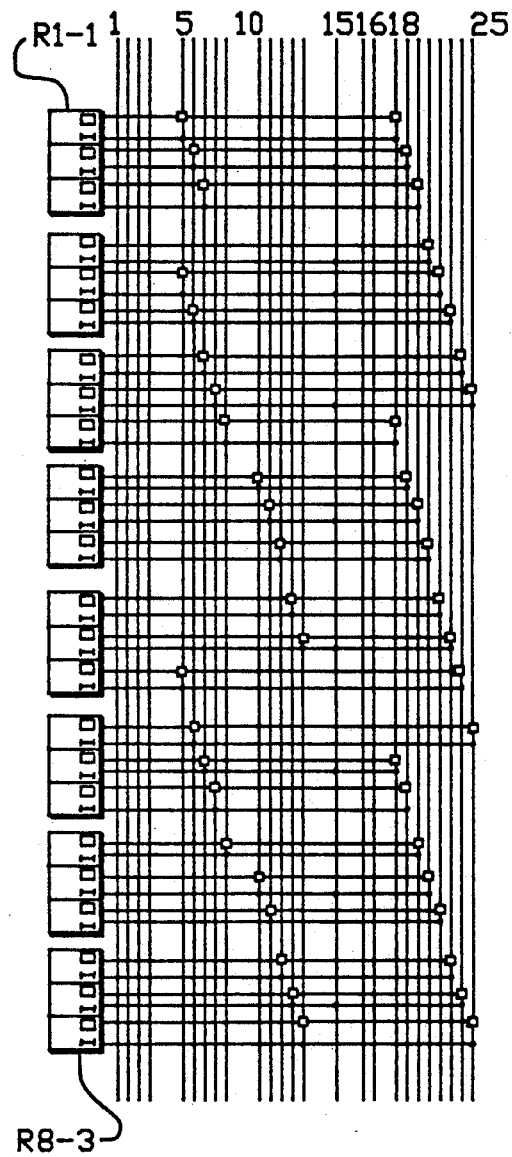
▫ = CONNECTION TO MUX IN IOB
• = PIP
FIG.−42
IOB CONNECTIONS-RIGHT SIDE
TO VERTICAL BUS9
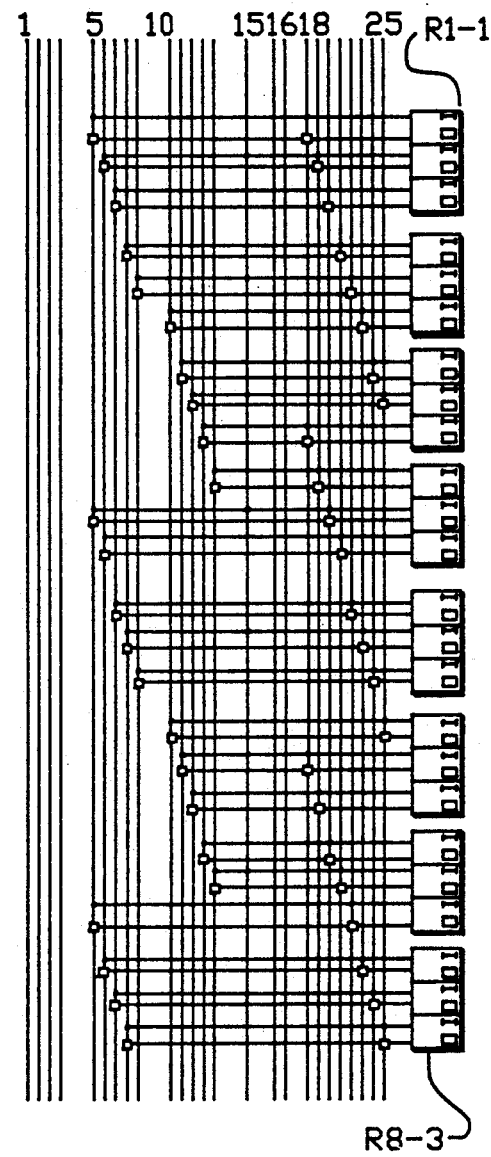
▫ = CONNECTION TO MUX IN IOB
• = PIP
FIG.−43

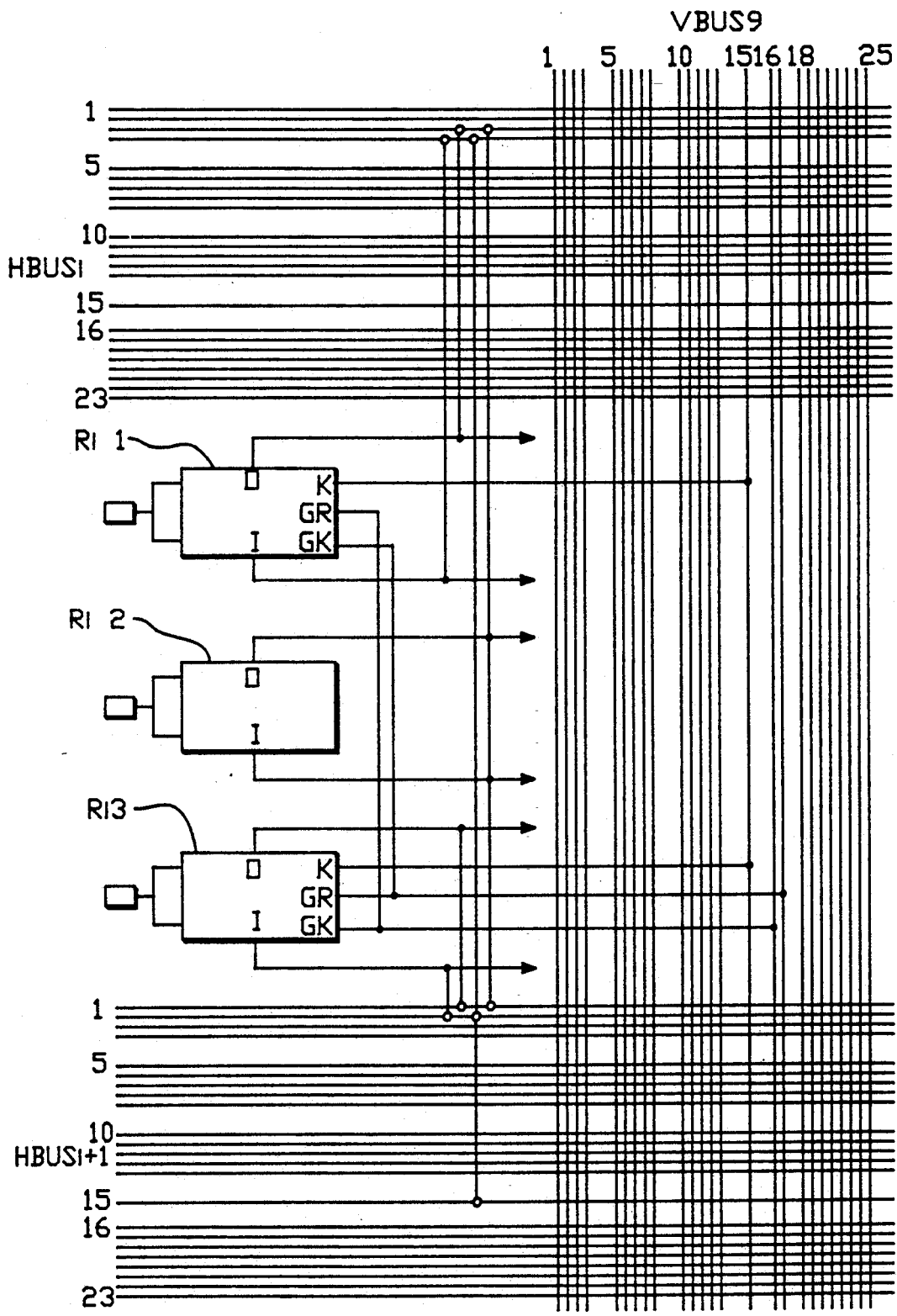
FIG.—46

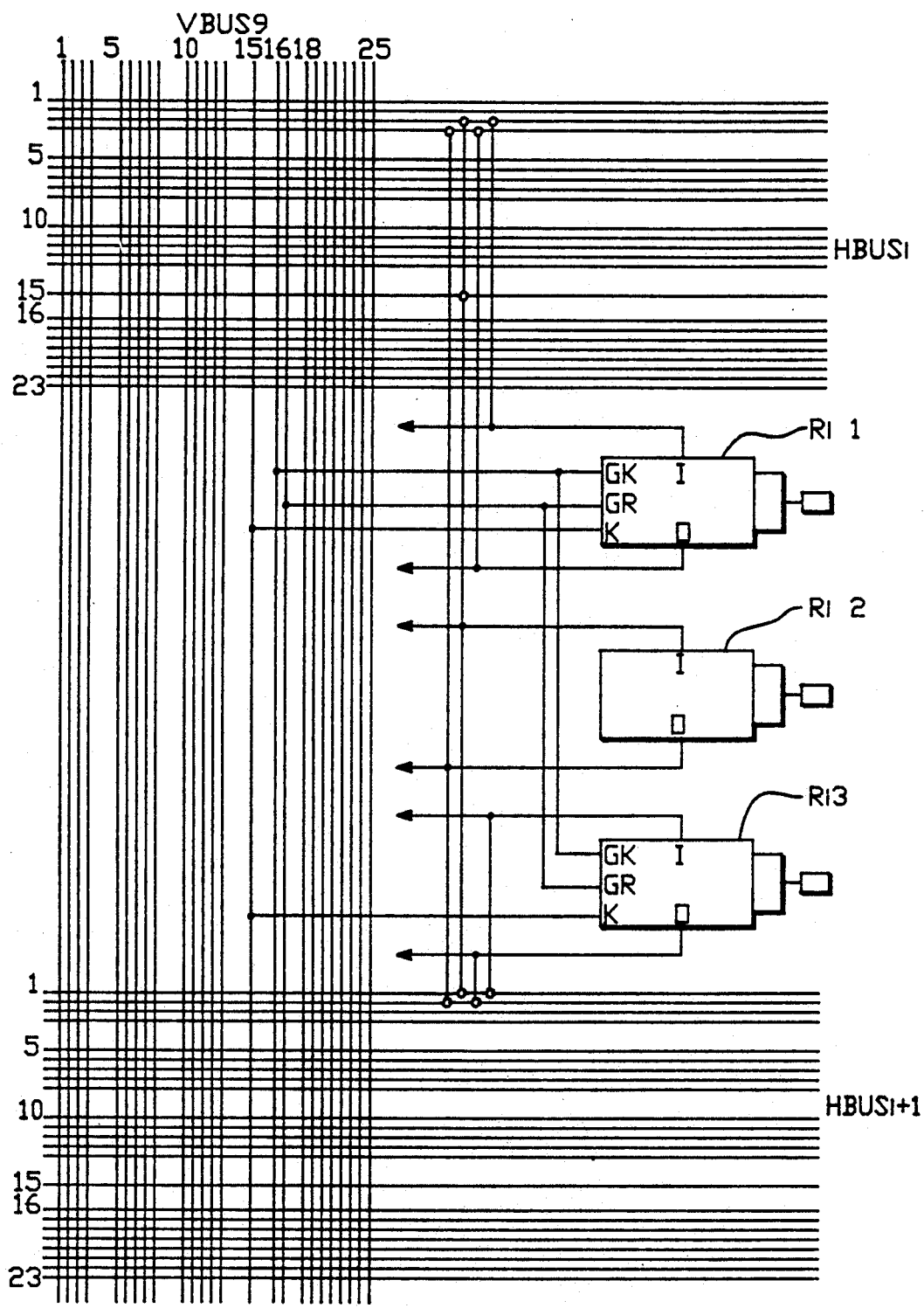
FIG.—47

IOB CONTROL INPUTS
IOBS AT TOP AND LEFT
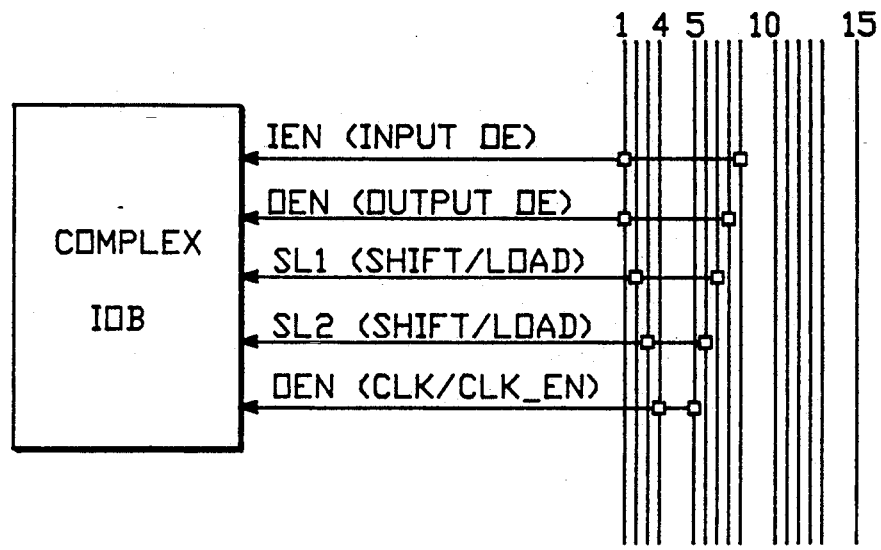
FIG.—48
IOBS AT RIGHT AND BOTTOM
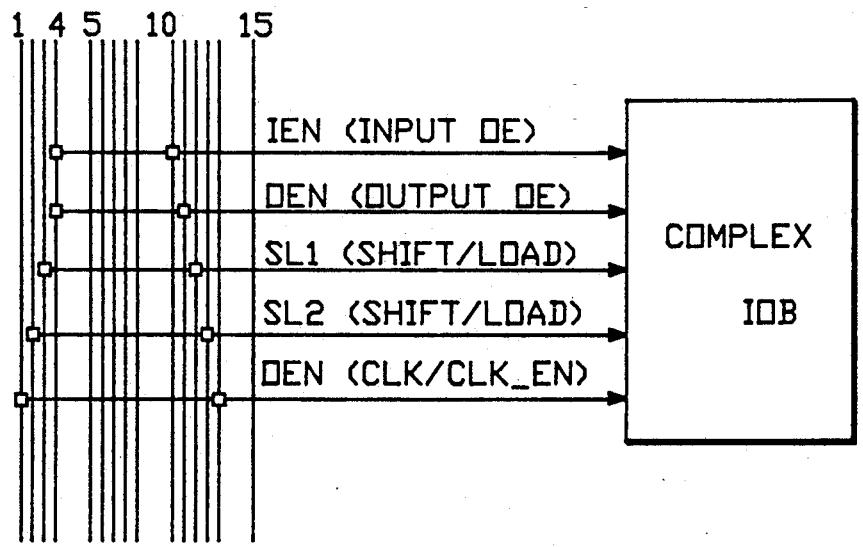
FIG.—49

INTERCONNECT STRUCTURE FOR PROGRAMMABLE LOGIC DEVICE

CONTINUING APPLICATION DATA

This application is a continuation-in-part of U.S. patent application Ser. No. 07/394,221, filed: Aug. 15, 1989 entitled: PROGRAMMABLE GATE ARRAY WITH AN IMPROVED INTERCONNECT STRUCTURE now U.S. Pat. No. 5,212,652.

FIELD OF THE INVENTION

The present invention relates generally to programmable logic devices and, more particularly, to programmable gate arrays consisting of an array of logic blocks and input/output blocks with a configurable interconnection structure.

DESCRIPTION OF RELATED ART

The programmable gate array is a high performance, user programmable device containing three types of configurable elements that are customized to a user system design. The three elements are (1) an array of configurable logic blocks (CLBs), (2) with input/output blocks (IOBs) around a perimeter, all linked by (3) a flexible programmable interconnect network.

The system design desired by a user is implemented in the device by configuring programmable RAM cells. These RAM cells control the logic functionality performed by the CLBs, IOBs and the interconnect. The configuration is implemented using PGA design software tools.

It is generally accepted that the programmable gate array was first commercially introduced by Xilinx of San Jose, Calif. Xilinx originally introduced the XC2000 series of logic cell arrays and has more recently introduced a second generation XC3000 family of integrated circuit programmable gate arrays. A description of the 2000 series, as well as related programmable logic device art, can be found in THE PROGRAMMABLE GATE ARRAY DESIGN HANDBOOK, First Edition, published by Xilinx, pages 1-1 through 1-31. The architecture for the XC3000 family is provided in a technical data handbook published by Xilinx entitled XC3000 LOGIC CELL ARRAY FAMILY, pages 1-31. Each of these Xilinx publications is incorporated by reference in this application as providing a description of the prior art.

The prior art in programmable gate arrays is further exemplified by U.S. Pat. Nos. 4,642,487; 4,706,216; 4,713,557; and 4,758,985; each of which is assigned to Xilinx, Inc. These U.S. patents are incorporated by reference as setting forth detailed descriptions of the programmable gate array architecture and implementations of the same.

As mentioned above, the programmable gate array consists of a configurable interconnect, a ring of configurable input/output blocks, and an array of configurable logic blocks. It is the combination of these three major features that provides flexibility and data processing power for programmable gate arrays. However, the programmable gate arrays of the prior art suffer certain limitations in the interconnect structure.

The configurable interconnect structure must provide the ability to form networks on the programmable gate array which optimize utilization of the resources on the chip. The prior art interconnect systems have tended to force connection in the logical network to configurable blocks in a relatively small area. For instance, a prior system provides direct connections only between adjacent configurable logic blocks. The inputs and outputs on the configurable logic blocks are arranged in a left to right or otherwise asymmetrical layout that forces signal flow in a certain direction across the chip. This causes congestion on the interconnect structure for applications requiring a large number of inputs or outputs. Also, this forces the printed circuit board layout, which includes one of these asymmetrically designed logic cell arrays, to provide for inputs on one side of the logic cell array and outputs on the other.

In addition, the prior art interconnect structures are limited in the number of multi-source networks that can be implemented.

It is desirable to provide a programmable gate array which provides for greater flexibility and logic power than provided by prior art devices.

SUMMARY OF THE INVENTION

The present invention provides an architecture for a configurable logic array with an interconnect structure which improves flexibility in creating networks to allow for greater utilization of the configurable logic blocks and input/output blocks on the device.

In one aspect, the present invention provides a configurable interconnect structure for a logic device, such as a programmable gate array. The configurable interconnect structure includes a configuration store, storing program data specifying a user defined interconnect function. A plurality of horizontal buses and vertical buses are included along the rows and columns of the logic array cells. Programmable switching elements are included at the intersections of the horizontal and vertical buses for interconnecting the horizontal and vertical buses in response to program data. The horizontal buses and the vertical buses include bidirectional, general interconnect (BGI) segments, which extend along a respective horizontal or vertical bus from the intersection of one of the crossing buses to the intersection of another of the crossing buses. Each of the BGI segments is connected to a plurality of programmable interconnect points for interconnecting respective inputs or outputs of logic cells and input/output cells in the array with the respective BGI segment. Also, each BGI segment is connected to the switching means at the intersections with crossing buses to allow for connection to other BGI segments in response to the program data. The buses also include long lines which extend across the array, each connected to programmable interconnect points for interconnecting outputs of logic cells and input/output cells in response to program data in the configuration store, and each connected directly to a plurality of inputs to the logic cells or input/output cells. Also, in one aspect of the invention, the buses include uncommitted long lines which do not have direct connections to inputs of input/output cells or logic cells, but have programmable connections to intersecting buses at the switching means and to outputs of the logic cells and input/output cells.

To enhance the versatility of the interconnect structure, the present invention provides a plurality of programmable interconnect means at the intersections of horizontal and vertical buses for interconnecting in response to program data in the configuration store a respective horizontal (BGI) segment and vertical long line, or a respective vertical (BGI) segment and a horizontal long line.

Other aspects and advantages of the present invention can be seen upon review of the Figures, the Detailed Description, and the claims which follow.

BRIEF DESCRIPTION OF THE FIGURES

FIG. 14A illustrates an alternative corner connection scheme that can be used at all four corner intersections, replacing the schemes of FIGS. 11-14.

FIG. 15 illustrates the connection of lines 16 and 17 of the vertical buses with the global reset and global clock buffers.

FIG. 15A illustrates the connection of the vertical lines 16 and 17 with the configurable logic blocks.

FIG. 16 illustrates the connection of the horizontal alternate buffers with line 15 on the horizontal buses and the vertical alternate buffers with line 15 on the vertical buses.

FIG. 16A illustrates the connection of the input/output blocks and the configurable logic blocks with line 15.

FIG. 16B illustrates the input paths to the vertical alternate buffer.

FIG. 16C illustrates the input paths to the horizontal alternate buffer.

FIG. 16D illustrates the crystal oscillator circuit by which the oscillator signal OSC is generated on the chip.

FIG. 16E illustrates the external connections for the oscillator of FIG. 16D.

FIG. 40 illustrates the programmable connections between the input/output blocks on the top side of the configurable array and horizontal bus 1.

FIG. 41 illustrates the programmable connections between horizontal bus 9 and the input/output blocks on the bottom side of the configurable array.

FIG. 42 illustrates the programmable interconnects between the vertical bus 1 and the input/output blocks on the left side of the array.

FIG. 43 illustrates the programmable interconnects between vertical bus 9 and the input/output blocks on the right side of the array.

FIG. 46 illustrates the connection of the clock and reset signals to the input/output blocks on the left side, and connection of these left side input/output blocks to horizontal buses.

FIG. 47 illustrates the connection of the clock and the reset signals to the input/output blocks on the right side of the array, and connection of these right side input/output blocks to the horizontal buses.

FIG. 48 illustrates the connection of the control signal inputs on the input/output blocks on the top and left side of the array to the adjacent interconnect buses.

FIG. 49 illustrates the connection of the control signal inputs to the input/output blocks on the right and bottom side of the array to the adjacent interconnect buses.

DETAILED DESCRIPTION

With reference to the figures, a detailed description of a preferred embodiment of the present invention is provided.

Figure 1:
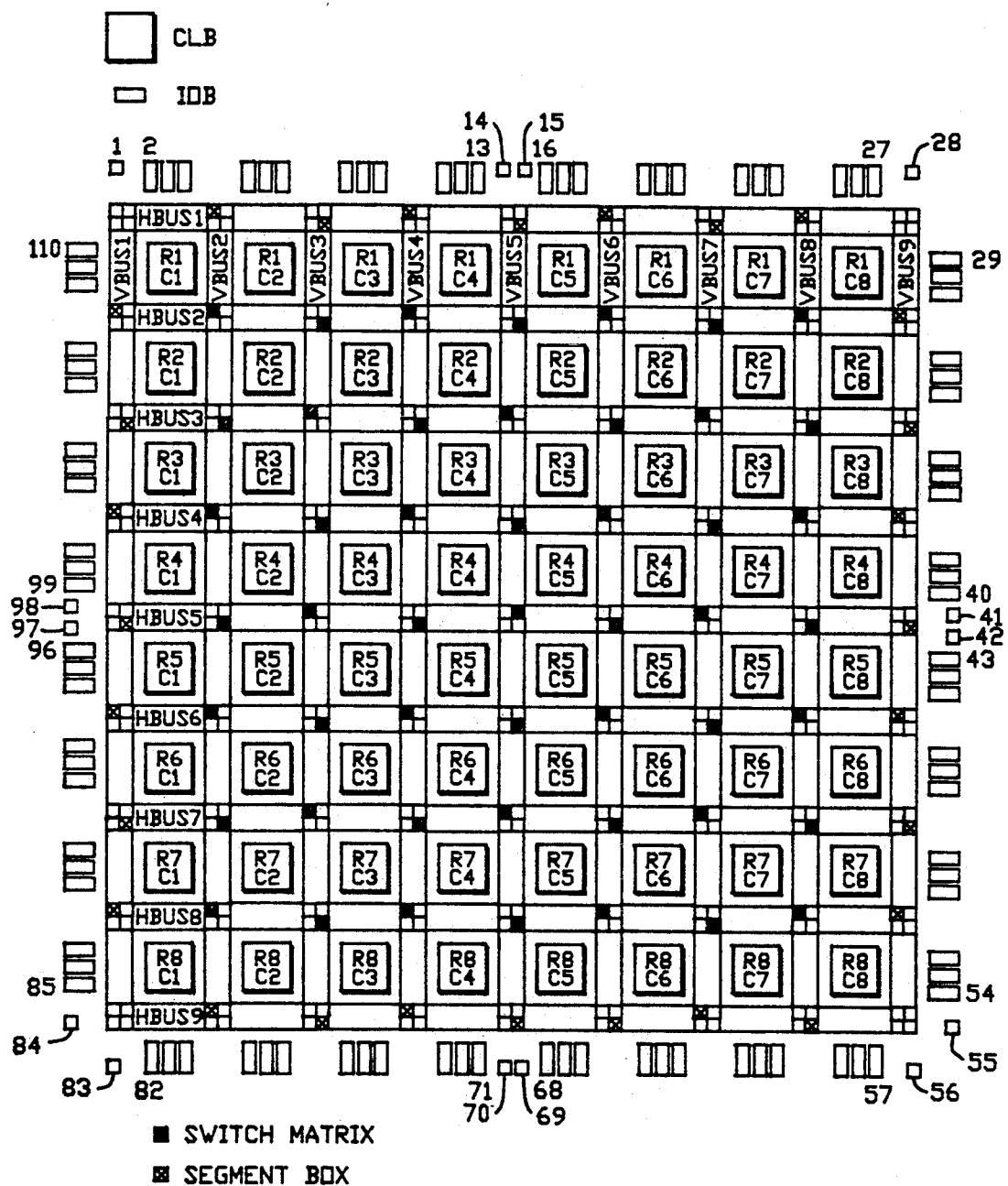
FIG. 1 is schematic diagram illustrating the layout of the programmable gate array according to the present invention.
Figure 2:
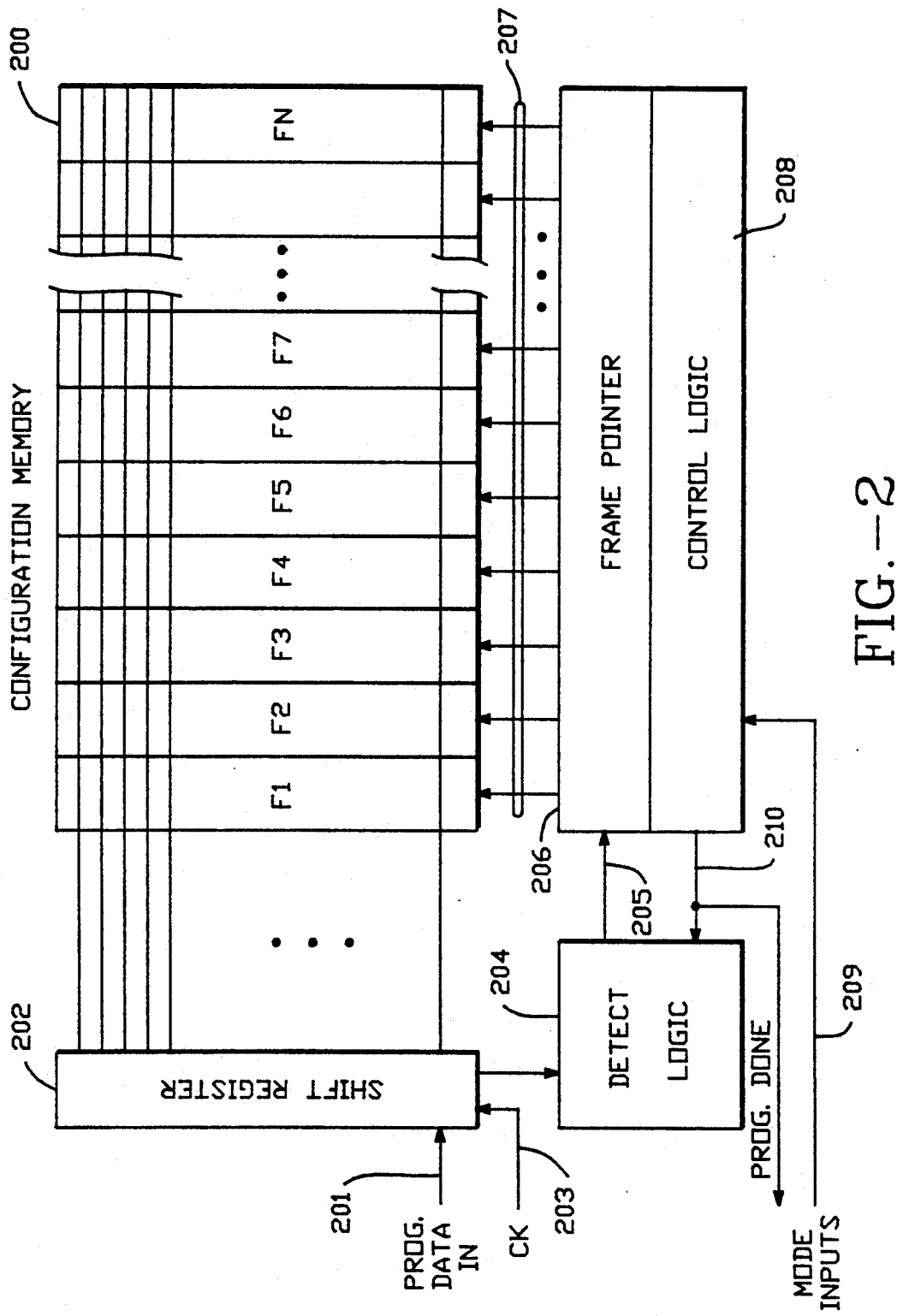
FIG. 2 is a schematic diagram of the configuration memory in the programmable gate array according to the present invention.
Figure 3:
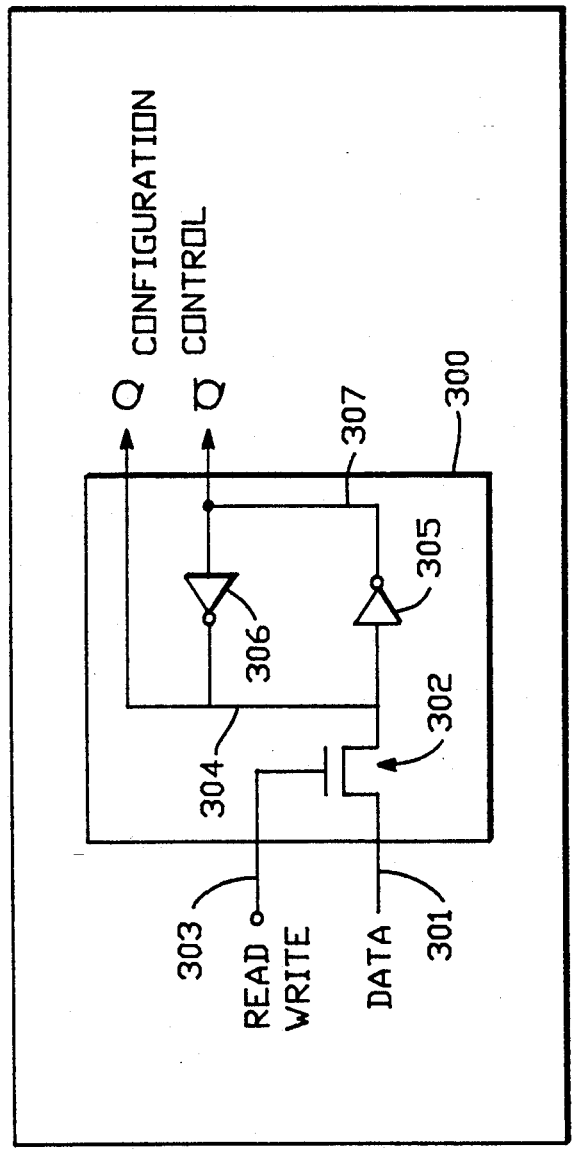
FIG. 3 is a diagram of the configuration memory storage cell.

First, with reference to FIGS. 1-3, the basic layout and programming structure of the programmable gate array is described. Next, a detailed description of the interconnect structure is set out with reference to FIGS. 4-24. This is followed by a description of the connections among the configurable logic blocks, input/output cells and the interconnect structure with reference to FIGS. 25-39.

I. Layout and Programming Structure

FIG. 1 illustrates the layout of the programmable gate array according to the present invention. Also provided in FIG. 1 is a notation which is utilized to describe the programmable gate array in this application. Accordingly, the programmable gate array shown in FIG. 1 consists of an array of configurable logic blocks illustrated by the square symbol with bold lines shown at the upper left hand corner of the figure. Each configurable logic block in the array is labeled with a row and column number, i.e. in the upper left hand corner of the array, the configurable logic blocks are labeled R1C1, R1C2, and so on until the lower right hand corner of the array where the configurable logic block is labeled R8C8.

Around the peripheral of the array are 110 pads for connection to external pins. Pads 2-13, 16-27, 29-40, 43-54, 57-68, 71-82, 85-96 and 99-110 are coupled to configurable input/output blocks represented by the symbol shown in the upper left hand corner of the figure. Pads 1, 14, 15, 28, 41, 42, 55, 56, 69, 70, 83, 84, 79 and 98 are utilized for functions other than configurable input/output blocks, such as power, ground, global clock and reset signal inputs, and programming mode control signals. The connection of these miscellaneous pads is similar to that done in prior art programmable gate array and is not further described here.

The interconnect structure consists of nine horizontal buses labeled HBUS1 through HBUS9 with nine intersecting vertical buses VBUS1 through VBUS9. The intersections of vertical bus 1 and vertical bus 9 with the horizontal buses 2-8 are characterized by having segment boxes which provide programmable interconnection between the respective horizontal bus and the vertical bus as described in detail below. Likewise, the intersections of horizontal bus 1 and horizontal bus 9 with vertical buses 2-8 are characterized by segment boxes providing the programmable interconnection between the horizontal and vertical buses.

The intersections of the vertical buses 2-8 with the horizontal buses 2-8 are characterized by switching matrices providing for interconnection between the respective horizontal and vertical buses. The placement of the segment boxes and switching matrices is schematically illustrated in FIG. 1 using the symbols illustrated in the lower left hand corner of the figure. The detailed structure of the switching matrices and segment boxes is described below.

The programmable gate array according to the present invention contains three types of configurable elements that are customized to a user system design which is specified in a configuration memory. The three configurable elements are the array of configurable logic blocks (CLBs), the configurable input/output blocks (IOBs) around the perimeter, and the programmable interconnect network.

The system design of a user is implemented in the programmable gate array by configuring programmable RAM cells known as a configuration memory. These RAM cells control the logic functionality performed by the CLBs, IOBs, and the interconnect. The loading of the configuration memory is implemented using a set of design software tools as well known in the art.

The perimeter of configurable IOBs provide a programmable interface between the internal logic array and device package pins. The array of CLBs perform user specified logic functions. The interconnection consists of direct connections between specific CLBs or IOBs, and a general connect that is programmed to form networks carrying logic signals among the blocks.

The logic functions performed by the CLBs are determined by programmed lookup tables in the configuration memory. Functional options are performed by program controlled multiplexers. Interconnecting networks between blocks are composed of metal segments joined by programmable interconnect points (PIPs).

The logic functions, functional options, and interconnect networks are activated by program data which is loaded into an internal distributed array of configuration memory cells. The configuration bit stream is loaded in to the device at power up and can be reloaded on command.

FIG. 2 is a schematic diagram of the programmable gate array as seen by the program data. The programmable gate array includes a plurality of distributed memory cells referred to as the configuration memory 200. Program data on line 201 is loaded into shift register 202 in response to a clock signal on line 203. The detect logic 204 determines when the shift register is full by reading a preamble from data on 201. When the shift register is full, the detect logic 204 signals across line 205 a frame pointer logic 206 which generates frame pointer signals across lines 207. Control logic 208 is responsive to the mode inputs to the device on line 209 to control the detect logic 204 across line 210 and the frame pointer during loading of the configuration memory 200.

The configuration memory 200 is organized into a plurality of frames F1-FN. As program data is loaded into the shift register, the frame pointer F1 is activated to load the first frame in the configuration memory. When the shift register is loaded with the second frame of data, the frame pointer for F2 is activated, loading the second frame F2, and so on until the entire configuration memory is loaded. Control logic 208 generates a program done signal on line 210.

The static memory cell used in the configuration memory is shown in FIG. 3. It has been specially designed for high reliability and noise immunity. A basic cell 300 consists of a data input line 301 coupled to pass transistor 302. The gate of the pass transistor 302 is coupled to a read or write control signal on line 303. The output of the pass transistor 302 is coupled to line 304. Line 304 is coupled to the input of inverter 305 and to the output of inverter 306. The output of inverter 305 is coupled to line 307 which is coupled back to the input of inverter 306. Lines 304 and 307 provide Q and Q0 outputs for configuration control. Thus, the basic cell 300 consists of two CMOS inverters and a pass transistor. The pass transistor is used for writing and reading cell data. The cell is only written during configuration and only read during read-back in the programming mode. During normal operation, the pass transistor is off and does not affect the stability of the cell. The memory cell outputs Q and Q0 use full ground and $V_{CC}$ levels and provide continuous direct control.

The configuration store can also be implemented with other types of volatile or non-volatile storage cells. For instance, non-volatile memory, like EPROM, $E^2$-PROM, programmable resistive links, or Ferro RAM, could be used.

The device memory is configured as mentioned above by downloading a bit stream of program data from a host system or an external memory, such as an EPROM.

II. The Configurable Interconnect Structure

Horizontal and vertical buses of the interconnect structure and the interconnection of the horizontal and vertical buses are described with reference to FIGS. 4-24.

Figures 4, 5:
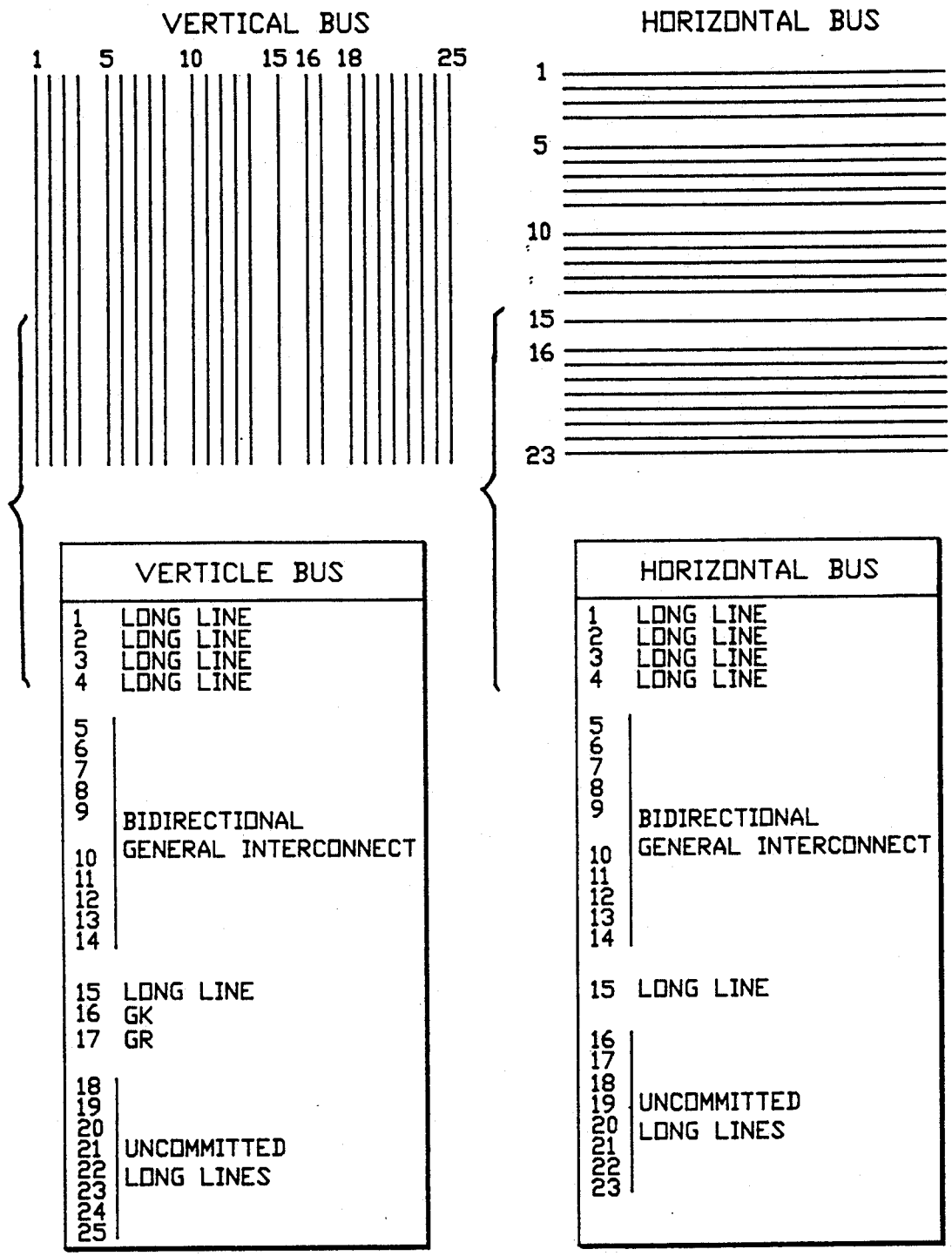
FIG. 4 illustrates a notation scheme for vertical buses in the programmable gate array.
FIG. 5 illustrates a notation scheme for the horizontal buses in the programmable gate array.

FIG. 4 illustrates the notation used for the vertical buses. Each vertical bus has 25 lines. Lines 1-4 and 15-17 are long lines which run across the entire array. Lines 5-14 consist of bidirectional general interconnect segments which are coupled through switching matrices and segment boxes as described below. Lines 18-25 are uncommitted long lines which run the entire length of the array.

FIG. 5 illustrates the notation used for the horizontal buses. Each horizontal bus is a 23 line bus in which lines 1-4 and 15 are long lines, lines 5-14 are bidirectional general interconnect segments, and lines 16-23 are uncommitted long lines. The distinctions between the long lines, the bidirectional general interconnect (BGI) segments, and the uncommitted long lines are set out in detail below.

In order to construct networks through a device, the horizontal and vertical buses require means of interconnection. This occurs at the intersections of the horizontal buses and the vertical buses. The interconnections between the lines at the intersection are made through programmable interconnect points, switch matrices, and segment boxes.

Figure 6:
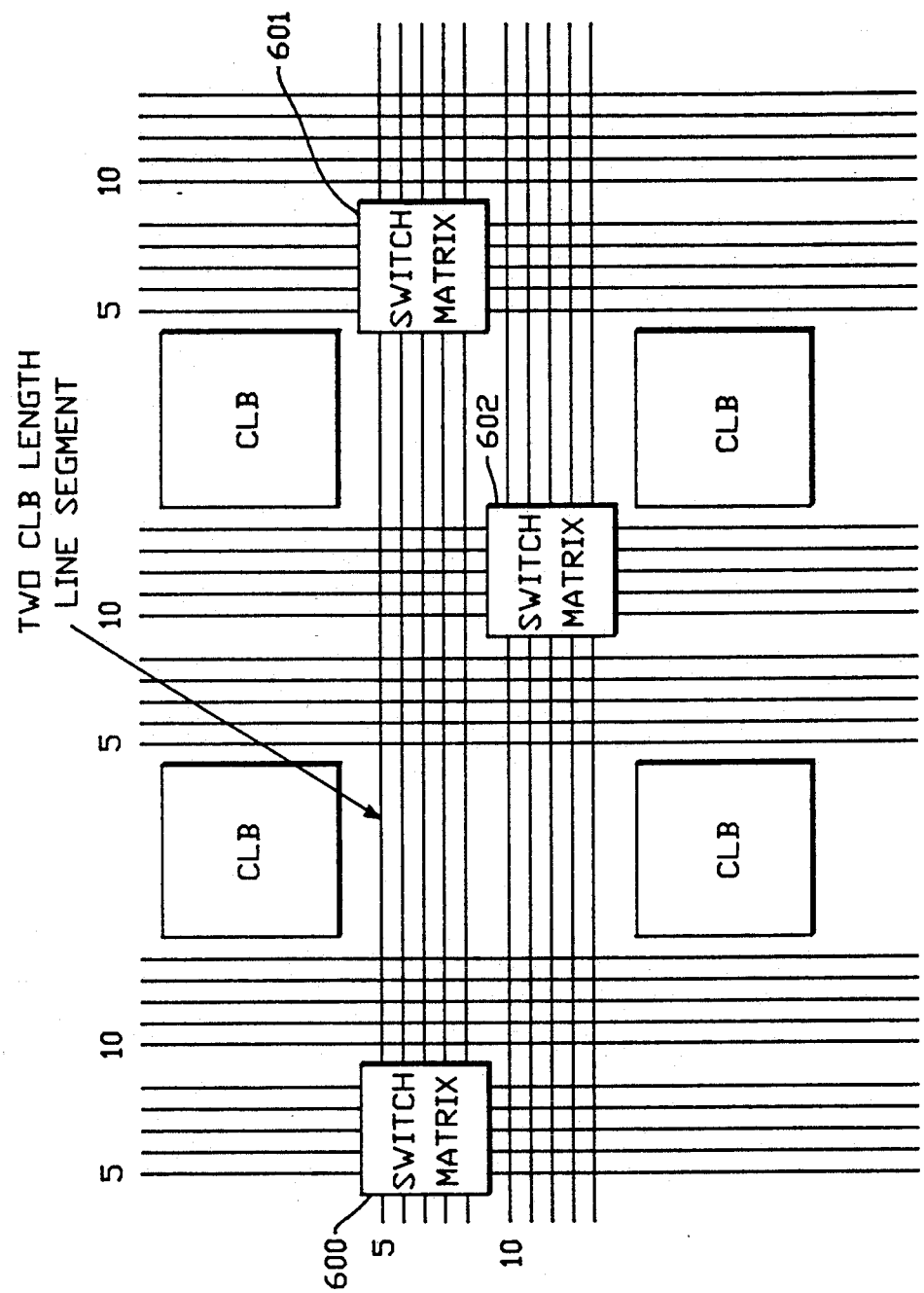
FIG. 6 illustrates the placement of the switch matrices in lines 5-14 of the horizontal and vertical buses in the programmable gate array.

FIG. 6 illustrates the placement of the switch matrices in the interconnect structure.

With reference to FIG. 1, it can be seen that the switch matrices are positioned at the intersections of vertical bus 2-8 with horizontal buses 2-8. FIG. 6 illustrates the placement of the switch matrices on horizontal bus 4 adjacent the configurable logic blocks R3C3, R3C4, R4C3, and R4C4. It can be seen that the switch matrices are positioned only on lines 5-14 of the bidirectional general interconnect BGI structure. Thus, the bidirectional general interconnect structure consists of BGI segments which are two configurable logic blocks in length, spanning, in this case, from switch matrix 600, located on vertical bus 3, to switch matrix 601, located on vertical bus 5 in lines 5-9 of a bidirectional general interconnect. Switch matrix 602 is coupled to BGI segments of line 10-14 which extend from vertical bus 2 to vertical bus 4 and vertical bus 4 to vertical bus 6. Vertical buses 2 and 6 are not shown in FIG. 6.

Using the switch matrix placement as shown in FIG. 6 and in FIG. 1, it can be seen that a connection to a BGI segment allows propagation of the signal across a width equal to two configurable logic blocks on the array without passing through a switch matrix. This allows networks with fewer delays due to switch matrices.

Figure 7:
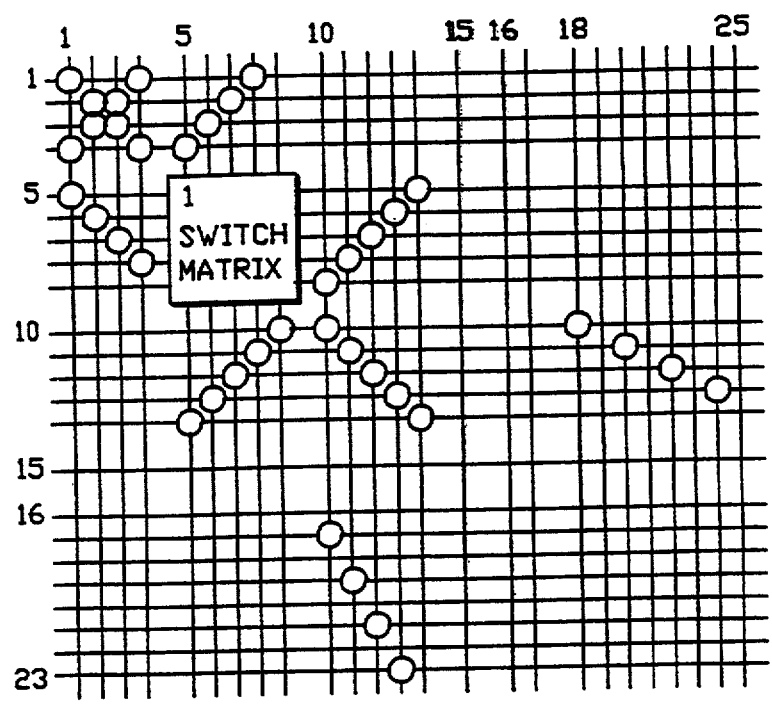
FIG. 7 illustrates the intersection of a vertical bus with a horizontal bus.
Figure 8:
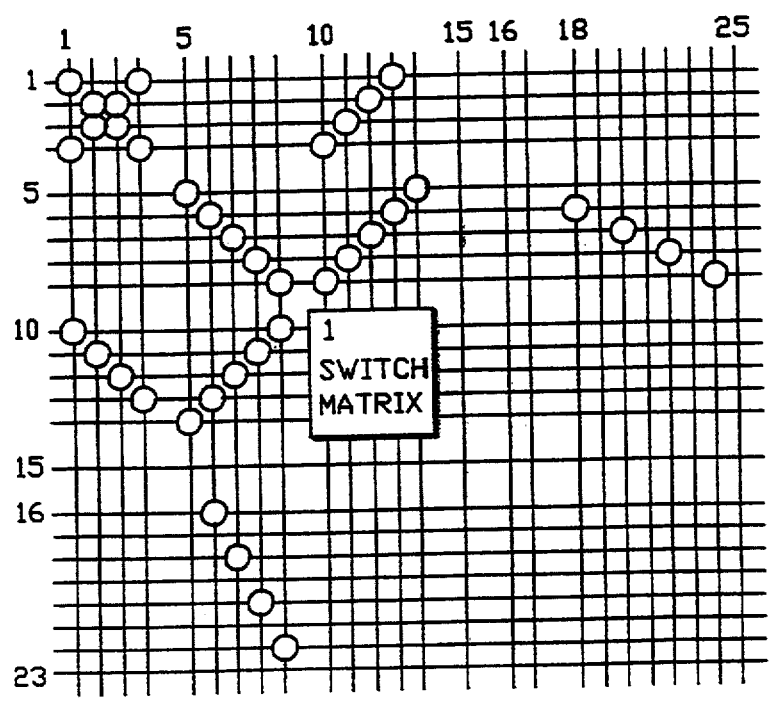
FIG. 8 illustrates an alternative intersection of a vertical bus with a horizontal.

FIGS. 7 and 8 illustrate the complete intersection between vertical buses 2-8 and horizontal buses 2-8, where a circle indicates a bidirectional programmable interconnect point controlled by a memory cell in the configuration memory.

FIG. 7 is the structure for the intersection of odd numbered vertical buses with odd numbered horizontal buses, and even numbered vertical buses with even numbered horizontal buses. FIG. 8 is the structure for the even-odd and odd-even intersections between vertical and horizontal buses.

It can be seen that in FIG. 7, horizontal long line 1 is connectable to vertical long lines 1 and 4. Horizontal long line 2 is connectable to vertical long lines 2 and 3. Horizontal long line 3 is connectable to vertical long lines 2 and 3. Horizontal long line 4 is connectable to vertical long lines 1 and 4.

Horizontal long lines 1-4 are connectable to vertical BGI segments 5-8, respectively. Also, vertical long lines 1-4 are connectable to horizontal BGI segments 5-8, respectively.

Horizontal BGI segments 5-9 are coupled to the left side 700 of a switch matrix. The right side 701 of the switch matrix provides horizontal BGI segment 5 which is connectable to vertical BGI segment 14. The horizontal BGI segment 6 output from the right side 701 of the switch matrix is connectable to vertical BGI segment 13. Horizontal BGI segment 7 from the switch matrix is coupled through a programmable interconnection point (PIP) to vertical BGI segment 12. Horizontal BGI segment 8 from the switch matrix side 701 is coupled through PIP to vertical BGI segment 11. Horizontal BGI segment 9 output from the right side 701 of the switch matrix is coupled through a PIP to vertical BGI segment 10.

The BGI segments 10-14 of the horizontal bus are connectable through PIPs to the BGI segments in the vertical bus 9-5 and 10-14 in the configuration shown.

BGI segments 10-13 of the horizontal bus are connectable to the even numbered uncommitted long lines 18, 20, 22, and 24 through PIPs as shown.

The horizontal long line 15 passes through the intersection without being connectable to any other line.

The odd numbered uncommitted long lines 17, 19, 21, and 23 in the horizontal bus are connectable through PIPs to the vertical BGI segments 10-13 as shown.

The interconnection of the even or odd numbered vertical buses with odd or even numbered horizontal buses, respectively, is shown in FIG. 8. As with the intersection shown in FIG. 7, the horizontal lines in the intersection structure of FIG. 8 are connectable through PIPs and the switch matrix to the vertical lines.

Horizontal long line 1 is connectable to vertical long lines 1 and 4. Horizontal long line 2 is connectable to vertical long lines 2 and 3. Horizontal long line 3 is connectable to vertical long lines 2 and 3. Horizontal long line 4 is connectable to vertical long lines 1 and 4.

Also, horizontal long lines 1-4 are connectable to vertical BGI segments 13, 12, 11 and 10 respectively. Vertical long lines 1-4 are connectable to horizontal BGI segments 10-13, respectively.

Horizontal BGI segments 5-9 are connectable to the BGI segments 5-14 as shown in the figure and to the even numbered uncommitted long lines 18, 20, 22, and 24. The horizontal BGI segments 10-14 are connectable to the vertical BGI segments 9-5 and through the switching matrix to the adjacent BGI segments of lines 10-14 in both the vertical and the horizontal buses. The even numbered uncommitted long lines 16, 18, 20, and 22 on the horizontal bus are connectable to the vertical BGI segments 6-9 as shown.

Figure 9:
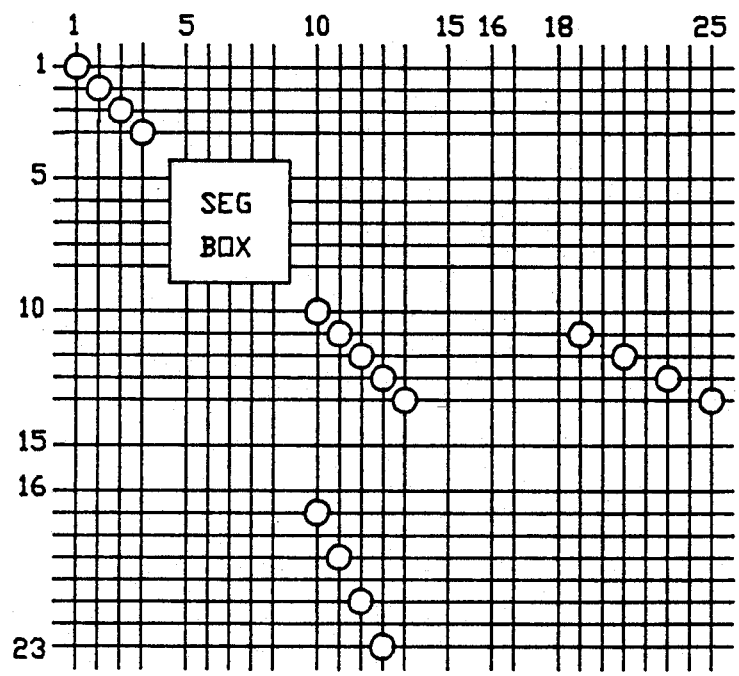
FIG. 9 illustrates the intersection of vertical buses 1 and 9 with even numbered horizontal buses and horizontal buses 1 and 9 with even numbered vertical buses.
Figure 10:
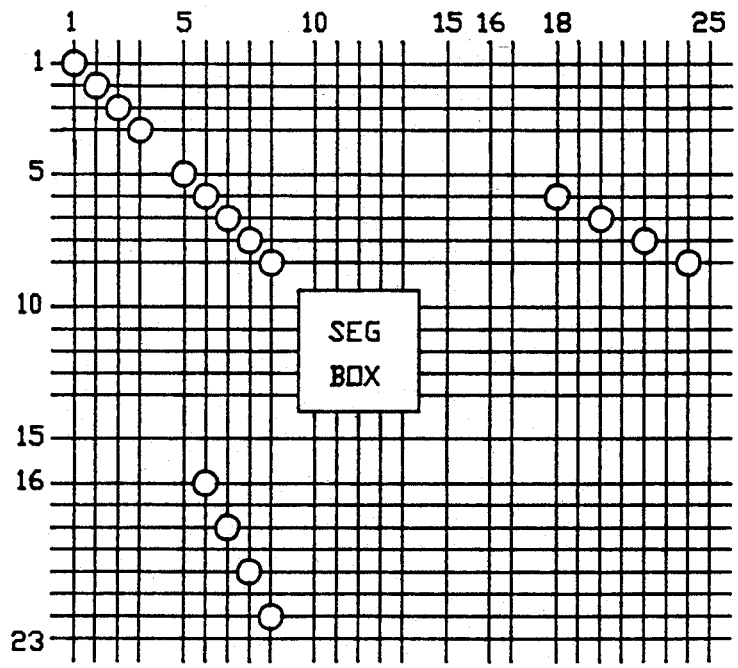
FIG. 10 illustrates the intersection of vertical buses 1 and 9 with the odd numbered horizontal buses and horizontal buses 1 and 9 with the odd numbered vertical buses.

FIG. 9 illustrates the intersection of horizontal buses 1 and 9 with the even numbered vertical buses 2-8 and vertical buses 1 and 9. FIG. 10 illustrates the intersection of the horizontal buses 1 and 9 with the odd numbered vertical buses 3-7.

Thus, the horizontal long lines 1-4 are connectable to vertical long lines 1-4 as shown. The horizontal BGI segments 5-9 are connectable through the segment box to vertical BGI segments 5-9. The horizontal BGI segments 10-14 are connectable to vertical BGI segments 10-14. Also, the BGI segments 11-14 are connectable to the odd numbered vertical uncommitted long lines 19, 21, 23, and 25.

The odd numbered horizontal uncommitted long lines 17, 19, 21, and 23 on the horizontal bus are connectable to the vertical BGI segments 10-13 as shown.

In the intersection shown in FIG. 10, horizontal long lines 1-4 on the horizontal bus are connectable respectively to vertical long lines 1-4. The horizontal BGI segments 5-9 are connectable to the vertical BGI segments 5-9 and to the even numbered vertical uncommitted long lines 18, 20, 22, and 24 as shown. The horizontal BGI segments 10-14 are connected to the segment box as are the vertical BGI segments 10-14. The even numbered uncommitted long lines 16, 18, 20, and 22 on the horizontal bus are connectable to vertical BGI segments 6-9 as shown.

Figure 11:
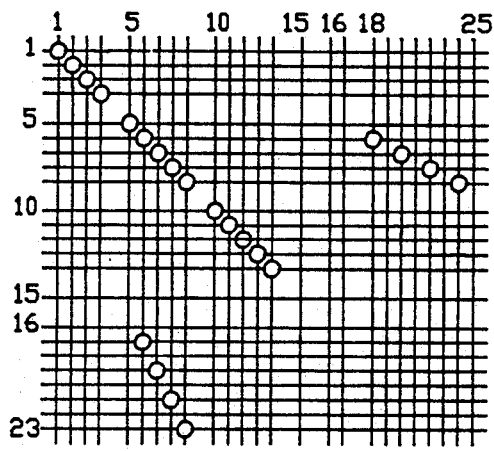
FIG. 11 illustrates the intersection of horizontal bus 1 with vertical bus 1 at the corner.

The corner intersections are shown in FIGS. 11-14. FIG. 11 illustrates the intersection of horizontal bus 1 with vertical bus 1. As shown, the lines 1-14 in the horizontal bus are connectable respectively to lines 1-14 in the vertical bus. The even numbered uncommitted long lines 18, 20, 22, and 24 on the vertical bus are connectable to horizontal BGI segments 6-9. The odd numbered uncommitted long lines 17, 19, 21, and 23 on the horizontal bus are connectable to the vertical BGI segments 6-9.

Figure 12:
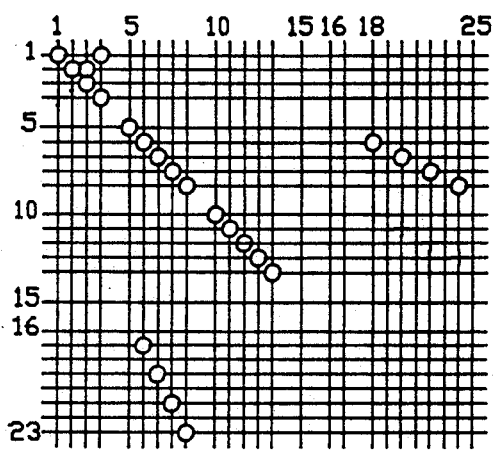
FIG. 12 illustrates the intersection of horizontal bus 1 with vertical bus 9 at the corner.

FIG. 12 illustrates the intersection of horizontal bus 1 with vertical bus 9. In this instance, the horizontal long line 1 is connectable to vertical long lines 1 and 4. Horizontal long line 2 is connectable to vertical long lines 2 and 3. Horizontal long lines 3-4 and BGI segments 5-14 are connectable respectively to vertical long lines 3-4 and BGI segments 5-14. The even numbered uncommitted long lines 18, 20, 22, and 24 on the vertical bus are connectable to horizontal BGI segment 6-9. The odd numbered uncommitted long lines 17, 19, 21, and 23 on the horizontal bus are connectable to the vertical BGI segments 6-9.

Figure 13:
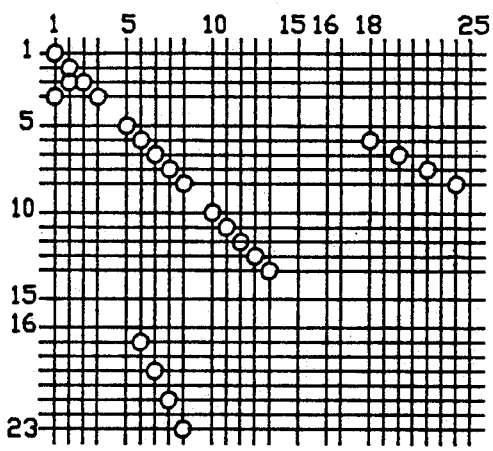
FIG. 13 illustrates the intersection of horizontal bus 9 with vertical bus 1 at the corner.

FIG. 13 illustrates the intersection of horizontal bus 9 with vertical bus 1. The horizontal long lines 1-4 and BGI segments 5-14 are connectable to the vertical long lines 1-4 and BGI segments 5-14, respectively. Also, horizontal line 3 is connectable to vertical long lines 2 and 3 and horizontal long line 4 is connectable to vertical long lines 1 and 4. The horizontal BGI segments 6-9 are also connectable to the even numbered uncommitted long lines 18, 20, 22 and 24 on the vertical bus. The odd numbered uncommitted long lines 17, 19, 21, and 23 on the horizontal bus are connectable to vertical BGI segments 6-9.

Figure 14:
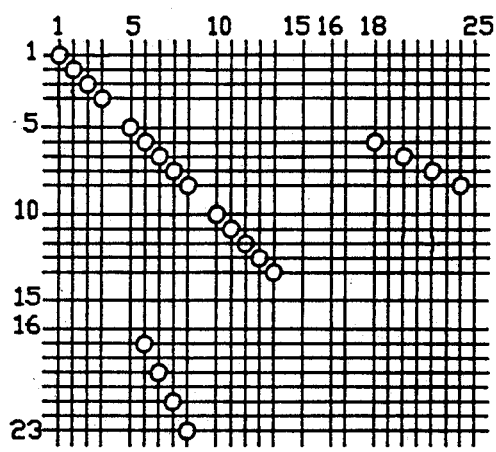
FIG. 14 illustrates the intersection of horizontal bus 9 with vertical bus 9 at the corner.

FIG. 14 illustrates the intersection of horizontal bus 9 with vertical bus 9. Horizontal long lines 1-4 and BGI segments 5-14 are connectable to vertical long lines 1-4 and BGI segments 5-14, respectively. Horizontal BGI segments 6-9 are also connectable to the even numbered uncommitted long lines 18, 20, 22 and 24 on the vertical bus. The odd numbered uncommitted long lines 17, 19, 21, and 23 on the horizontal bus are connectable to vertical BGI segments 6-9.

FIG. 14A shows a corner connection that can be used at the intersections of horizontal bus 1 and vertical bus 1, horizontal bus 1 and vertical bus 9, horizontal bus 9 and vertical bus 9, and horizontal bus 9 and vertical bus 1. It has the advantage that it is a single layout that can be used at all four corners while accomplishing the ability to route signals from the long lines 1-4 completely around the perimeter of the chip. As can be seen, horizontal lines long 1-4 and BGI segments 5-14 are connectable to vertical long lines 1-4 and 5-14, respectively. Horizontal long line 1 is connectable to vertical long lines 1 and 4, horizontal long line 2 is connectable to vertical long lines 2 and 3, horizontal long line 3 is connectable to vertical long lines 2 and 3, and horizontal long line 4 is connectable to vertical long lines 1 and 4. Also, horizontal BGI segment 14 is connectable to vertical BGI segment 5, horizontal BGI segment 13 is connectable to vertical BGI segment 6, horizontal BGI segment 12 is connectable to vertical BGI segment 7, horizontal BGI segment 11 is connectable to vertical BGI segment 8, horizontal BGI segment 10 is connectable to vertical BGI segment 9, horizontal BGI segment 9 is connectable to vertical BGI segment 10, horizontal BGI segment 8 is connectable to vertical BGI segment 11, horizontal BGI segment 7 is connectable to vertical BGI segment 12, horizontal BGI segment 6 is connectable to vertical 13, and horizontal BGI segment 5 is connectable to vertical BGI segment 14. Also, horizontal BGI segments 6-9 are connectable to the even numbered, uncommitted long lines 18, 20, 22, and 24 on the vertical bus. The even numbered long lines 16, 18, 20, 22 on the horizontal bus are connectable to vertical BGI segments 6-9.

Long lines 15 on the horizontal and vertical buses and 16 and 17 on the vertical buses are not connectable at any of the intersections described above. Rather, they are designed to be used for local clock/clock enable, global clock, and global reset signals and have special connection structures shown in FIGS. 15 and 16. FIG. 15 illustrates the connection of the global clock and global reset signals on vertical lines 16 and 17. The global clock signal is supplied from an input buffer 1500 to line 1501. Line 1501 is directly connected to line 16 in all vertical buses. Similarly, the global reset signal is supplied at global reset buffer 1502. The output of the global reset buffer is supplied on line 1503 to line 17 on all the vertical buses. The lines 16 and 17 of the vertical buses are directly connected to the input/output blocks as schematically illustrated in FIG. 15 and to each of the configurable logic blocks. The direct connections to the configurable logic blocks are shown only to a few of the blocks in the upper left hand corner of the array for clarity of the figure.

FIG. 15A shows the connection of lines 16 and 17 of the vertical buses to the configurable logic blocks. The lines 16 and 17 of vertical bus-n are coupled to the global clock GK and global reset GR inputs of configurable logic block in column n, for n=1–8. In vertical bus 9, lines 16 and 17 are connected only to the input/output blocks as shown.

Figure 15B:
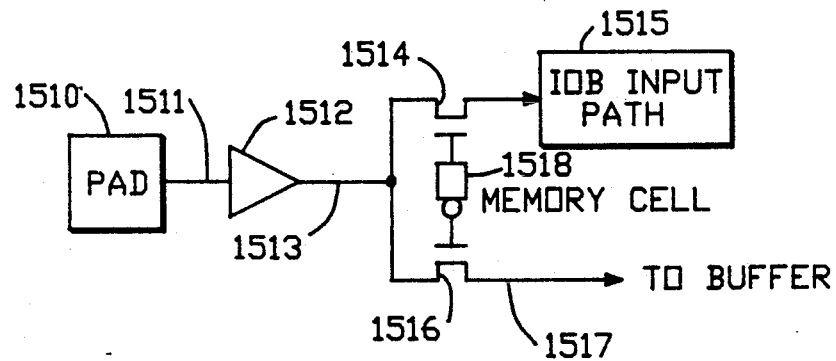
FIG. 15B illustrates the signal path from an input/output pad bypassing internal IOB logic for connection to the global clock buffer, horizontal alternate buffer or vertical alternate buffer.

FIG. 15B shows the configurable path from an input/output pad to an IOB or to the global or alternate buffers. It can be seen that the pad 1510 is connected across line 1511 through buffer 1512 to line 1513. Line 1513 is passed through pass transistor 1514 to an IOB input path 1515 or through pass transistor 1516 to the buffer input circuitry on line 1517. A memory cell 1518 in the configuration store controls which pass transistor (1514 or 1516) is enabled.

Figure 15C:
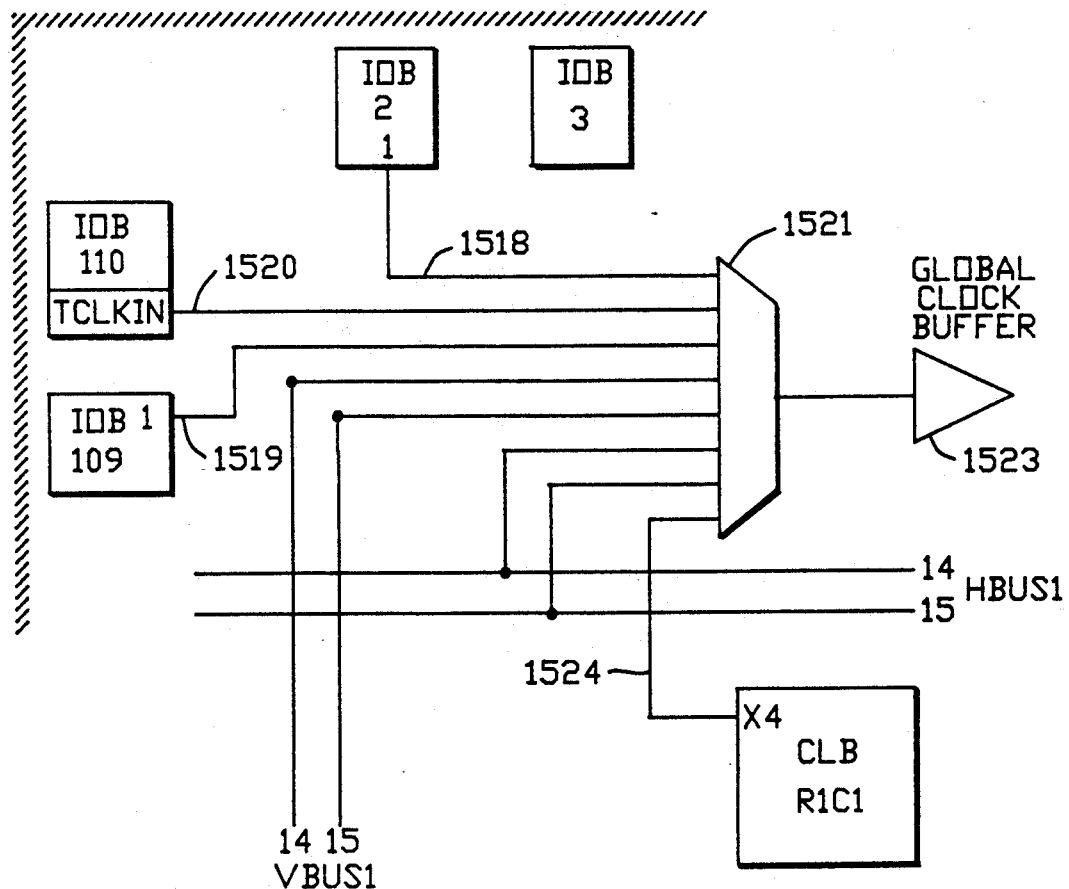
FIG. 15C illustrates the inputs to the global clock buffer.

FIG. 15C illustrates the input circuitry to the global clock buffer. Input 1 of IOB 2 and 9 are connected to provide a signal on lines 1518 and 1519 as inputs to 8 to 1 multiplexer 1521. A clock input pin at IOB 110 is connected to line 1520 as illustrated in FIG. 15B as input to multiplexer 1521. Lines 14 and 15 in vertical bus 1 and lines 14 and 15 in horizontal bus 1 are also coupled as inputs to configurable multiplexer 1521.

The direct connect output X4 on the configurable logic block in row 1, column 1 is directly connected as well as a input to the multiplexer 1521. The direct link from an adjacent CLB to the multiplexer 1521 across line 1524 provides added flexibility for the generation of the global clock on chip.

The configuration store controls the multiplexer 1521 to supply a clock signal on line 1522 to the global clock buffer 1523.

FIG. 16 illustrates the connection of line 15 in the vertical and horizontal buses. It is designed to perform the function of a local clock for an input/output block or a configurable logic block or as a clock enable signal. The line 15 in horizontal buses is connectable to a variety of sources including outputs from configurable logic blocks and the alternate buffers. The line 15 in the horizontal buses are connectable to the horizontal alternate buffer 1600 which generates the signal on line 1601. Associated with each horizontal bus is a bidirectional buffer, such as buffer 1602. Each bidirectional buffer includes a configurable tristate buffer connected from line 1601 to line 15 in the respective horizontal bus. Also, a configurable tristate buffer connected from line 15 on the respective horizontal bus supplies an output to line 1601. The configurable tristate buffers are each controlled by a memory cell in the configuration memory.

Likewise, the vertical alternate buffer 1603 generates a signal on line 1604. Line 15 on each vertical bus is connected to a bidirectional buffer, e.g. buffer 1605. Each vertical bidirectional buffer has a first tristate buffer connected from line 1604 to line 15 in the respective vertical bus and a tristate buffer connected from line 15 in the respective vertical bus to line 1605. Each of the tristate buffers is controllable from a storage cell in the configuration memory. The line 15's in vertical buses 1 and 9 are connected respectively to the input/output blocks on the left side and right side of the chip. Likewise, the line 15's in horizontal buses 1 and 9 are connected to the input/output blocks on the top and bottom of the chip as shown.

FIG. 16A shows the connection of the input/output blocks to line 15 and the connection of the configurable logic blocks to line 15. Each complex IOB 1606 has a K input directly connected to line 15 on its adjacent vertical or horizontal bus. Each simple IOB 1607 is capable of supplying an input signal to line 15 of a horizontal and vertical bus through a PIP.

Each configurable logic block as shown in FIG. 16A has inputs labeled K1, K2, K3 and K4. The input K1 is connected to line 15 in the horizontal bus above the block. Input K2 is directly connected to line 15 in the vertical bus to the right of the block. Input K3 is directly connected to line 15 in the horizontal bus below the block. Input K4 is directly connected to the vertical bus to the left of the block. Likewise, each configurable logic block has output Y1, Y2, Y3 and Y4. The output Y1 is connectable through a PIP to line 15 in the horizontal bus above the block. Output Y2 is connectable through a PIP to line 15 in the vertical bus to the right of the block. Output Y3 is connectable through a PIP to line 15 in the horizontal bus below the block. Output Y4 is connectable through a PIP to line 15 in the vertical bus to the left of the block.

The line 1604 connected to the vertical alternate buffer and the line 1601 connected to the horizontal alternate buffer can receive inputs from a number of sources including device pins, and interconnects via PIPs. The signal on line 1601 can be supplied to all configurable logic blocks and input/output blocks adjacent the horizontal buses with the exception of input/output blocks on the left side and right side of the chip. Likewise, the signal on line 1604 can be globally supplied across the chip, with the exception that it cannot be directly connected to the input/output blocks on the top and bottom of the chip.

Therefore, a signal can be generated in configurable logic block R1C1, supplied to line 15 of vertical bus 2 through the bidirectional buffer 1608 to line 1604. From line 1604, it can be supplied anywhere in the chip. A similar net can be formed along horizontal buses.

This line 15 structure allows the registers in any configurable logic block to receive a clock from one of five sources. The sources include the global clock GK supplied on vertical bus line 16, and the local clocks K1, K2, K3, and K4 which are connected to line 15 on four adjacent interconnect buses.

Likewise, the registers in a complex input/output block can receive a clock from two sources. The first source is line 16 in the adjacent vertical bus at its GK input and from an input K on the configurable I/0 block connectable through a PIP to line 15 on either a horizontal or vertical bus depending on the location of the input/output block Each line 15 in either a horizontal or a vertical bus can carry a signal obtained from one of four sources. The four sources include an alternate buffer, an adjacent configurable logic block, an adjacent input/output block, and a configurable logic block which has supplied a signal to line 15 of a different bus which has in turn been connected through the bidirectional buffers to levels 1601 or 1604.

If an alternate buffer is used to supply a signal to the array, the long lines connecting to that buffer can either be independent where the bidirectional buffers are configured to supply a high impedance state to the long line, or they can use the alternate buffer as a source.

FIG. 16B illustrates the input structure to the vertical alternate buffer 1603. The input to the vertical alternate buffer 1603 is provided on line 1610 at the output of the configurable multiplexer 1611. Also, the signal on line 1610 is connected for supply as output signals at IOB 1612 and at IOB 1613. Inputs to the multiplexer 1611 include an oscillator signal OSC as generated by the circuitry illustrated in FIGS. 16D and 16E. Also, an input signal from IOB 1612 is an alternative input to multiplexer 1611 across line 1614. A vertical clock input signal is supplied on line 1615 as input to multiplexer 1611 from IOB 1616 configured as shown in FIG. 15B.

Long lines 4 and 15 of the vertical bus 9 and long lines 4 and 15 of the horizontal bus 9 are also connected as inputs to multiplexer 1611. The final input to multiplexer 1611 is a direct link from output X2 of the configurable logic block in row 8, column 8, across line 1617.

The vertical alternate buffer 1603 also includes a memory cell 1618 for tristate control.

FIG. 16C illustrates the input structure for the horizontal alternate buffer 1600. The horizontal alternate buffer is tristatable in response to the signal at memory cell 1620. The input to horizontal alternate buffer 1600 is supplied on line 1621 at the output of the configurable multiplexer 1622. Inputs to the configurable multiplexer 1622 include the horizontal clock input signal on line 1623, and input signals on lines 1624 and 1625 from input/output structures 1626 and 1627, respectively. The vertical bus long lines 4 and 15 and horizontal bus long lines 4 and 15 are connectable as inputs as well to the multiplexer 1622. Finally, a direct link from the configurable logic block in row 8, column 1, output X4 is coupled across line 1628 as an input to multiplexer 1622.

The on chip oscillator which supplies the OSC signal as one input to the multiplexer 1611 driving the vertical alternate buffer 1603 is shown in FIG. 16D. The OSC signal is provided at the output of multiplexer 1630 which is controlled by memory cell 1631. Inputs to multiplexer 1630 include the signal on line 1632 which is supplied at the output of inverting buffer 1633. The input to inverting buffer 1633 is the signal on line 1634 which is supplied at the output of the oscillator amplifier 1635. The input to the oscillator amplifier 1635 is supplied at IOB 1636. IOB 1637 is coupled directly to line 1634. Line 1634 is supplied through inverting buffer 1638 as a clock input on line 1639 to register 1640. Register 1640 is connected as a divide-by-two circuit by coupling line coupled from its Q output through inverting buffer 1642 as the D input to register 1640. The Q output of register 1640 is supplied on line 1643 as a second input to multiplexer 1630.

The external connections for the oscillator are shown in FIG. 16E. Pad 1637 is coupled to line 1650 and pad 1636 is coupled to line 1651. Resistor R1 is connected between line 1650 and 1651. Line 1651 is coupled through capacitor C1 to GROUND and through crystal 1652 to line 1653. Line 1653 is coupled through capacitor C2 to GROUND and through resistor R2 to line 1650.

The divide-by-two option in the oscillator circuit is provided to ensure symmetry of the signal. The output of the 2:1 multiplexer 1630 gives this choice, and is set during device configuration. When the oscillator/inverter is not used, the paths 1637 and 1636 are configurable as shown in FIG. 15B to behave as standard IOBs.

The oscillator circuit becomes active before configuration is complete to allow it to stabilize.

Figure 17:
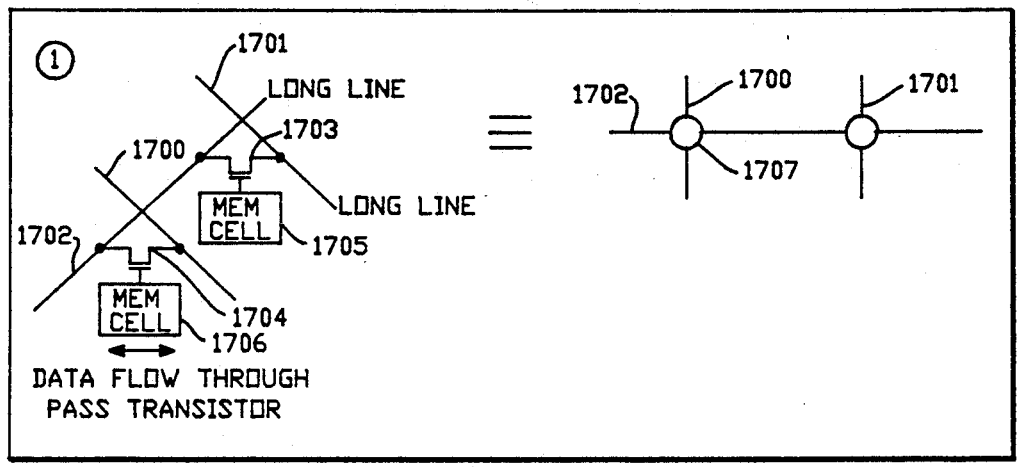
FIG. 17 illustrates one implementation of a programmable interconnect point using bidirectional pass transistors.
Figure 18:
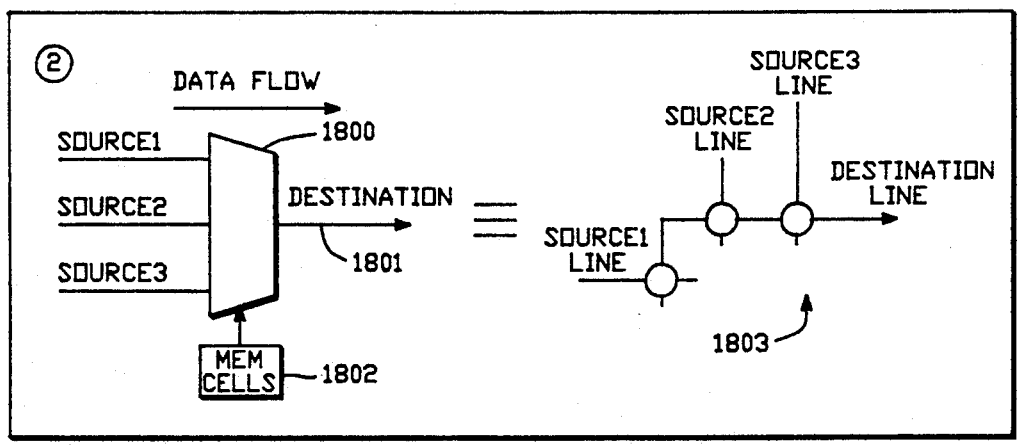
FIG. 18 illustrates an alternative configuration of a programmable interconnect point using a unidirectional multiplexer technique.

The structure of the programmable interconnect points (PIPs) is shown in FIG. 17 and an alternative structure is shown in FIG. 18. The structure in FIG. 17 illustrates that for an intersecting conductive segment, such as long lines 1700 and 1701, with long line 1702, a PIP is implemented using a pass transistor. Thus, pass transistor 1703 provides for interconnection between lines 1702 and 1701. Pass transistor 1704 provides for interconnection between lines 1700 and 1702. The memory cell 1705 from the configuration store controls the pass transistor 1703 to provide a bidirectional path between the lines. Likewise, memory cell 1706 controls pass transistor 1704 to provide the bidirectional path. These interconnection points are illustrated throughout this document using the circular symbol 1707 as shown in the figure. Thus, the symbolic representation of the circuit on the left side of FIG. 17 is shown on the right side of FIG. 17.

The PIP implementation of FIG. 17 is advantageous in that it provides for bidirectional connection on the lines which allows for great flexibility. However, this structure is memory intensive. Therefore, an alternative implementation, as shown in FIG. 18, can be used to save memory in a given implementation. The implementation of FIG. 18 illustrates that a PIP can be implemented as a multi-source multiplexer 1800. Multiplexer 1800 can have three sources, source 1, source 2, and source 3, and select a destination line 1801 in response to memory cells 1802 in the configuration store. Using the multiplexer implementation, two memory cells can provide for selection from among three or four sources. The equivalent symbol for the circuit using multiplexer 1800 is shown at 1803. It should be recognized that the multiplexer implementation is a unidirectional interconnect which allows for connection from any one of the source lines to the destination line and not vice versa. Furthermore, only one source line can be activated for a given operation.

Figure 19:
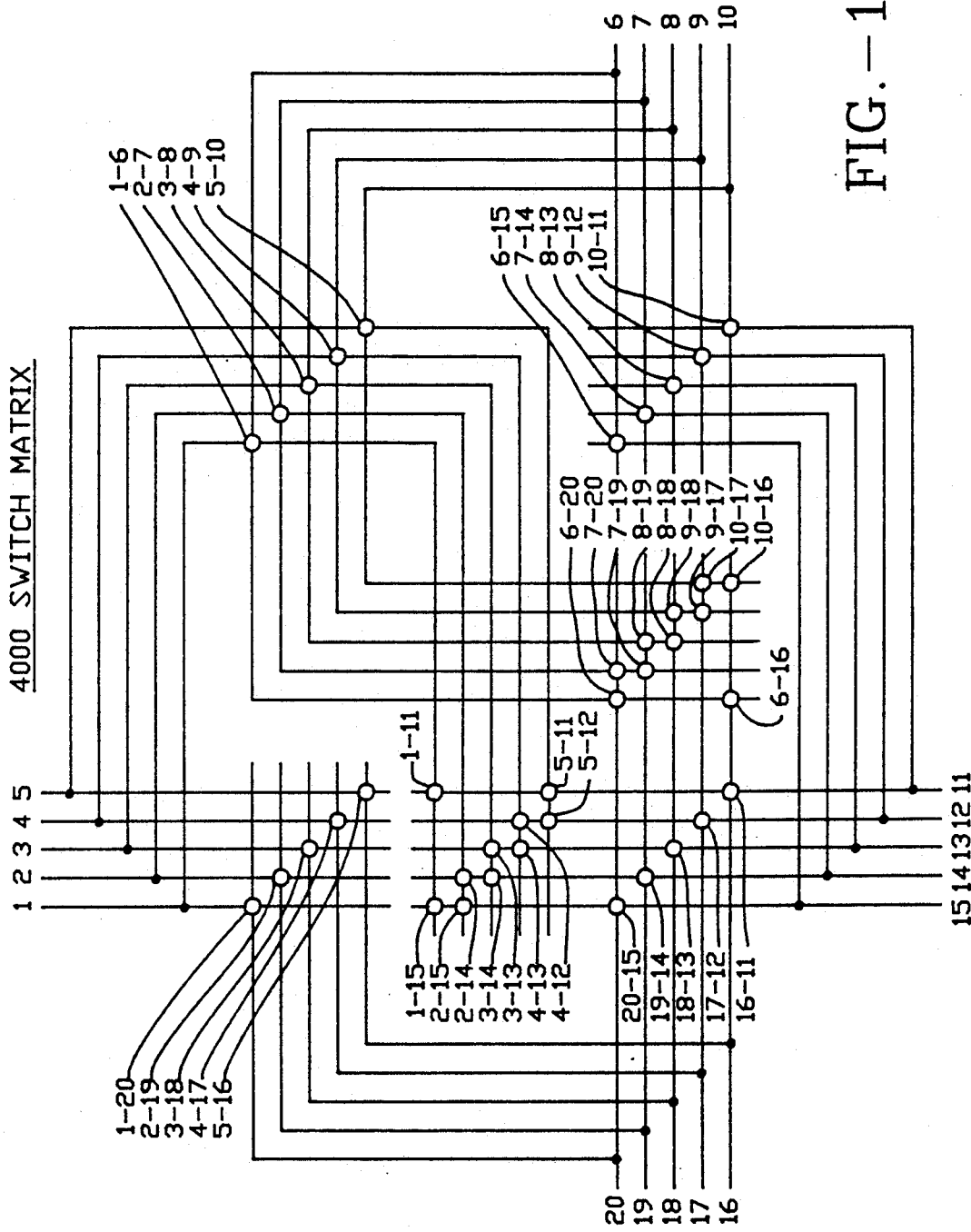
FIG. 19 illustrates the interconnect structure of the switch matrix.

FIG. 19 illustrates the implementation of the switch matrix according to the present invention. Each switch matrix has five connections on the top labeled 1-5, five connections on the right side labeled 6-10, five connections on the bottom labeled 11-15, and five connections on the left side labeled 16-20.

Line 1 is connectable through PIP 1-20 to line 20, through PIP 1-6 to line 6, through PIP 1-11 to line 11, and through PIP 1-15 to line 15.

Line 2 is connectable through PIP 2-19 to line 19, PIP 2-7 to line 7, PIP 21-4 to line 14, and PIP 2-15 to line 15.

Line 3 is connectable through PIP 3-18 to line 18, PIP 3-8 to line 8, PIP 3-13 to line 13, and PIP 1-14 to line 14.

Line 4 is connectable through PIP 4-17 to line 17, PIP 4-9 to line 9, PIP 4-12 to line 12, and PIP 4-13 to line 13.

Line 5 is connectable through 5-16 to line 16, PIP 5-10 to line 10, PIP 5-11 to line 11, and PIP 5-12 to line 12.

Other than the bidirectional connections to lines 1-5 which have already been set out, the connections of lines 6-10 include the following.

Line 6 is connectable through PIP 6-15 to line 15, PIP 6-16 to line 16, and through PIP 6-20 to line 20.

Line 7 is connectable through PIP 7-14 to line 14, and through PIP 7-19 to line 19, and PIP 7-20 to line 20.

Line 8 is connectable through PIP 8-13 to line 13, PIP 8-18 to line 18, and PIP 8-19 to line 19.

Line 9 is connectable through PIP 9-12 to line 12, PIP 9-17 to line 17, and PIP 9-18 to line 18.

Line 10 is connectable through PIP 10-11 to line 11, PIP 10-16 to line 16, and PIP 10-17 to line 17.

The other bidirectional connections not already cited include the connection of line 20 through PIP 20-15 to line 15, the connection of line 19 through PIP 19-14 to line 14, the connection of line 18 through PIP 18-13 to line 13, the connection of line 17 through PIP 17-12 to line 12, and the connection of line 16 through PIP 16-11 to line 11.

Figure 20:
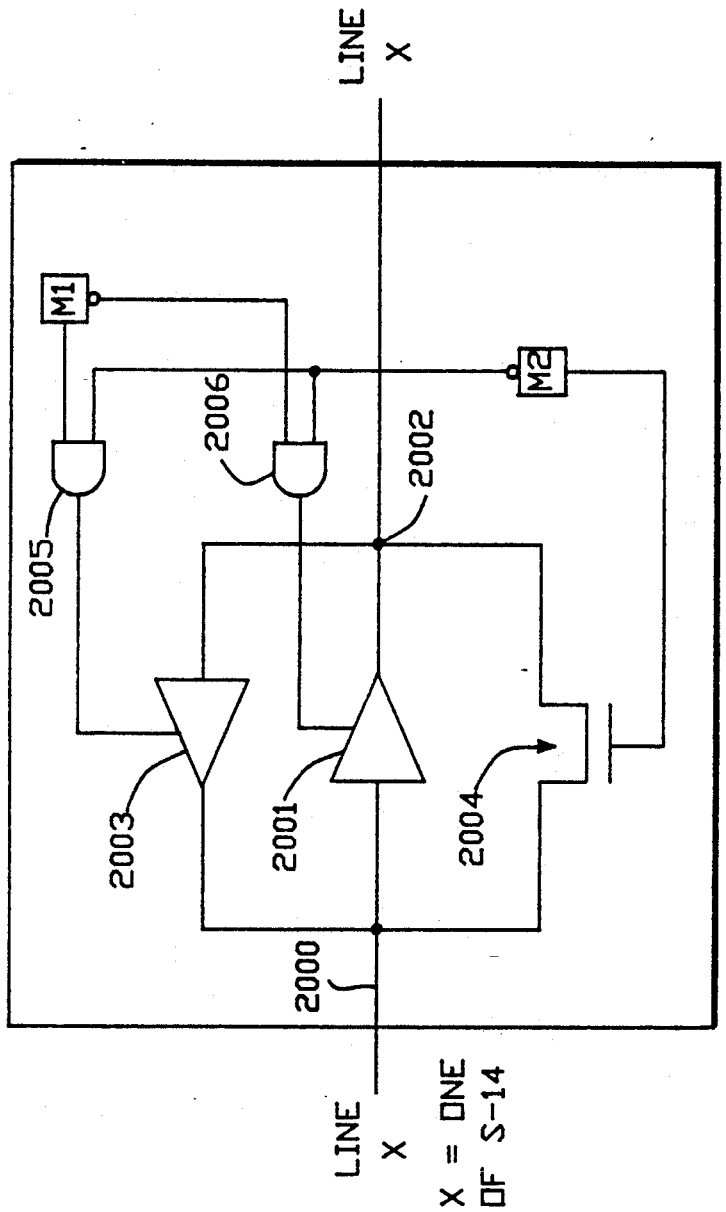
FIG. 20 illustrates the repowering buffer used in the programmable interconnect.

FIG. 20 illustrates the repowering buffer which is used with a horizontal segment and a vertical segment for each switching matrix. Repowering buffers are used for reshaping a signal after it has passed through a number of PIPs. Each repowering buffer adds delay to the net being routed. Thus, for short nets, the designer would want to avoid using the repowering buffers.

The repowering buffer as shown in FIG. 20 is connected on one of the bidirectional general interconnect segments designated line X in the figure, where X is one of lines 5-14 in a horizontal or vertical bus. Line X enters the left side of the repowering buffer at point 2000. Point 2000 is supplied as input to a first tristate buffer 2001. The output of the tristate buffer 2001 is connected to point 2002 which is supplied at the output of the repowering buffer back to line X. Point 2002 is also supplied at the input of a tristate buffer 2003. The output of the tristate buffer 2003 is connected at point 2000 for supply of the signal in the right to left direction. A third path, through pass transistor 2004, is supplied between points 2000 and 2002. The first memory cell M1 and a second memory cell M2 control the operation of the repowering buffer. The true output of memory cell M1 is supplied to AND-gate 2005. The complement output of memory cell M2 is supplied as a second input to AND-gate 2005. The output of AND-gate 2005 is the tristate enable input to buffer 2003. Likewise, the inverted output of memory cell M1 is supplied at a first input to AND-gate 2006. The second input to AND-gate 2006 is the inverted output of memory cell 2002. The output of AND-gate 2006 is the tristate control signal for buffer 2001. The true output of memory cell M2 is supplied to control the pass transistor 2004.

Thus, it can be seen that the repowering buffer shown in FIG. 20 supplies for repowering of a signal propagating in either direction along line X. Likewise, when line X is used for a multi-source net in which signals could be propagating in either direction, the pass transistor 2004 allows for bypassing of the repowering buffer.

The line location of the repowering buffer for a given switching matrix or segment box should be determined as meets the needs of a particular application.

The repowering buffer should be utilized for current CMOS technology for any network path passing through around four or more PIPs, and not going through a CLB or IOB.

Figure 21:
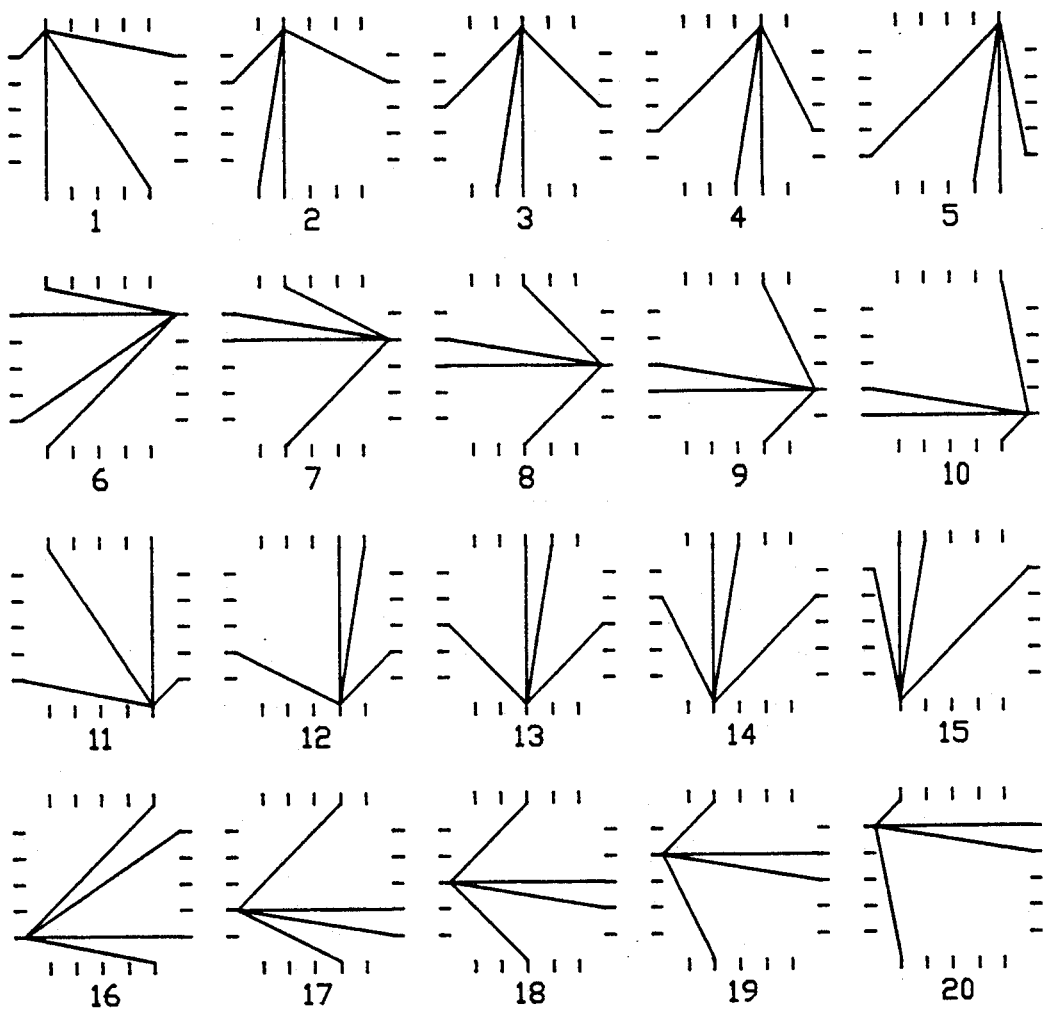
FIG. 21 shows the switch matrix interconnection options for each connection to the switch matrix.

FIG. 21 illustrates the interconnection options for a switch matrix using the PIP array as shown in FIG. 19. The figure is a graphical representation showing the possible interconnections of each of the connections 1-20 through the switching matrix. Thus, the possible interconnections of connection 1 is shown in the upper left hand corner. Likewise, the possible interconnections of connection 20 are shown in the lower right hand corner.

Figure 22:
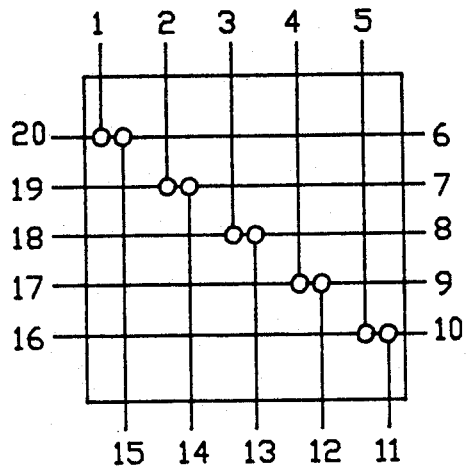
FIG. 22 illustrates the interconnection in the segment boxes on vertical buses 1 and 9.

FIG. 22 illustrates the interconnection array for the segment box on vertical buses 1 and 9. It can be seen that the segment box is an alternative switch matrix design, adapted for the peripheral buses. Each segment box has 20 input connections, five on each side, as illustrated in the figure. The input connections 20 and 6 are directly connected, input connections 19 and 7 are connected, inputs 18 and 8 are connected, inputs 17 and 9 are connected, and inputs 16 and 10 are connected. Inputs 1 and 15 are connectable through PIPs to the line connecting inputs 20 and 6. Inputs 2 and 14 are connectable through respective PIPs to the line connecting inputs 9 and 7. Inputs 3 and 13 are connectable through PIPs to the line connecting inputs 18 and 8. Inputs 4 and 12 are connectable through PIPs to the line connecting inputs 17 and 9. Finally, inputs 5 and 11 are connectable through PIPs to the line connecting inputs 16 and 10.

Figure 23:
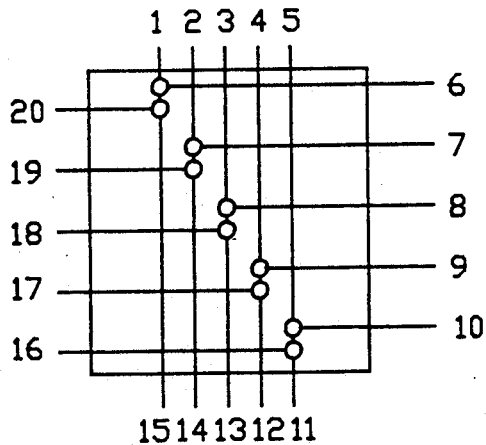
FIG. 23 illustrates the interconnection in the segment boxes on horizontal buses 1 and 9.

The segment box on the horizontal buses 1 and 9 is shown in FIG. 23. In this implementation, inputs 1 and 15 are connected directly, inputs 2 and 14 are connected directly, inputs 3 and 13 are connected directly, inputs 4 and 12 are connected directly, and inputs 5 and 11 are connected directly. Inputs 20 and 6 are connectable through PIPs to the line connecting inputs 1 and 15, inputs 19 and 7 are connectable through PIPs to the line connecting inputs 2 and 14. Inputs 18 and 8 are connectable through PIPs to the line connecting inputs 3 and 13. Inputs 17 and 9 are connectable through PIPs to the line connecting inputs 4 and 12. Finally, inputs 16 and 10 are connectable through PIPs to the line connecting inputs 5 and 11.

Figure 24:
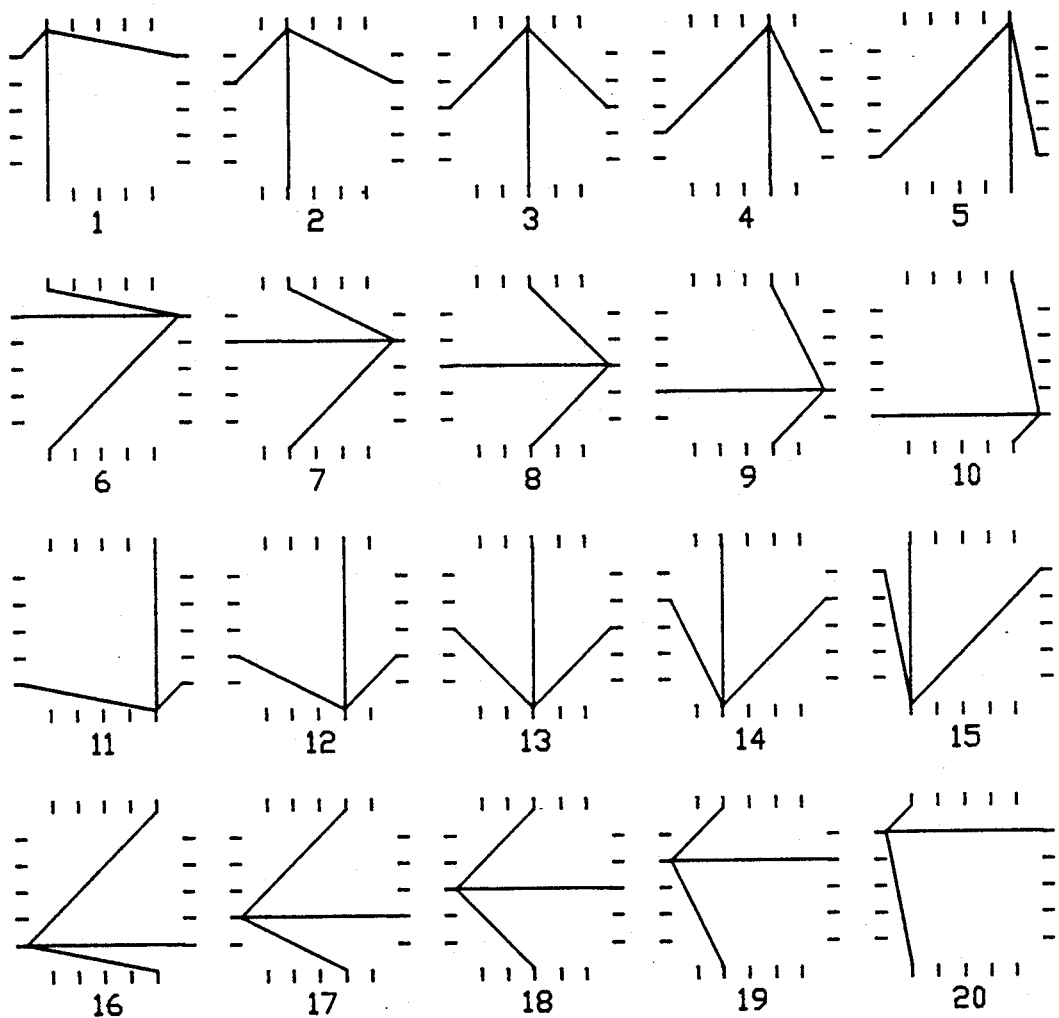
FIG. 24 illustrates the segment box interconnection options for each connection to the segment box.

FIG. 24 graphically illustrates in the style of FIG. 21, the possible interconnections for each input to a segment box. These possible interconnections apply equally to the segment boxes on the vertical buses and to the segment boxes on the horizontal buses.

So far, the basic interconnection structure of the programmable gate array has been described without emphasizing the connections to the configurable logic blocks and the input/output blocks. A detailed description of the configurable logic blocks and the input/output blocks in a preferred system is shown in co-pending U.S. patent application Ser. No. 07/394,221, filed: Aug. 15, 1989 entitled: PROGRAMMABLE GATE ARRAY WITH AN IMPROVED INTERCONNECT STRUCTURE, of which this is a continuation-in-part.

Figure 25:
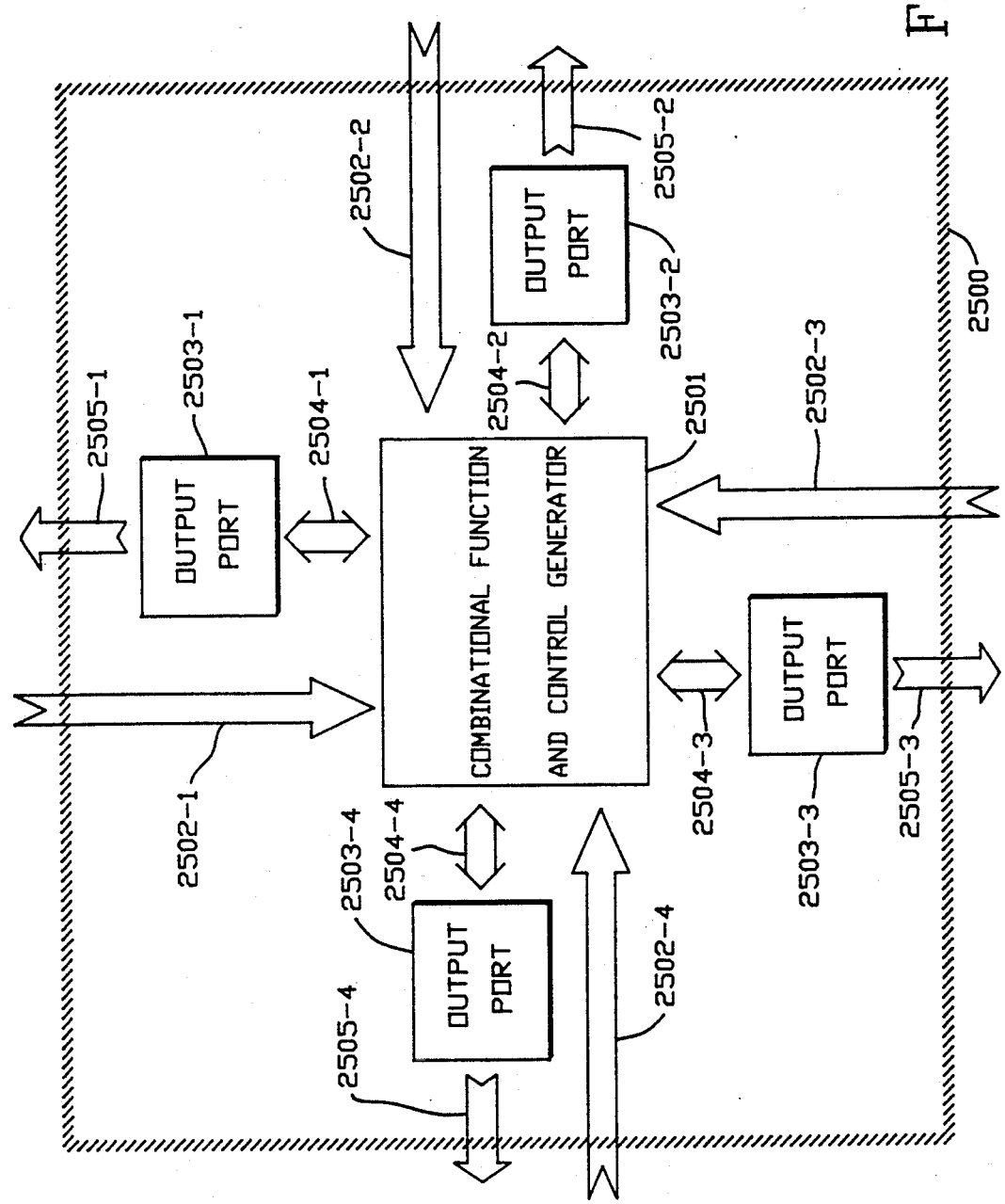
FIG. 25 is an overview block diagram of the configurable logic block.

An overview block diagram of a configurable logic block is set out in FIG. 25.

The configurable logic block 2500 shown in FIG. 25 consists of a combinational function and control generator 2501 which receives inputs from four sides, schematically illustrated by buses 2502-1, 2502-2, 2502-3, and 2502-4. The combinational function and control generator 2501 communicates with four independently configurable output ports 2503-1, 2503-2, 2503-3, and 2503-4. The output ports receive signals and supply feedback signals to and from the combinational function and control generator 2501 across respective buses 2504-1, 2504-2, 2504-3, and 2504-4. Each output port supplies a plurality of output signals, schematically illustrated by the respective output buses 2505-1, 2505-2, 2505-3, and 2505-4.

The block diagram of FIG. 25 illustrates at a high level the symmetry of the configurable logic block 2500. Input signals can be received from all four sides of the block, likewise, output signals can be supplied to any of the four sides of the block. Furthermore, as seen below, input signals from the input bus 2502 can be used to generate output signals across bus 2505-1, 2505-2, 2505-3, or 2505-4. Similar flexibility is provided from all of the other input buses in the configurable logic block.

Figure 26:
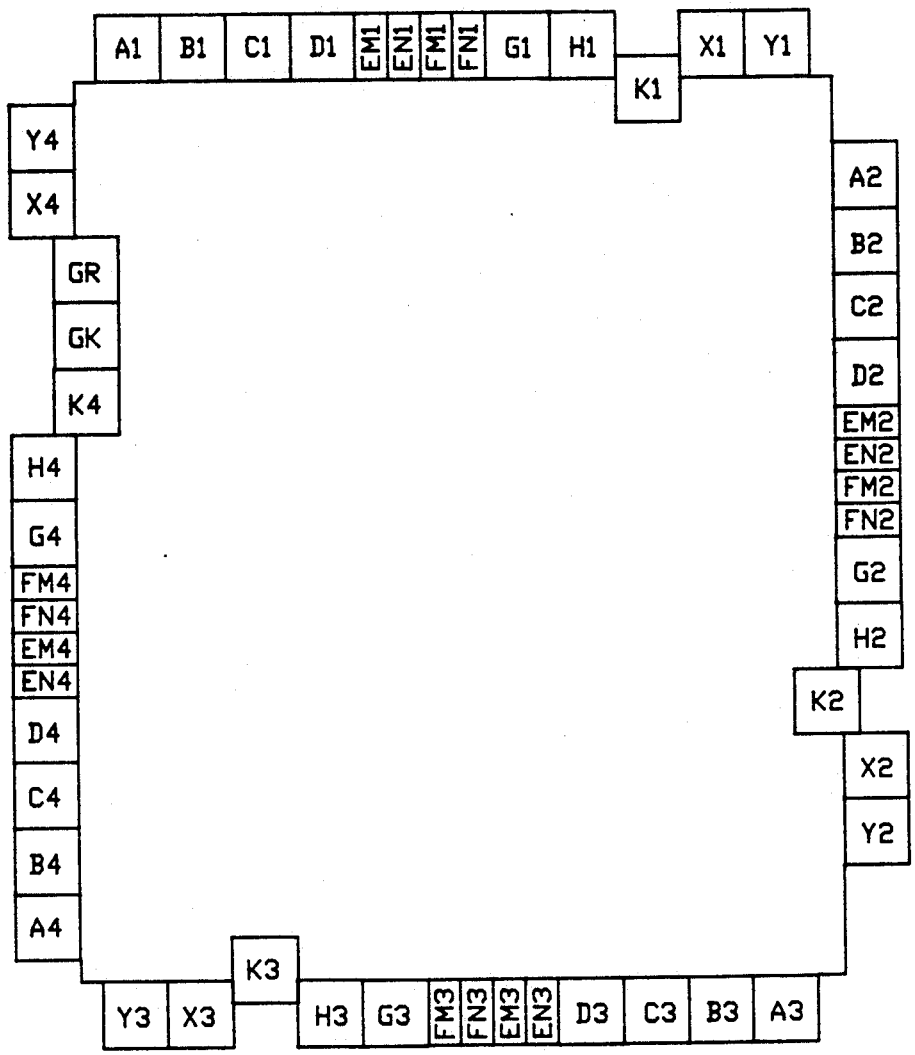
FIG. 26 schematically illustrates the inputs and outputs and provides a notation for the configurable logic block.

The inputs and outputs to the configurable logic block are set out in FIG. 26. Also, a notation for the inputs and outputs is provided. It can be seen that input signals along the top side of the block are labeled A1 through D1, EM1, EN1, FM1, FN1, G1, H1, and K1. The outputs are labelled X1 and Y1. Similarly, the suffix 2 is applied to the right side of the block, the suffix 3 is applied to the bottom of the block, and the suffix 4 is applied to the left side of the block. On the left side of the block, additional inputs GR and GK for global reset and global clock signals are provided.

As shown in the legend in FIG. 26, the inputs A1 through A4 and B1 through B4 are long line inputs. Inputs C1 through C4 and D1 through D4 are inputs coupled to the bidirectional general interconnect segments for logic signals.

The inputs EM1 through EM4, FM1 through FM4, EN1 through EN4, and FN1 through FN4 are direct connect inputs. The inputs G1 through G4 and H1 through H4 are inputs to the bidirectional general interconnect segments for control signals.

The inputs K1 through K4 are long line inputs from bus line 15 used for clock and clock enable functions.

Outputs are supplied at terminals X1 through X4 and Y1 through Y4. Direct connect structures are connected to X1 through X4. The general interconnect structures are coupled to outputs Y1 through Y4.

There are two types of input/output blocks in the preferred system, referred to as simple or complex.

Each input/output block (IOB) is coupled to memory cells in the configuration memory, the states of which control the configuration of the IOB. In general, an IOB allows data to pass in two directions: (i) from an input-/output pad to the programmable general connect and specific CLBs; (ii) from the programmable general connect and specific CLBs to a pad.

The configuration of an IOB sets the type of conditioning the signal receives on passing through the IOB. The pad may or may not be bonded to a physical package pin.

Figure 27:
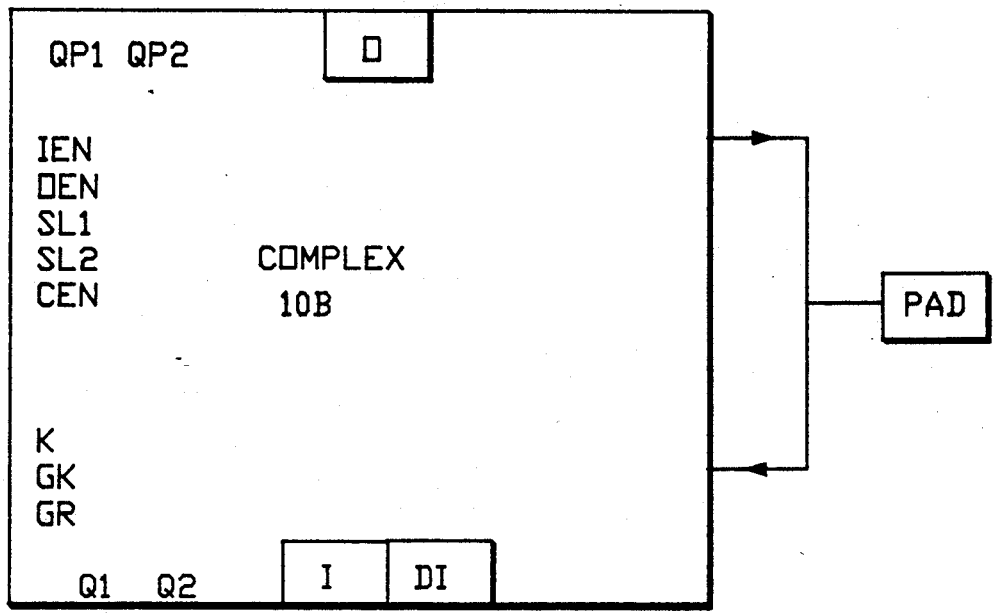
FIG. 27 illustrates the inputs and outputs of the complex input/output block.
Figure 28:
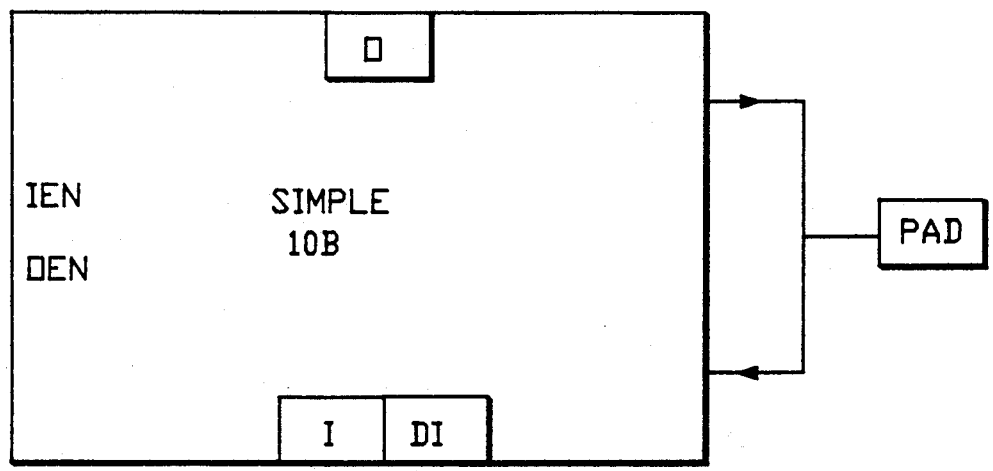
FIG. 28 illustrates the inputs and outputs of the simple input/output block.

FIGS. 27 and 28 illustrate the inputs and outputs of the complex and simple IOBs, respectively. These figures can be referred to when reviewing the interconnect structures described in the following sections.

In FIG. 27, the signal DI corresponds to a direct connect input signal. The signal I corresponds to an input connection to the configurable interconnect. The signal O corresponds a plurality of outgoing signals from the configurable interconnect or direct connects. The other labeled signals are control signals.

Likewise, in FIG. 28, the signal DI is a direct connect input signal. The signal I is an input connection to the configurable interconnect. The signal O corresponds to outgoing signals from the configurable interconnect or direct connects. The IEN and OEN signals are input control signals.

III. The Connections of Interconnect Structure to CLBs and IOBs

The configurable interconnect structure provides a means of connecting the CLBs and IOBs together. It is divided into two major categories, called the direct connect and the programmable general connect. The programmable general connect includes long lines, the bidirectional general interconnects and the uncommitted long lines.

The programmed connections required between the blocks for a user application are referred to as nets. A net can have single or multiple sources, and single or multiple destinations. The type of interconnect resource used to construct a net is determined from availability to the software routing algorithm and the propagation delay allowed for the net. The allowed propagation delay is defined by user application.

Figure 29:
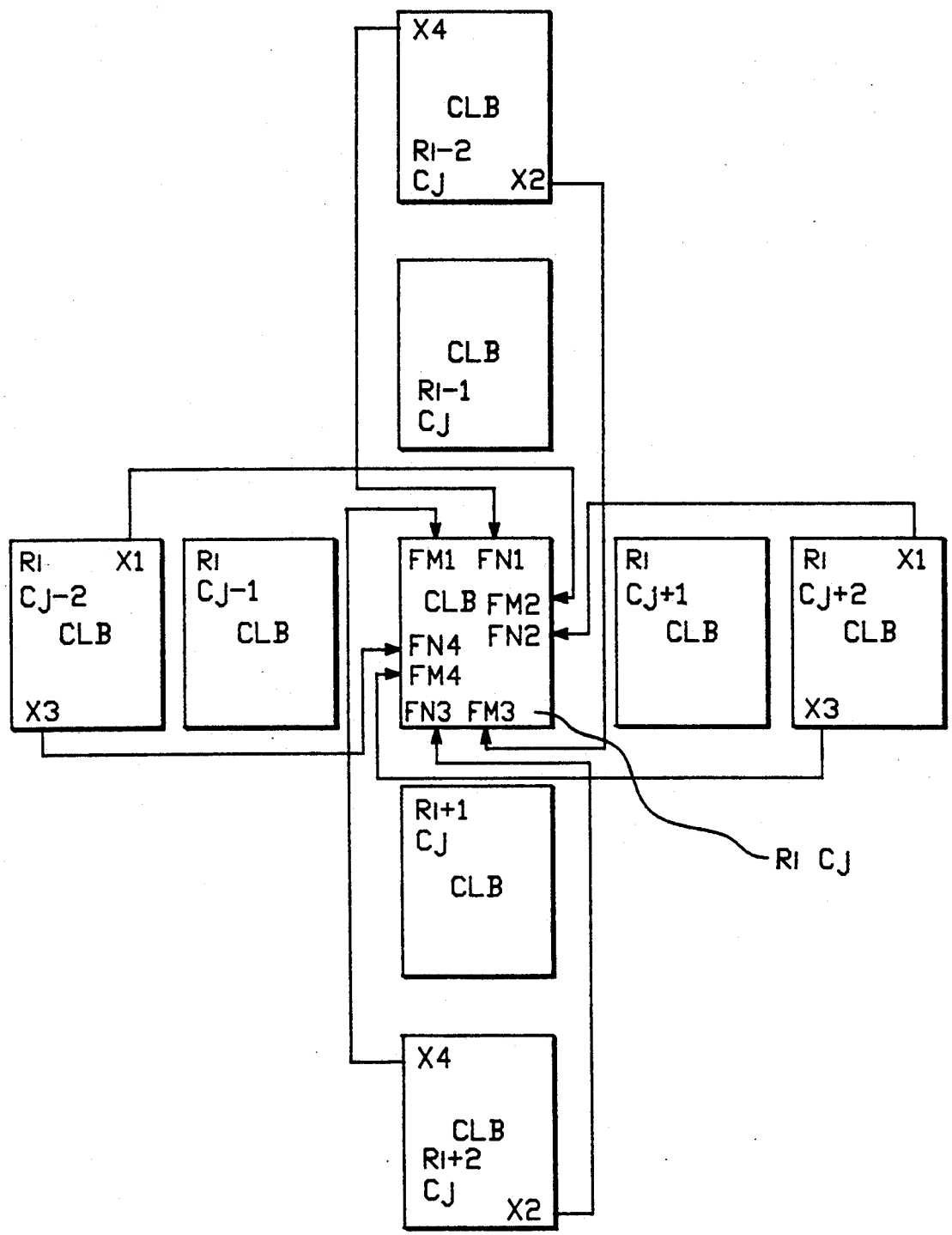
FIG. 29 illustrates the direct connections from outputs of next adjacent configurable logic blocks to the inputs of a given logic block.
Figure 30:
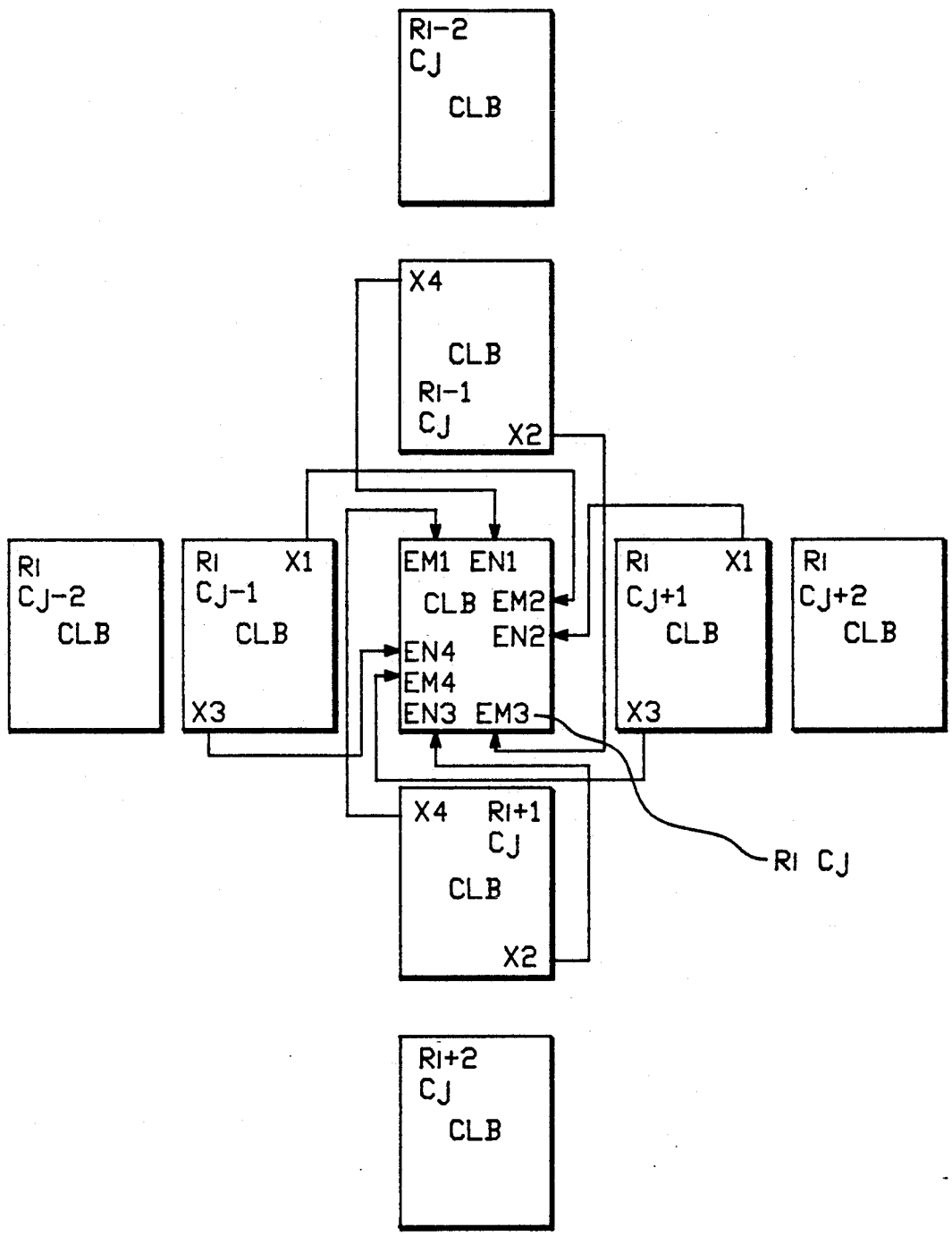
FIG. 30 illustrates direct connections from adjacent configurable logic blocks to the inputs of the center configurable logic block.

The direct connect structure is illustrated chiefly in FIGS. 29-34. FIGS. 29 and 30 in combination show all the direct connections supplied as inputs EM1 through EM4, EN1 through EN4, FM1 through FM4, and FN1 through FN4 supplied from the outputs X1 through X4 of eight neighbor CLBs. In FIG. 29, the connection of next adjacent CLBs to the inputs FM1 through FM4 and FN1 through FN4 are shown. Thus, the connection X4 from CLB of row i-2 column j is coupled to the input FN1 of the CLB of row i in column j. Output X2 of CLB of row i-2 in column j is coupled to the input FM3. Output X1 of CLB of row i and column j+2 is coupled to the input FN2. Output X3 of CLB of row i column j+2 is coupled to the input FM4. The output X4 of CLB of row i+2 in column j is coupled to the input FM1 of the center CLB. The output X2 of row i+2 and column j is coupled to the input FN3 of the center CLB. The output X3 of the CLB of row i and column j−2 is coupled to the input FN4. Output X1 of the CLB of row i in column j−2 is coupled to the input FM2.

As shown in FIG. 30, the output X4 of the CLB in row i−1 and column j is coupled to the input EN1 of the center CLB in row i and column j. Output X2 of the CLB in row i−1 and column j is coupled to the input EM3 in the center CLB. Output X1 of the CLB in row i and column j+1 is coupled to the input EN2 of the center CLB. The output X3 of the CLB in row i column j+1 is coupled to the input EM4.

The output X2 of the CLB in row i+1 and column j is coupled to the input EN3. The output X4 of the CLB in row i+1 in column j is coupled to the input EM1. The output X3 of the CLB in row i and column j−1 is coupled to the input EN4. The output X1 in the CLB in row i, column j−1 is coupled to the input EM2.

Note that the structure shown in FIGS. 29 and 30 illustrate that the CLBs in the center of the array are directly coupled to eight neighbor CLBs. Further, the interconnections allow for direction of data flow in any direction through the direct connect structure among CLBs.

In an alternative system having eight neighbor CLBs, the CLB at row i−1, column j+1; row i+1, column j+1; row i−1, column j−1; and row i+1 column j−1 could be connected in place the four outer CLBs shown in FIGS. 29 and 30. This would provide eight neighbors with diagonal interconnection paths through the device. However, it is found that the ability to traverse a row or column with a direct connect structure provides for enhanced speed in transferring signals across the device.

Figure 31:
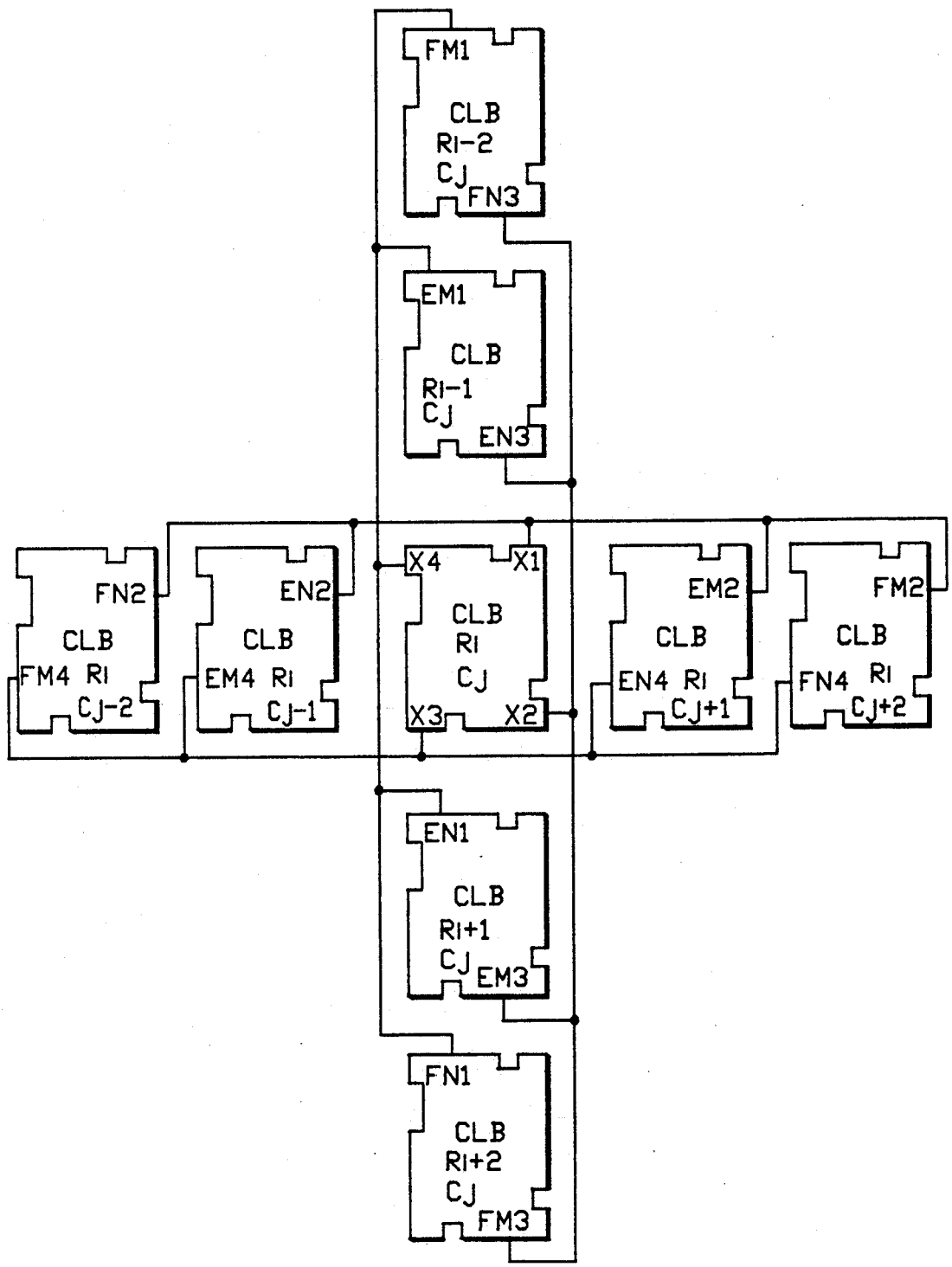
FIG. 31 illustrates direct connections from the output of the center configurable logic block to adjacent and next adjacent configurable logic blocks.

FIG. 31 illustrates the connection of the outputs X1 through X4 on the center CLB in row i column j to the eight neighbor CLBs.

The output X4 of the CLB in the center is connected to the input FM1 of the CLB in row i−2, column j; the input EM1 of the CLB in row i−1 column j; the input EN1 of the CLB in row i+1, column j; and the input FN1 in the CLB of row i+2, column j.

The output X1 is coupled to the input FN2 of the CLB in row i, column j−2; the input EN2 in the CLB in row i, column j−1; the input EM2 in the CLB in row i, column j+1; and the input FM2 in the CLB in row i, column j+2. The output X2 is coupled to the inputs FN3 and EN3 in the CLBs in rows i−2 and i−1, column j, respectively, and to the inputs EM3 and FM3 in the CLBs of rows i+1 and i+2, of column j, respectively. Finally, the output X3 is coupled to the inputs FM4 and EM4 of the CLBs in row i columns j−2 and j−1, respectively, and to the inputs EN4 and FN4 in the CLBs of row i columns j+1 and j+2, respectively.

Figure 32:
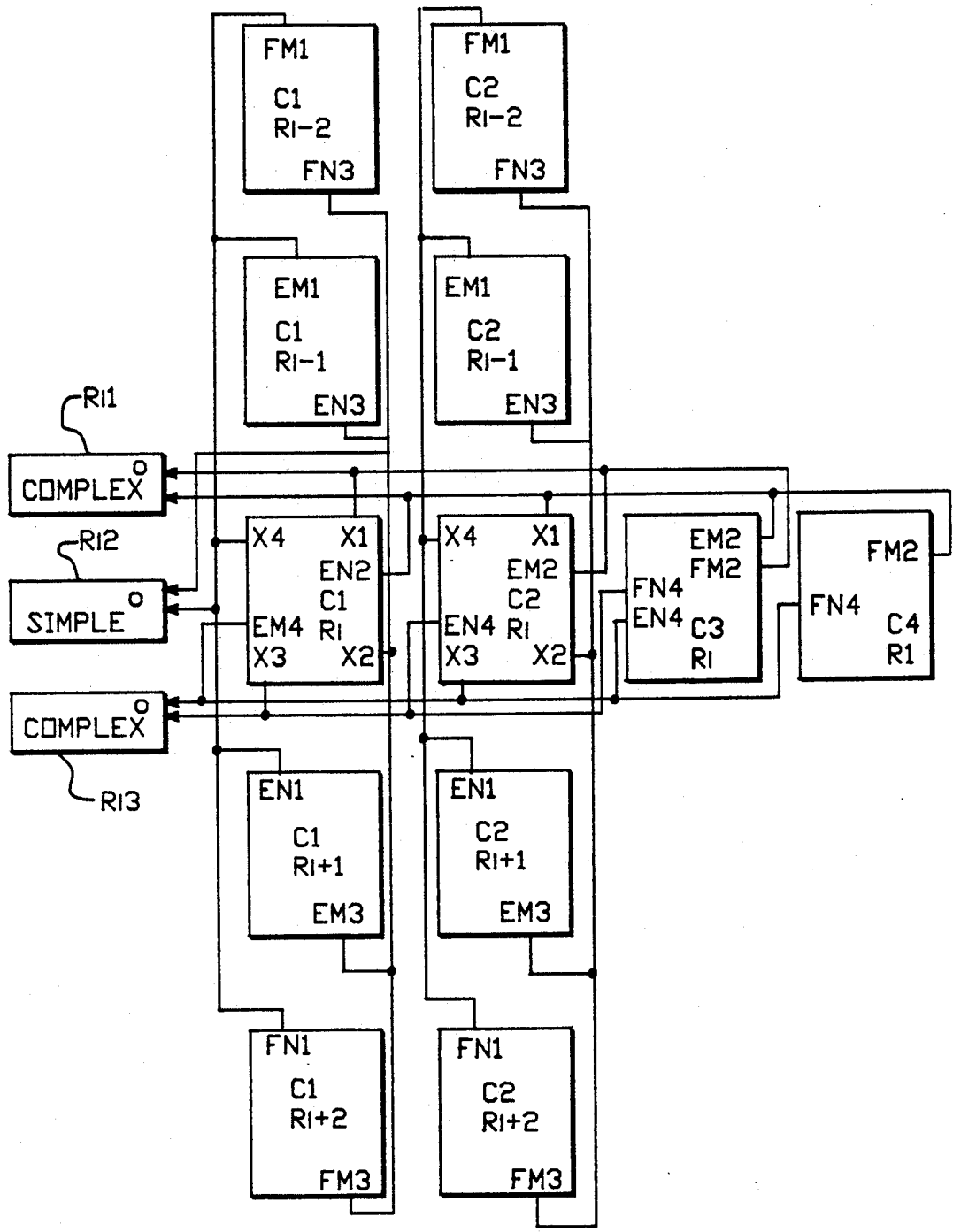
FIG. 32 illustrates direct connection of the outputs X1-X4, on peripheral configurable logic blocks.
Figure 33:
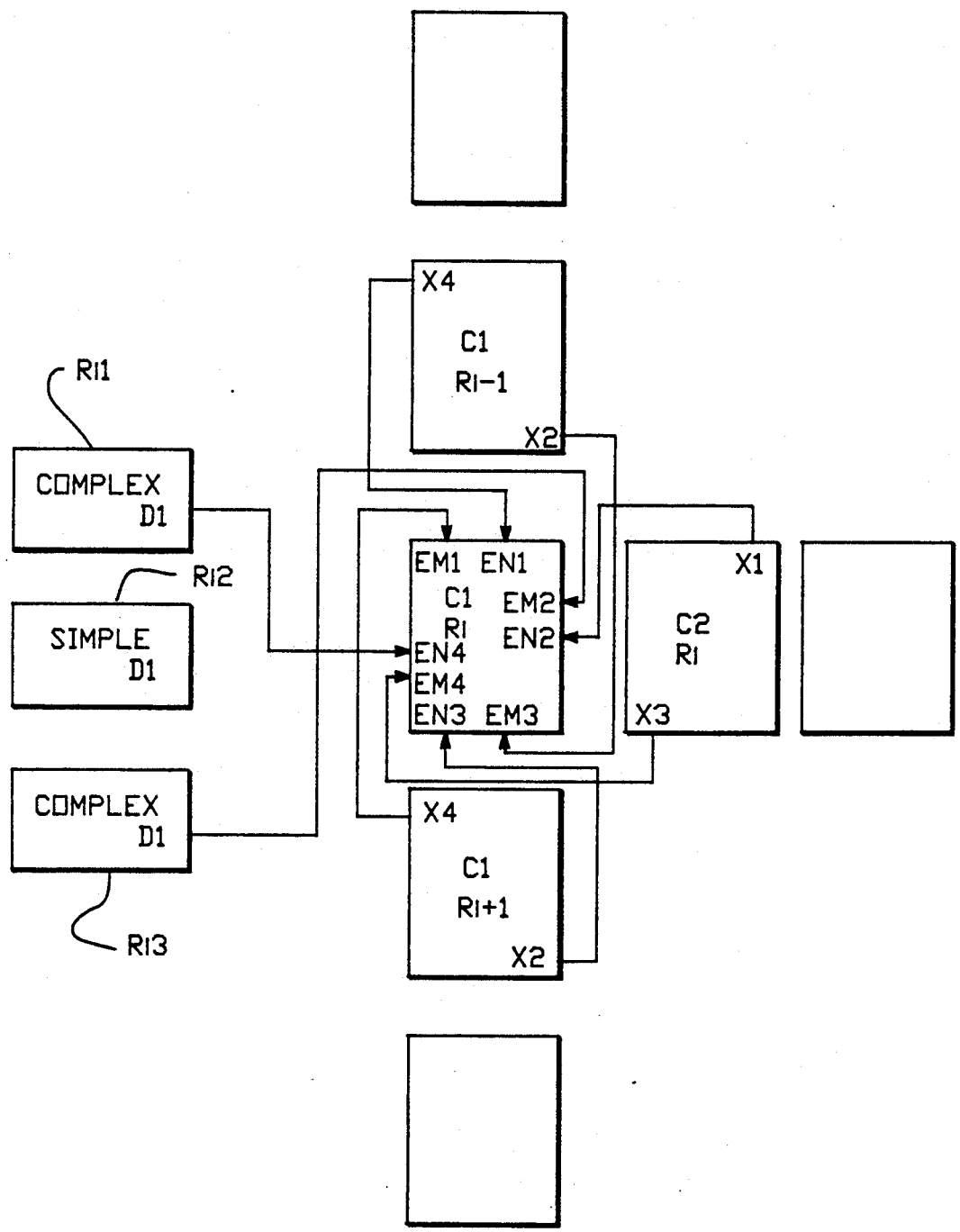
FIG. 33 illustrates direct connection to the inputs of a peripheral configurable logic block.
Figure 34:
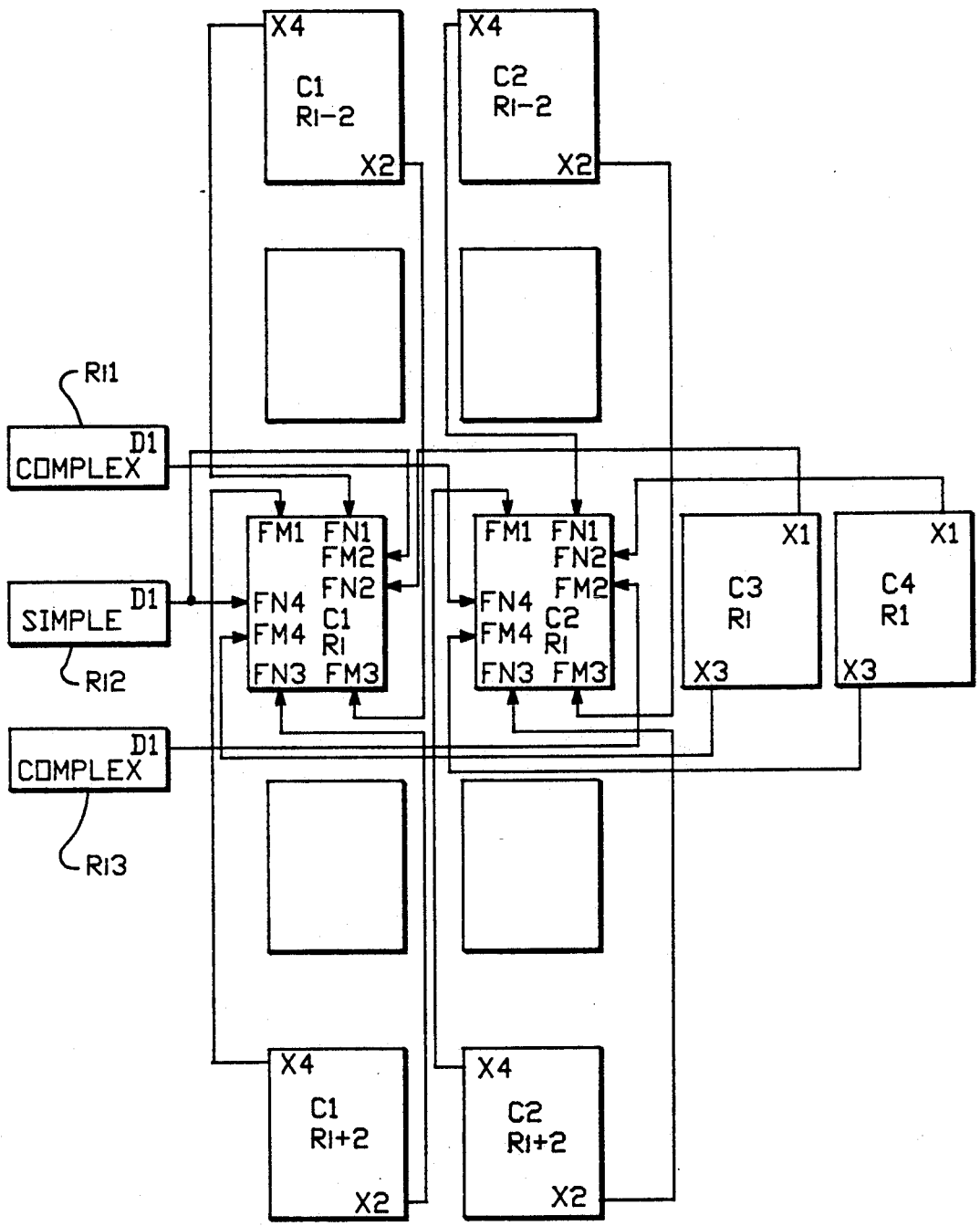
FIG. 34 illustrates direct connections to the inputs F1-F4 on a peripheral configurable logic block.

The direct connections on the peripheral CLBs which include direct connections to the IOBs are shown in FIGS. 32-34. The figures are shown with the IOBs along the left side of the figure so that the columns of peripheral CLBs shown are columns 1 and 2. However, the connections apply as well for structures in which the peripheral CLBs are on rows 1 and 2 rather than columns 1 and 2, columns 7 and 8 rather than columns 1 and 2, and rows 7 and 8 rather than columns 1 and 2. The connections are just rotated where appropriate.

Furthermore, the connections of the CLBs in the corners are not shown. These CLBs can be connected up in a wide variety of configurations due to the converging nets at those corners. The specific direct connections of the corner CLBs and of all the other peripheral CLBs to IOBs on the array are shown in Table 1.

TABLE 1

| FROM PAD # | TO CLB LOCATION | IOB DIRECT (DI) TO CLB | CLB TO IOB (O) |
|---|---|---|---|
| 2 | R1C1 | EM3 | X4 |
|   | R2C1 | FM3 | X4 |
| 3 | R1C1 | FN1 FM3 | X1 |
|   | R2C1 | — | X1 |
| 4 | R1C1 | EN1 | X2 |
|   | R2C1 | FN1 | X2 |
| 5 | R1C2 | EM3 | X4 |
|   | R2C2 | FM3 | X4 |
| 6 | R1C2 | FN1 FM3 | X1 |
|   | R2C2 | — | X1 |
| 7 | R1C2 | EN1 | X2 |
|   | R2C2 | FN1 | X2 |
| 8 | R1C3 | EM3 | X4 |
|   | R2C3 | FM3 | X4 |
| 9 | R1C3 | FN1 FM3 | X1 |
|   | R2C3 | — | X1 |

TABLE 1-continued

| FROM PAD # | TO CLB LOCATION | IOB DIRECT (DI) TO CLB | CLB TO IOB (O) |
|---|---|---|---|
| 10 | R1C3 | EN1 | X2 |
|   | R2C3 | FN1 | X2 |
| 11 | R1C1 | EM3 | X4 |
|   | R2C4 | FM3 | X4 |
| 12 | R1C4 | FN1 FM3 | X1 |
|   | R2C4 | — | X1 |
| 13 | R1C4 | EN1 | X2 |
|   | R2C4 | FN1 | X2 |
| 16 | R1C5 | EM3 | X4 |
|   | R2C5 | FM3 | X4 |
| 17 | R1C5 | FN1 FM3 | X1 |
|   | R2C5 | — | X1 |
| 18 | R1C5 | EN1 | X2 |
|   | R2C5 | FN1 | X2 |
| 19 | R1C6 | EM3 | X4 |
|   | R2C6 | FM3 | X4 |
| 20 | R1C6 | FN1 FM3 | X1 |
|   | R2C6 | — | X1 |
| 21 | R1C6 | EN1 | X2 |
|   | R2C6 | FN1 | X2 |
| 22 | R1C7 | EM3 | X4 |
|   | R2C7 | FM3 | X4 |
| 23 | R1C7 | FN1 FM3 | X1 |
|   | R2C7 | — | X1 |
| 24 | R1C7 | EN1 | X2 |
|   | R2C7 | FN1 | X2 |
| 25 | R1C8 | EM3 | X4 |
|   | R2C8 | FM3 | X4 |
| 26 | R1C8 | FN1 FM3 | X1 |
|   | R2C8 | — | X1 |
| 27 | R1C8 | EN1 | X2 |
|   | R2C8 | FN1 | X2 |
| 29 | R1C8 | EM4 | X1 |
|   | R1C7 | FM4 | X1 |
| 30 | R1C8 | FN2 FM4 | X2 |
|   | R1C7 | — | X2 |
| 31 | R1C8 | EN2 | X3 |
|   | R1C7 | FN2 | X3 |
| 32 | R2C8 | EM4 | X1 |
|   | R2C7 | FM4 | X1 |
| 33 | R2C8 | FN2 FM4 | X2 |
|   | R2C7 | — | X2 |
| 34 | R2C8 | EN2 | X3 |
|   | R2C7 | FN2 | X3 |
| 35 | R3C8 | EM4 | X1 |
|   | R3C7 | FM4 | X1 |
| 36 | R3C8 | FN2 FM4 | X2 |
|   | R3C7 | — | X2 |
| 37 | R3C8 | EN2 | X3 |
|   | R3C7 | FN2 | X3 |
| 38 | R4C8 | EM4 | X1 |
|   | R4C7 | FM4 | X1 |
| 39 | R4C8 | FN2 FM4 | X2 |
|   | R4C7 | — | X2 |
| 40 | R4C8 | EN2 | X3 |
|   | R4C7 | FN2 | X3 |
| 43 | R5C8 | EM4 | X1 |
|   | R5C7 | FM4 | X1 |
| 44 | R5C8 | FN2 FM4 | X2 |
|   | R5C7 | — | X2 |
| 45 | R5C8 | EN2 | X3 |
|   | R5C7 | FN2 | X3 |
| 46 | R6C8 | EM4 | X1 |
|   | R6C7 | FM4 | X1 |
| 47 | R6C8 | FN2 FM4 | X2 |
|   | R6C7 | — | X2 |
| 48 | R6C8 | EN2 | X3 |
|   | R6C7 | FN2 | X3 |
| 49 | R7C8 | EM4 | X1 |
|   | R7C7 | FM4 | X1 |
| 50 | R7C8 | FN2 FM4 | X2 |
|   | R7C7 | — | X2 |
| 51 | R7C8 | EN2 | X3 |
|   | R7C7 | FN2 | X3 |
| 52 | R8C8 | EM4 | X1 |
|   | R8C7 | FM4 | X1 |
| 53 | R8C8 | FN2 FM4 | X2 |
|   | R8C7 | — | X2 |
| 54 | R8C8 | EN2 | X3 |

TABLE 1-continued

| FROM PAD # | TO CLB LOCATION | IOB DIRECT (DI) TO CLB | CLB TO IOB (O) |
|---|---|---|---|
|  | R8C7 | FN2 | X3 |
| 57 | R8C8 | EM1 | X2 |
|  | R7C8 | FM1 | X2 |
| 58 | R8C8 | FM1 FN3 | X3 |
|  | R7C8 | — | X3 |
| 59 | R8C8 | EN3 | X4 |
|  | R7C8 | FN3 | X4 |
| 60 | R8C7 | EM1 | X2 |
|  | R7C7 | FM1 | X2 |
| 61 | R8C7 | FM1 FN3 | X3 |
|  | R7C7 | — | X3 |
| 62 | R8C7 | EN3 | X4 |
|  | R7C7 | FN3 | X4 |
| 63 | R8C6 | EM1 | X2 |
|  | R7C6 | FM1 | X2 |
| 64 | R8C6 | FM1 FN3 | X3 |
|  | R7C6 | — | X3 |
| 65 | R8C6 | EN3 | X4 |
|  | R7C6 | FN3 | X4 |
| 66 | R8C5 | EM1 | X2 |
|  | R7C5 | FM1 | X2 |
| 67 | R8C5 | FM1 FN3 | X3 |
|  | R7C5 | — | X3 |
| 68 | R8C5 | EN3 | X4 |
|  | R7C5 | FN3 | X4 |
| 71 | R8C4 | EM1 | X2 |
|  | R7C4 | FM1 | X2 |
| 72 | R8C4 | FM1 FN3 | X3 |
|  | R7C4 | — | X3 |
| 73 | R8C4 | EN3 | X4 |
|  | R7C4 | FN3 | X4 |
| 74 | R8C3 | EM1 | X2 |
|  | R7C3 | FM1 | X2 |
| 75 | R8C3 | FM1 FN3 | X3 |
|  | R7C3 | — | X3 |
| 76 | R8C3 | EN3 | X4 |
|  | R7C3 | FN3 | X4 |
| 77 | R8C2 | EM1 | X2 |
|  | R7C2 | FM1 | X2 |
| 78 | R8C2 | FM1 FN3 | X3 |
|  | R7C2 | — | X3 |
| 79 | R8C2 | EN3 | X4 |
|  | R7C2 | FN3 | X4 |
| 80 | R8C1 | EM1 | X2 |
|  | R7C1 | FM1 | X2 |
| 81 | R8C1 | FM1 FN3 | X3 |
|  | R7C1 | — | X3 |
| 82 | R8C1 | EN3 | X4 |
|  | R7C1 | FN3 | X4 |
| 85 | R8C1 | EM2 | X3 |
|  | R8C2 | FM2 | X3 |
| 86 | R8C1 | FM2 FN4 | X4 |
|  | R8C2 | — | X4 |
| 87 | R8C1 | EN4 | X1 |
|  | R8C2 | FN4 | X1 |
| 88 | R7C1 | EM2 | X3 |
|  | R7C2 | FM2 | X3 |
| 89 | R7C1 | FM2 FN4 | X4 |
|  | R7C2 | — | X4 |
| 90 | R7C1 | EN4 | X1 |
|  | R7C2 | FN4 | X1 |
| 91 | R6C1 | EM2 | X3 |
|  | R6C2 | FM2 | X3 |
| 92 | R6C1 | FM2 FN4 | X4 |
|  | R6C2 | — | X4 |
| 93 | R6C1 | EN4 | X1 |
|  | R6C2 | FN4 | X1 |
| 94 | R5C1 | EM2 | X3 |
|  | R5C2 | FM2 | X3 |
| 95 | R5C1 | FM2 FN4 | X4 |
|  | R5C2 | — | X4 |
| 96 | R5C1 | EN4 | X1 |
|  | R5C2 | FN4 | X1 |
| 99 | R4C1 | EM2 | X3 |
|  | R4C2 | FM2 | X3 |
| 100 | R4C1 | FM2 FN4 | X4 |
|  | R4C2 | — | X4 |
| 101 | R4C1 | EN4 | X1 |
|  | R4C2 | FN4 | X1 |
| 102 | R3C1 | EM2 | X3 |
|  | R3C2 | FM2 | X3 |
| 103 | R3C1 | FM2 FN4 | X4 |
|  | R3C2 | — | X4 |
| 104 | R3C1 | EN4 | X1 |
|  | R3C2 | FN4 | X1 |
| 105 | R2C1 | EM2 | X3 |
|  | R2C2 | FM2 | X3 |
| 106 | R2C1 | FM2 FN4 | X4 |
|  | R2C2 | — | X4 |
| 107 | R2C1 | EN4 | X1 |
|  | R2C2 | FN4 | X1 |
| 108 | R1C1 | EM2 | X3 |
|  | R1C2 | FM2 | X3 |
| 109 | R1C1 | FM2 FN4 | X4 |
|  | R1C2 | — | X4 |
| 110 | R1C1 | EN4 | X1 |
|  | R1C2 | FN4 | X1 |

FIG. 32 shows the connection of the CLB in column 1 row i, for i between 3 and 6. Also, the connections of the CLB in column 2 row i are shown.

Thus, the output X1 of the CLB in column 1 row i is coupled directly to an adjacent complex IOB labelled Ri1.

Note that the IOBs in the configurable gate array of the present invention are grouped into three blocks per row or column of the array. Thus, as shown in FIG. 32 for row i there are three IOBs Ri1, Ri2, and Ri3. Ri1 and Ri3 are complex IOBs while Ri2 is a simple IOB. Each has a multiplexer receiving a plurality of signals for supply as the output signal to the associated pin. These inputs are shown by the reference O.

The output X1 in the CLB C1Ri is coupled directly to the output in the IOB Ri1, to the input EM2 in the CLB C2Ri and to the input FM2 in the CLB C3Ri.

The output X2 of the CLB C1Ri is coupled directly to the inputs FN3 and EN3 of the CLBs in column 1 rows Ri−2 and i−1, respectively. Also, the output X2 is coupled directly to the inputs EM3 and FM3 in the CLBs in column 1 rows Ri+1 and Ri+2, respectively.

The output X3 of the CLB C1Ri is coupled directly to the terminal O in the complex IOB Ri3 and to the EN4 and FN4 inputs of the CLBs C2Ri and C3Ri, respectively.

The output X4 of the CLB C1Ri is coupled directly to the O terminal of the simple IOB Ri2 and directly to the FM1 and EM1 terminals of CLBs C1Ri−2 and C1Ri−1, respectively. Also, the output X4 of the CLB C1Ri is coupled directly to the EN1 and FN1 inputs of CLB in column 1 rows i+1 and i+2, respectively.

The output X1 in the CLB C2Ri is coupled directly to the O terminal of the complex IOB Ri1, and to the EN2 terminal of the CLB C1Ri. Output X1 is also coupled to the EM2 and FM2 inputs of CLBs C3Ri and C4Ri, respectively.

The output X2 of the CLB C2Ri is coupled directly to the inputs FN3 and EN3 of the CLBs C2Ri−2 and C2Ri−1. The output X2 of C2Ri is also coupled to the EM3 and FM3 inputs of CLBs C2Ri+1 and C2Ri+2.

The output X3 of the CLB C2Ri is coupled directly to the O terminal of the complex IOB Ri3, to the EM4 input of the CLB C1Ri to the EN4 input of CLB C3Ri and to the input FN4 of CLB C4Ri.

The output terminal X4 of the CLB C2Ri is connected directly to the inputs FM1 and EM1 of CLBs C2Ri−2 and C2Ri−1. Output X4 is also coupled to the inputs EN1 and FN1 of CLBs C2Ri+1 and C2Ri+2, respectively. In addition, the output X4 of CLB C2Ri is connected directly to the O terminal of the simple IOB Ri2.

The inputs EM1 through EM4 and EN1 through EN4 of the CLB C1Ri are shown in FIG. 33. The terminal EM1 is coupled to receive the output X4 of CLB C1Ri+1. The input EN1 is coupled to receive the output X4 of the CLB C1Ri−1. The input EM2 is coupled to receive an input from the complex IOB Ri3. The input EN2 is coupled to receive the output X1 of the CLB C2Ri. The input EM3 is coupled to receive the output X2 of the CLB C1Ri−1. The input EN3 is coupled to receive the output X2 of the CLB C1Ri+1. The input EM4 is coupled to receive the output X3 of the CLB C2Ri. The input EN4 is coupled to receive an input from the complex IOB Ri1.

In FIG. 34, the FM1 through FM4 and FN1 through FN4 inputs of CLBs C1Ri and C2Ri are shown.

The outputs X4 of CLBs C1Ri−2 and C2Ri−2 are connected respectively to the FN1 inputs of CLBs C1Ri and C2Ri. The outputs X2 of the CLBs C1Ri−2 and C2Ri−2 are connected directly to the inputs FM3 of CLBs C1Ri and C2Ri.

The outputs X1 of the CLBs C3Ri and C4Ri are connected directly to the FN2 inputs of CLBs C1Ri and C2Ri, respectively. The outputs X3 of the CLBs C3Ri and C4Ri are connected directly to the FM4 inputs of C1Ri and C2Ri.

The outputs X2 of the CLBs C1Ri+2 and C2Ri+2 are connected directly to the FN3 inputs of CLBs C1Ri and C2Ri, respectively. The outputs X4 of the CLBs C1Ri+2 and C2Ri+2 are connected directly to the FM1 inputs of CLBs C1Ri and C2Ri, respectively.

The terminal DI of the complex IOB Ri1 is coupled directly to the FN4 input of CLB C2Ri. The input DI received from the simple IOB Ri2 is coupled directly to the FN4 input and FM2 input of the CLB C1Ri. Finally, the input signal DI derived from the complex IOB Ri3 is coupled directly to the FM2 input of CLB C2Ri.

The programmable general connect is illustrated in FIGS. 35–49. It provides a means for routing nets around the device. The CLBs and IOBs are linked through this network by means of programmable interconnection points PIPs. The programmable general connect is subdivided into the long lines and the BGI segments, which are lines incorporating metal segments spanning one or two CLBs, usually terminating in a switching matrix or segment box as described above with reference to FIGS. 4–24.

The preferred implementation of the selection of the location of PIPs and their connection to the inputs and outputs of the configurable logic blocks and input/output blocks is shown as follows.

Figure 35:
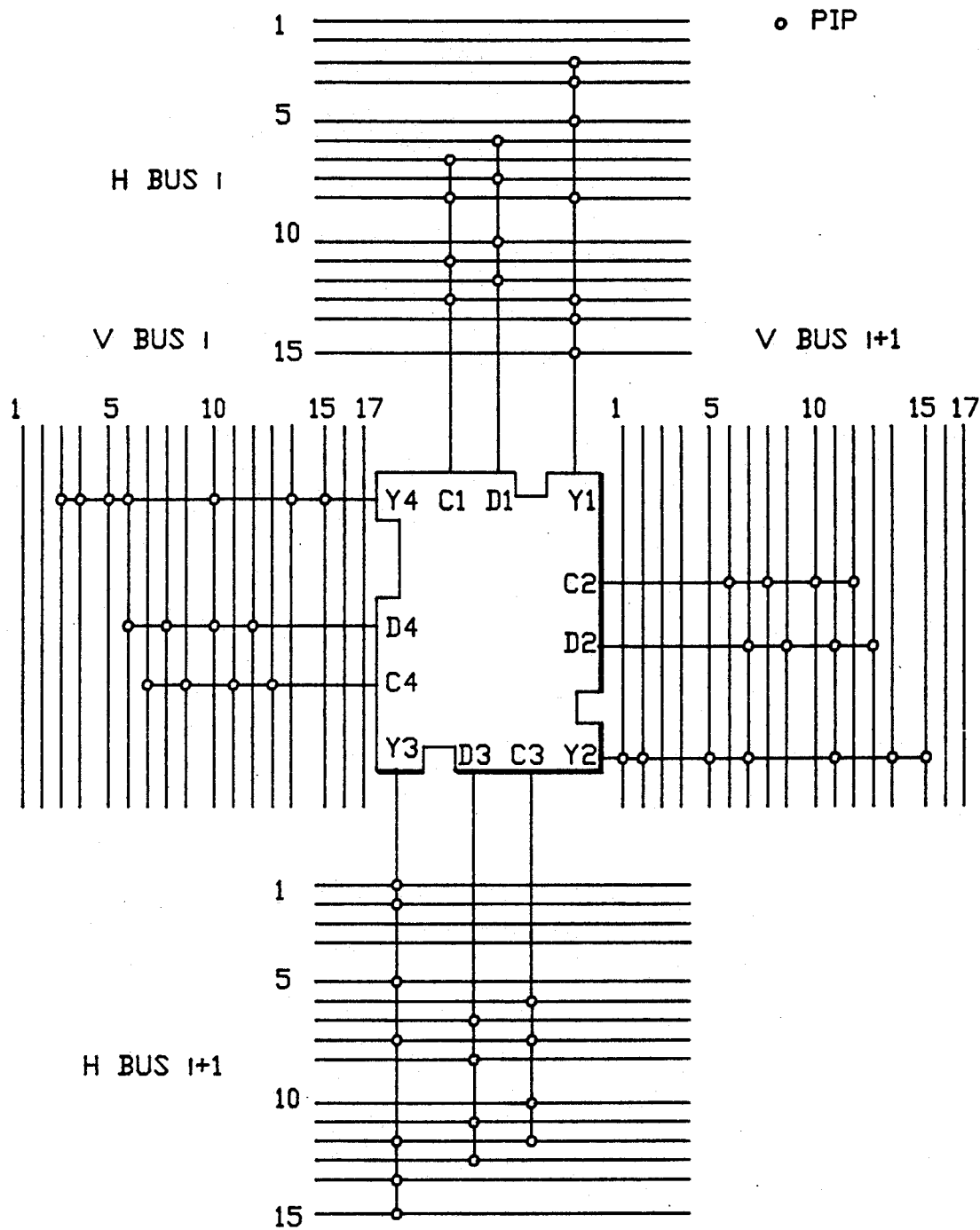
FIG. 35 illustrates the programmable connections between the interconnect structure and the configurable logic blocks.
Figure 37:
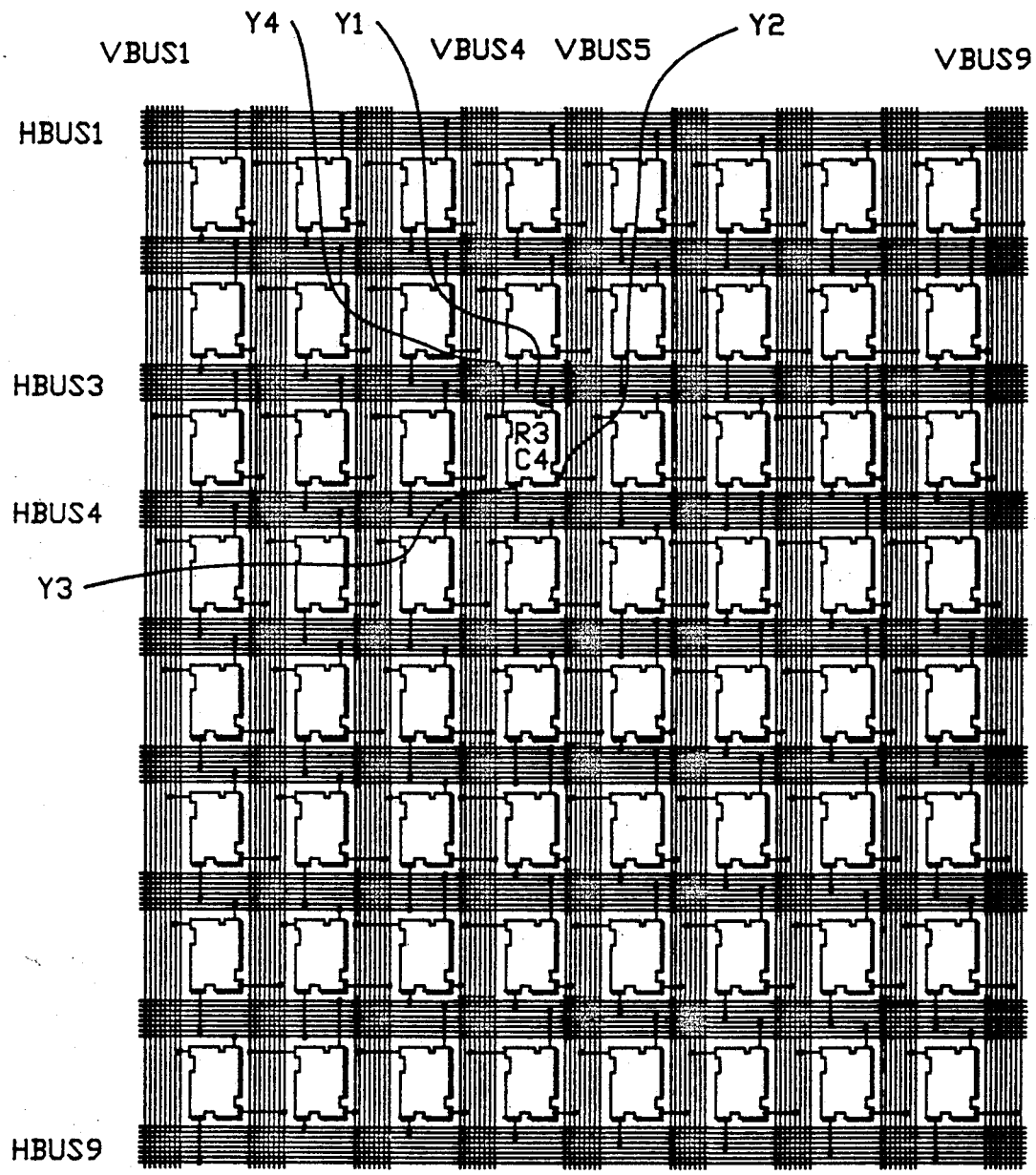
FIG. 37 illustrates the programmable connection of the configurable logic blocks in the array to uncommitted long lines.
Figure 38:
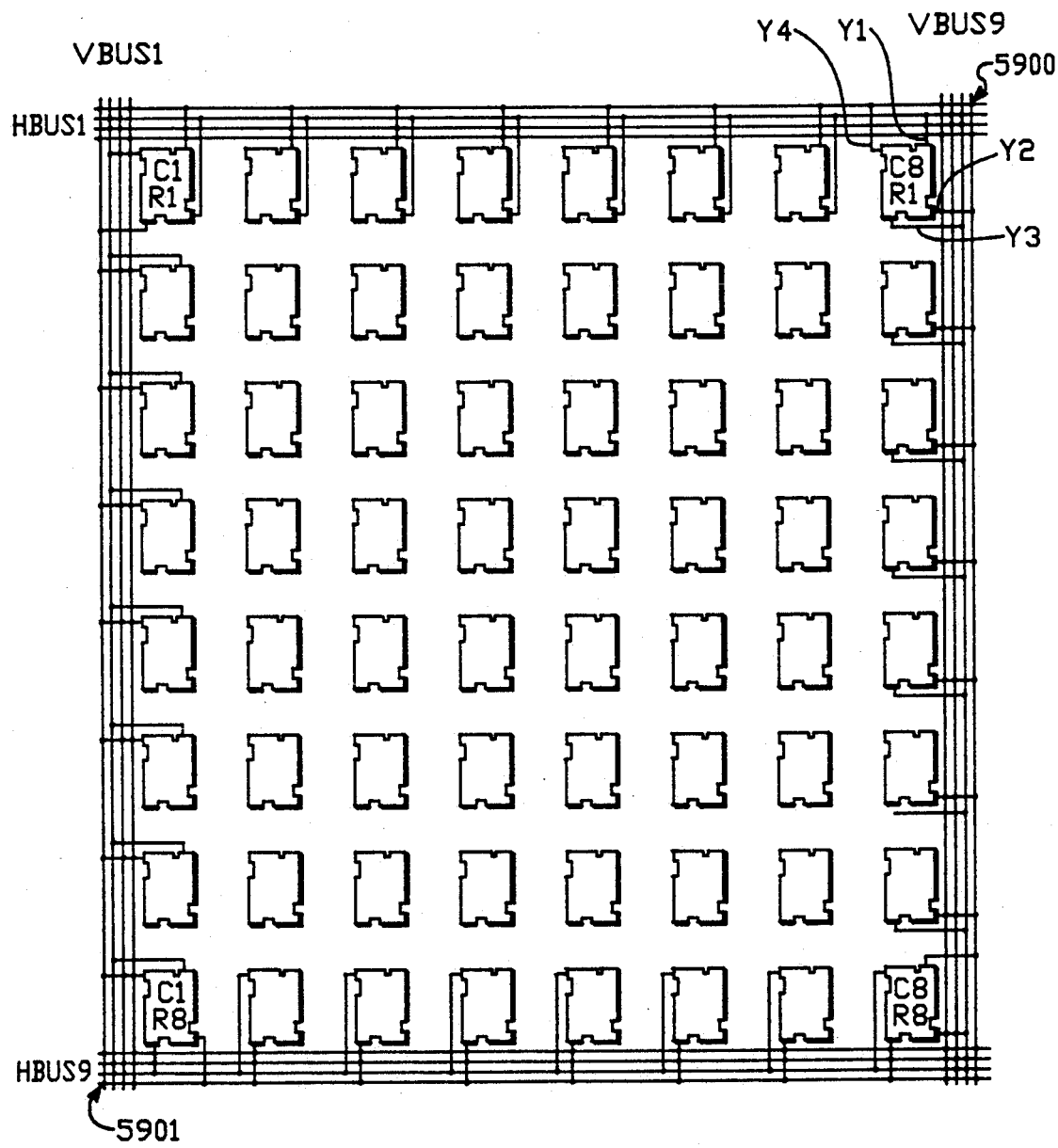
FIG. 38 illustrates the programmable connections to the outer long lines from the CLBs.

FIG. 35 shows the programmable connections of the outputs Y1 through Y4 to the long lines and BGI. The outputs Y1 through Y4 are also connected to the uncommitted long lines as shown in FIG. 37. Also, the outputs are coupled differently to the vertical bus 1 and horizontal bus 1, vertical bus 9 and horizontal bus 9 as shown in FIG. 38 as it relates to the long lines 1–4 in the respective buses.

FIG. 35 shows that the output Y1 is coupled to PIPs associated with long lines 3, 4, and 15, and BGI segments 5, 9, 13, and 14 in HBUS i. The output Y2 of CLB CiRi is coupled to VBUS i+1 long lines 1 and 2 and 15, and BGI segments 5, 7, 11, and 14. Output Y3 of CiRi is coupled to HBUS i+1 long lines 1, 2, and 15, and to BGI segments 5, 8, 12, and 14. The output Y4 of CiRi is coupled to VBUS i long lines 3, 4, and 15, and to BGI segments 5, 6, 10, and 14.

Also shown in FIG. 35 are the inputs to C1 through C4 and D1 through D4. These inputs are coupled as the unidirectional PIPs using four to one multiplexers in the preferred system to save on memory. One could use bidirectional PIPs, if desired.

The input C1 is coupled to BGI segments 7, 9, 11, and 13 on HBUS i. Input D1 is coupled to BGI segments 6, 8, 10, and 12 on HBUS i.

Input C2 is coupled to VBUS i+1 BGI segments 6, 8, 10, and 12, while input D2 is coupled to VBUS i+1 BGI segments 7, 9, 11, and 13.

The input C3 is coupled to HBUS i+1 BGI segments 6, 8, 10, and 12. Input D3 is coupled to HBUS i+1 BGI segments 7, 9, 11, and 13.

The input C4 is coupled to VBUS i BGI segments 7, 9, 11, and 13. The input D4 is coupled to VBUS i BGI segments 6, 8, 10, and 12.

Figure 36:
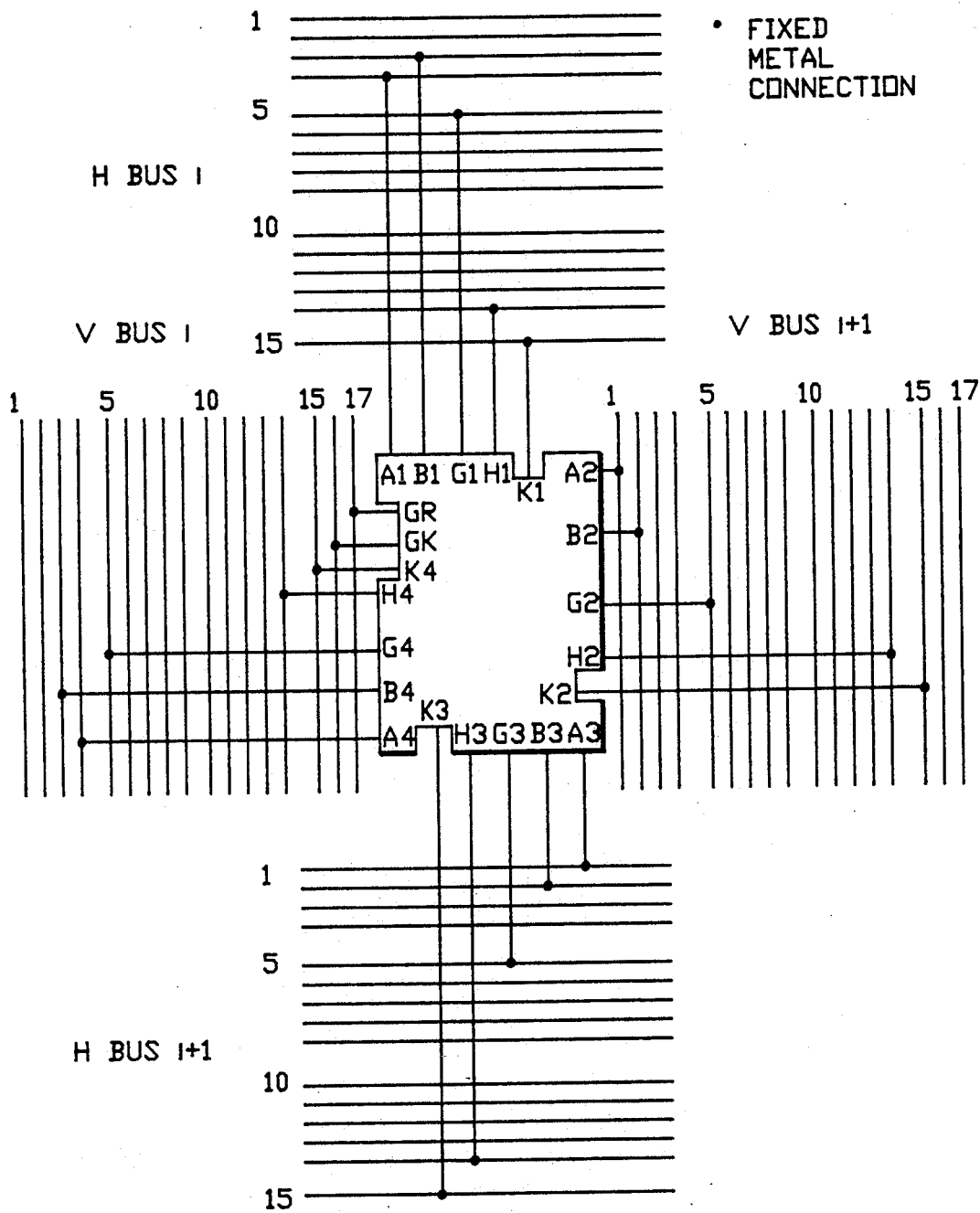
FIG. 36 illustrates the fixed connections between the interconnect structure and the configurable logic blocks.

FIG. 36 shows the fixed inputs from the long lines and BGI segments to CLB CiRi from the adjacent buses.

For HBUS i, long line 4 is coupled to input A1, long line 3 is coupled to input B1, BGI segment 5 is coupled to input G1, BGI segment 14 is coupled to input H1, and long line 15 is coupled to input K1.

For VBUS i+1, long line 1 is coupled to input A2, long line 2 is coupled to input B2, BGI segment 5 is coupled to input G2, BGI segment 14 is coupled to input H2, and long line 15 is coupled to input K2.

For HBUS i+1, long line 1 is coupled to input A3, long line 2 is coupled to input B3, BGI segment 5 is coupled to input G3, BGI segment 14 is coupled to input H3, and long line 15 is coupled to input K3.

For VBUS i, long line 4 is coupled to input A4, long line 3 is coupled to input B4, BGI segment 5 is coupled to input G4, BGI segment 14 is coupled to input H4, long line 15 is coupled to input K4, long line 16 is coupled to input GK, and long line 17 is coupled to input GR.

The connection of the configurable logic blocks to the uncommitted long lines is shown in FIG. 37. Each CLB, such as CLB R3C4, has outputs Y1 through Y4 coupled to one uncommitted long line each. The connections will not be recited because they are shown in FIG. 37. In FIG. 37, only lines 18–25 of the vertical buses, and lines 16–23 of the horizontal buses are shown, because these are the only uncommitted long lines. In order to provide an example for reading FIG. 37, the CLB R3C4 output Y1 is coupled to uncommitted long line 21 of HBUS 3. The output Y2 of R3C4 is coupled to uncommitted long line 23 of VBUS 5. The output Y3 is coupled to uncommitted long line 21 of HBUS 4. The output Y4 is coupled to uncommitted long line 23 of VBUS 4. Note that the uncommitted long lines do not have programmable connections to inputs of CLBs. The selection of the connections of the outputs of the uncommitted long lines has been carried out to achieve a distributed uniform pattern that facilitates programming of nets through the array.

FIG. 38 shows the connection of the long lines 1–4 in HBUS 1, VBUS 1, VBUS 9, and HBUS 9. The figure shows utilization of the corner intersections of VBUS 9 with HBUS 1 and HBUS 9, and VBUS 1 with HBUS 1 and HBUS 9 to allow propagation of a signal supplied to any one of the four outer long lines all the way around the chip. This facilitates utilization of a single signal as a control input to all IOBs as desired.

The outputs Y1 of CLBs in row 1 are all connected to HBUS 1 long lines 1, 3, and 4 with the exception of the Y1 output of R1C8 which is coupled to HBUS 1 long lines 2, 3, and 4. The outputs Y2 of CLBs in row 1 are all connected to HBUS 1 long line 2, with the exception of R1C8. The Y4 output of R1C8 is coupled to HBUS 1 long line 1.

The Y2 output of all CLBs in column 8, except for R8C8, is coupled to VBUS9 long lines 1, 2, and 4. The Y3 output of all CLBs in column 8, with the exception of C8R8, is coupled to VBUS 9 long line 3. The Y1 output of C8R8 is coupled to VBUS 9 long line 4. The Y2 output of CLB C8R8 is coupled to VBUS 9 long lines 1, 2, and 3.

The Y3 outputs of all CLBs in row 8, with the exception of C1R8, are coupled to HBUS 9 long lines 1, 2, and 4. The Y4 output of CLBs in row 8, with the exception of C1R8, is coupled to HBUS 9 long line 3.

The Y2 output of C1R8 is coupled to long line 4 of HBUS 9. The Y3 output of C1R8 is coupled to long lines 1, 2, and 3 of HBUS 9. The CLBs in column 1, with the exception of C1R1, are connected so that Y4 is connected to VBUS 1 long lines 1, 3, and 4, and Y1 is connected to VBUS 1 long line 2. The CLB C1R1 output Y4 is connected to VBUS 1 long lines 2-4 and the output Y3 is connected to VBUS 1 long line 1.

Passage of a signal on any long line about the periphery of the chip is enabled by the interconnect structure 5900 at the intersection of VBUS 9 and HBUS 1, and the interconnect structure 5901 at the intersection of VBUS 1 and HBUS 9. These structures 5900 and 5901 allow connection of a signal on any one of the four long lines around the periphery to one of the two outer long lines on the respective buses, and vice versa.

Figure 39:
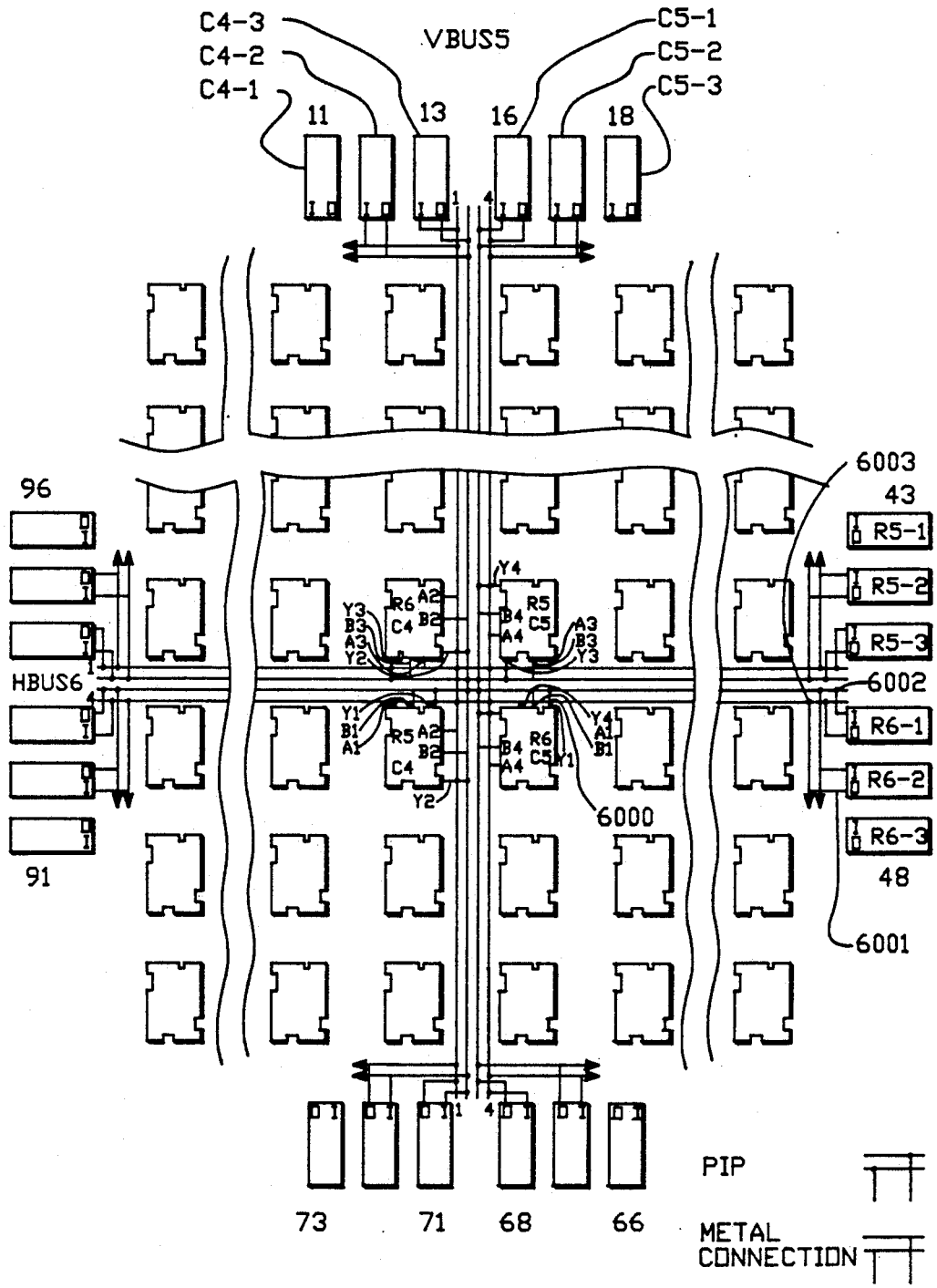
FIG. 39 illustrates the reach between input/output blocks and configurable logic blocks on long lines.
Figure 44:
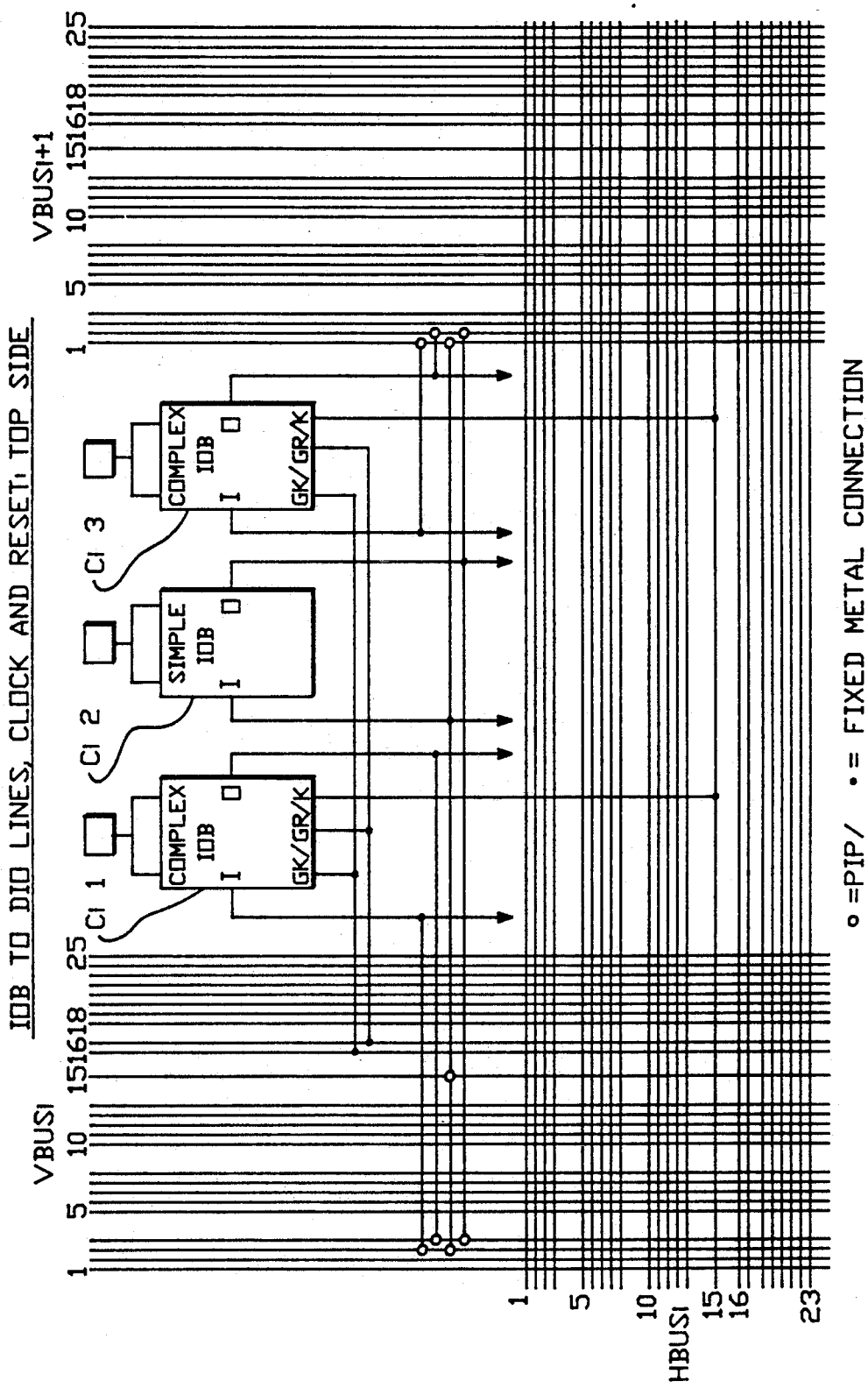
FIG. 44 illustrates the connection of the clock and reset signals to the complex input/output blocks, as well as the programmable connections of the inputs and the outputs of the input/output blocks on the top side of the array to the vertical buses.

FIG. 39 illustrates the long line reach between IOBs and CLBs. In effect, a signal input from an IOB can be supplied directly as an input to a CLB with only one PIP delay. Also, a signal output from a CLB can be supplied as an output signal to an IOB with only one PIP delay. For instance, the signal Y1 generated at CLB R6C5 can be supplied along long line 4 of HBUS 6 through PIP 6000 as an input across line 6001 to the simple IOB R6-2. In this manner, a signal generated at CLB in the interior of the array can be quickly propagated to the outside of the chip. Note that the symbol 6003 on long line 4 for the PIP corresponds to an input 6002 to the multiplexer 4501 of FIG. 45.

Likewise, an input signal from the IOB R6-2 and IOB R6-1 can be coupled through PIPs to long line 3 which is supplied as a direct input B1 to R6C5 and to R6C4. Thus, through single PIP delay, e.g. at point 6002, an input signal from R6-1 can be supplied directly to a CLB in the interior of the device. Similar paths can be seen from the IOBs C4-1, C4-2, C4-3, C5-1, C5-2, and C5-3 at the top or bottom of the chip. These connections are similarly made for IOBs at the end of each column or row in the chip.

The four long lines 1-4 of each bus have a programmable pull up resistor at their ends (not shown). These four long lines are envisioned to be used for connectivity between the IOBs and CLBs in the center of the device, or long reach between CLBs. The pull up resistor can be enabled by the program data in the configuration memory such that if no signal arrives at the line, the line can be taken to a logical one state. This stops lines from carrying spurious signals across the whole device.

A second feature of the pull up is the ability to construct a wired-AND b driving the line from a number of CLBs or IOBs output buffers that are tristatable.

Each output buffer may be configured such that when passing a logic zero, the buffer asserts a low to the long line. When passing a logic 1, the buffer asserts a tristate (high impedance) to the line. If no other buffer is driving the line (i.e., all buffers connected are in tristate—the logic 1 case for each) then the pull-up resistor forces a logic high onto the line, giving the result of the AND function required.

FIGS. 40-49 show connections to the IOB structure with the interconnect. In FIG. 40, the connections of the input terminals I and the output terminals O of the eight groups of input/output blocks along the top side of the array to horizontal bus 1 are shown. In the figure, the circular symbols at the intersection of lines refer to bidirectional PIP connections. The squares at the intersection indicate a connection to the multiplexer in the IOB which generates the outgoing O signal. It can be seen upon review of FIG. 40 that each IOB input terminal I is coupled to one BGI segment and one uncommitted long line through a PIP. Each output terminal O in the IOBs is coupled to one uncommitted long line and one BGI segment at the input multiplexer. In addition, the input terminal I of the simple IOBs in respective centers of the triplets, are all coupled to long line 15 through a PIP. The distribution of the connections has been chosen to provide for a predictable scheme that facilitates programming of networks on the device. A wide variety of interconnection schemes could be implemented as meets the needs of a specific application.

FIG. 41 illustrates the connections to the IOBs along the bottom side to horizontal bus 9. The pattern of connections on FIG. 42 is similar to that of FIG. 40. The same explanation applies.

FIG. 42 shows the IOB connections along the left side of the array to vertical bus 1. Again, this connection scheme is similar to that as described with reference to FIG. 40 and the explanation is not restated.

FIG. 43 shows the IOB connections along the right side or the array to vertical bus 9. Again, this interconnection scheme is similar to that described with reference to FIG. 40 and is not explained again.

FIGS. 44-47 show the connections of the IOBs along the top side of the array to the vertical buses VBUS i and VBUS i+1, and show the inputs for the control signals GK, GR and K. Note that the input I of IOB Ci1 is coupled through a PIP to long line 3 of VBUS i in addition to the connections shown in FIG. 40. The terminal 0 of IOB Ci1 is coupled through the multiplexer inside the IOB to long line 4 of VBUS i. The GK and GR input signals are coupled to the long lines 16 and 17 of VBUS i. The input K is directly coupled to long line 15 of HBUS 1.

The simple IOB Ci2 has its terminal I connected through PIPs to long lines 3 and 15 of VBUS i, and long line 1 of VBUS i+1. The terminal O on the simple IOB Ci2 receives as inputs to its multiplexer, connections to long line 2 of VBUS i+1 and long line 4 of VBUS i.

The complex IOB Ci3 has its input terminal I coupled to long line 1 of VBUS i+1 and a multiplexer generating the signal O coupled to receive the signal on long line 2 of VBUS i+1. The control signals GK and GR in IOB Ci3 are coupled to long line 16 and 17 of VBUS i. Control input K is coupled to long line 15 of HBUS 1.

Figure 45:
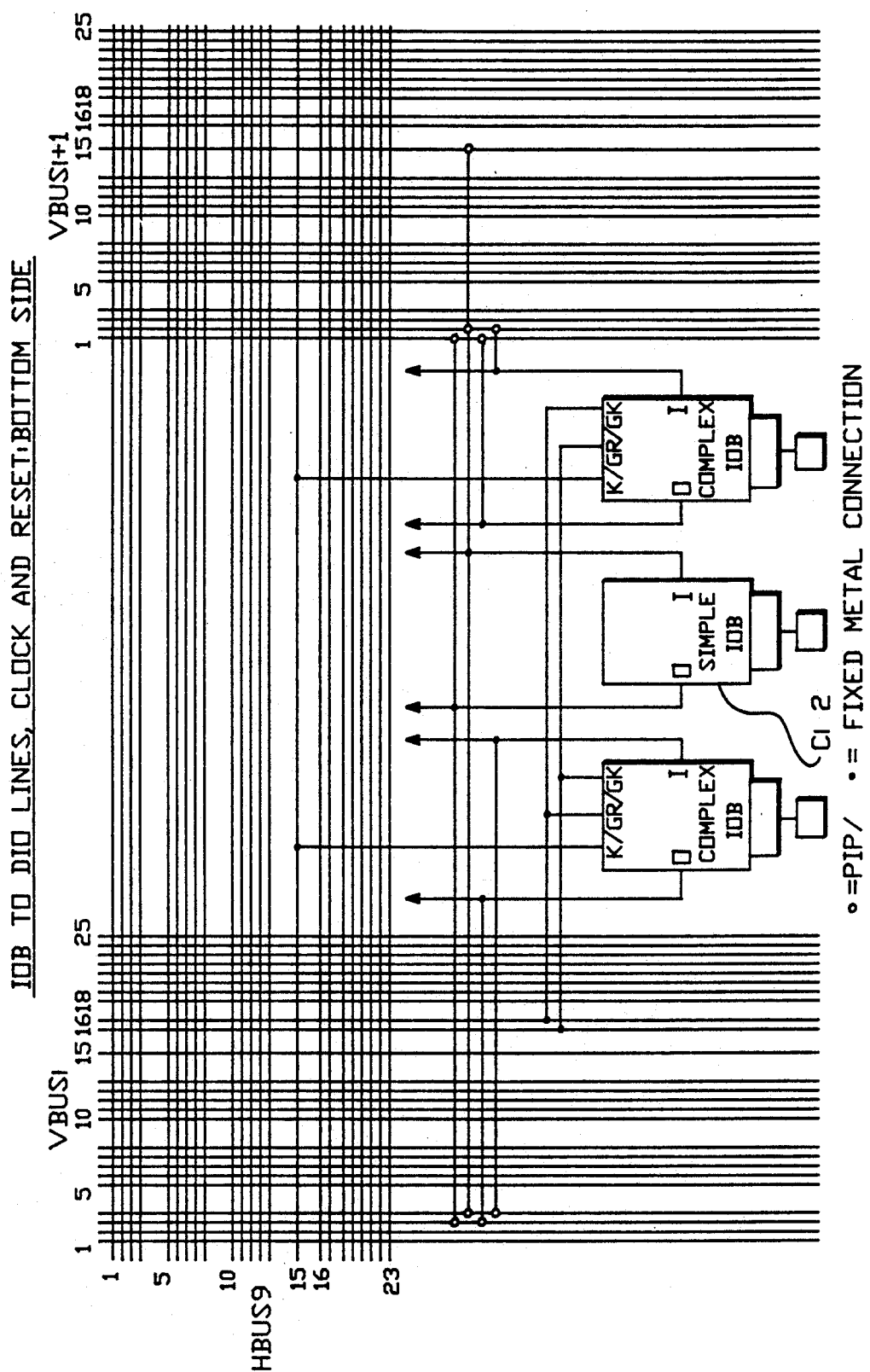
FIG. 45 illustrates the connection of the clock and reset signals to the input/output blocks on the bottom side of the array, and connection of these bottom side input/output blocks to the vertical buses.

FIG. 45 shows connections to the IOBs along the bottom side with the vertical buses VBUS i and VBUS i+1, as well as the control inputs K, GR, and GK. Note that the connections to these IOBs is similar to that described with reference to FIG. 44, except that the terminal I in the simple IOB Ci2 is connected to long line 4 of VBUS i and long lines 2 and 15 of VBUS i+1. In this manner, the long line 15 of VBUS i+1 is connected to receive signals from the simple IOB Ci2 along the bottom side of the array while the VBUS i line 15 is coupled to receive a signal from the IOB at the top side of the array for IOBs over one column of CLBs.

FIG. 46 shows connections to the IOBs along the left side of the array with the horizontal buses HBUS i and HBUS i+1 and with the control signals supplied along VBUS 1.

The complex IOB Ri1 receives an input from long line 3 of HBUS i at its terminal O. The I terminal of Ri1 is coupled through a PIP to long line 4 of HBUS i. Control signals K, GR and GK are coupled to lines 15, 17, and 16 respectively of VBUS 1. The output O of simple IOB Ri2 is coupled to receive inputs from long line 3 of HBUS i and long line 1 of HBUS i+1. The terminal I of simple IOB Ri2 is coupled through PIPs to long line 4 of HBUS i, long line 2 of HBUS i+1, and long line 15 of HBUS i+1.

The terminal O of complex IOB Ri3 is coupled to receive an input from long line 1 of HBUS i+1. The control signals K, GR, and GK are coupled to lines 15, 17, and 16 respectively of VBUS 1. The terminal I in complex IOB Ri3 is coupled through a PIP to long line 2 of HBUS i+1.

FIG. 47 shows the connection of the IOBs along the right side of the array to the horizontal buses HBUS i and HBUS i+1, and for receiving the control signals from vertical bus VBUS 9. These connections are similar to those described with reference to FIG. 46 and are not restated. The only exception is that long line 15 of HBUS i is coupled to the terminal I of Ri2 along the right side (FIG. 47), while long line 15 of HBUS i+1 is coupled to terminal I of the simple IOB along the left side (FIG. 46).

FIG. 48 shows the connections of the other control inputs IEN, OEN, SL1, SL2, and CEN to the complex IOBs along the top and left side of the array. The programmable interconnect points for each of these signals consist of inputs to a multiplexer. Thus, the convention of using a square at the intersection of two lines indicates an input into the multiplexer rather than a bidirectional PIP.

Thus, as shown in FIG. 48, the inputs to the multiplexer generating the signals IEN are supplied from long line 1 and BGI segment 9 of the adjacent horizontal bus HBUS 1 for IOBs along the top, and of the adjacent vertical bus VBUS 1 for IOB along the left side. Likewise, the signal OEN is supplied either from long line 1 or BGI segment 8. The signal SL1 is supplied either from long line 2 or BGI segment 7. The signal SL2 is supplied either from long line 3 of BGI segment 6. The signal CEN is supplied either from long line 4 or BGI segment 5.

FIG. 49 shows the inputs to the multiplexers for the control signals of complex IOBs along the right and bottom sides of the array. Thus, the signal IEN is supplied either from long line 4 or BGI segment 10 of VBUS 9 or HBUS 9. The signal OEN is supplied either from long line 4 or BGI segment 11. The signal SL1 is supplied either from long line 3 or BGI segment 12. The signal SL2 is supplied either from long line 2 or BGI segment 13. The signal CEN is supplied either from long line 1 or BGI segment 14.

VI. Conclusion

The present invention can be characterized as a new interconnect structure for a programmable gate array device. Although the preferred embodiment includes configurable logic cells and configurable input/output cells, the interconnect structure can be applied to any logic array type structure, with logic cells, or input/output cells which are not necessarily configurable.

Overall, the architecture overcomes many of the problems of the prior art. The signal propagation is no longer constrained from left to right by the interconnect structure or the input and output orientation of the CLBs. The interconnect structure of the present invention facilitates propagation of signals across the device with few PIP delays. This is accomplished using the BGI segments that are two CLBs in length, use of uncommitted long lines, and providing direct connection between eight neighbors. Also, greater flexibility is achieved by providing programmable connection between the BGI segments and the long lines.

The present invention allows for implementation of a programmable gate array in which the symmetry of the interconnections, the ability to provide multi-source nets, the ability to propagate signals long distances across the array without suffering speed penalty, and greater combinational logic capability are combined.

The present invention thus allows implementation of programmable gate arrays that are adaptable to a wider variety of applications than the prior art. Further, these implementations allow manufacture of a programmable gate array with greater functional density that can be efficiently utilized at a greater percentage capacity than available in prior art architectures for PGAs.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A configurable interconnect structure for a logic device,
where the logic device includes:
a plurality of logic cells, $CL_{1,1}$ to $CL_{C,R}$, arranged in an array consisting of C columns and R rows, each logic cell being denoted by $CL_{c,r}$ wherein c designates a column in the range 1 to C, and r designates a row in the range 1 to R, each of the logic cells $CL_{c,r}$ having plural inputs and at least one corresponding output, the plurality of logic cells generating cell output signals at the respective outputs of the logic cells in response to cell input signals supplied to the respective inputs;
a plurality of input/output pads; and
a plurality of input/output cells, each coupled to an input/output pad of the logic device and each having an input and an output, the plurality of input/output cells providing interfaces between the respective input/output pads and its respective inputs and outputs;

the configurable interconnect structure comprising:

(a) a configuration store for storing program data specifying a user defined interconnect function;

(b) a plurality of horizontal buses $HB_i$, for i equal to 1 to R+1, extending along the rows of the array;

(c) a plurality of vertical buses $VB_j$, for j equal to 1 to C+1, extending along the columns of the array;

(d) a plurality of switching means at respective intersections of horizontal and vertical buses, each switching means having a plurality of horizontal terminals, a plurality of vertical terminals and interconnect means for interconnecting respective ones of the horizontal or vertical terminals in response to program data in the configuration store;

wherein each horizontal bus $HB_i$ includes:

a plurality of conductive horizontal segments each of a length equal to or greater than a first distance separating two horizontally adjacent ones of said logic cells ($CL_{c,r}$ and $CL_{c+1,r}$), one or more of the horizontal segments having a first end connected to a horizontal terminal of a switching means located at the intersection of the horizontal bus $HB_i$ with a first vertical bus $VB_j$, and a second end connected to a horizontal terminal of a switching means located at the intersection of the horizontal bus $HB_i$ with another vertical bus $VB_k$, wherein each of said one or more horizontal segments is further connected to an interconnect point belonging to a first plurality of interconnect points, the first plurality of interconnect points being provided for interconnecting respective inputs or outputs of logic cells and/or input/output cells with respective ones of the horizontal segments, and wherein each horizontal bus $HB_i$ further includes:

a plurality of conductive horizontal long lines, each of a length substantially greater than one of at least two conductive horizontal segments in the horizontal bus $HB_i$ such that signal propagation time between ends of the horizontal long line is substantially less than signal propagation time through a like length of a combination of the at least two conductive horizontal segments and a corresponding number of switching means coupling the at least two conductive horizontal segments together, each horizontal long line extending horizontally across the array adjacent to a row of logic cells or input/output cells and intersecting across two or more vertical buses ($VB_j$, $VB_{j+1}$), and each being connected to a second plurality of programmable interconnect points (PIPs) that are provided for interconnecting respective outputs of logic cells and/or input/output cells with the respective horizontal long line in response to program data in the configuration store, and each horizontal long line being nonprogrammably connected directly to a respective plurality of inputs belonging to logic cells or to input/output cells adjacent to the respective horizontal long line;

wherein each vertical bus $VB_j$ includes:

a plurality of conductive vertical segments each of a length equal to or greater than a second distance separating two vertically adjacent ones of said logic cells ($CL_{c,r}$ and $CL_{c,r+1}$), one or more of the vertical segments having a first end connected to a vertical terminal of a switching means located at the intersection of the vertical bus $VB_j$ with a first horizontal bus $HB_i$, and a second end connected to a vertical terminal of a switching means located at the intersection of the vertical bus $VB_j$ with another horizontal bus $HB_m$, wherein each of said one or more vertical segments is further connected to an interconnect point belonging to a third plurality of interconnect points, the third plurality of interconnect points being provided for interconnecting respective inputs or outputs of logic cells and/or input/output cells with respective ones of the vertical segments, and wherein each vertical bus $VB_j$ further includes:

a plurality of conductive vertical long lines, each of a length substantially greater than one of at least two conductive vertical segments in the same vertical bus $VB_j$ such that signal propagation time between ends of the vertical long line is substantially less than signal propagation time through a like length of a combination of the at least two conductive vertical segments and a corresponding number of switching means coupling the at least two conductive vertical segments together, each vertical long line extending vertically across the array adjacent to a column of logic cells or input/output cells and intersecting across two or more horizontal buses ($HB_i$, $HB_{i+1}$), and each being connected to a fourth plurality of programmable interconnect points (PIPs) that are provided for interconnecting respective outputs of logic cells and/or input/output cells with the respective vertical long line in response to program data in the configuration store, and each vertical long line being nonprogrammably connected directly to a respective plurality of inputs belonging to logic cells or to input/output cells adjacent to the respective vertical long line; and the configurable interconnect structure further comprising:

(e) a plurality of programmable interconnect means, at respective intersections of the horizontal and vertical buses, each for interconnecting in response to program data in the configuration store a respective horizontal segment with a vertical long line or a respective vertical segment with a horizontal long line.

2. The interconnect structure of claim 1, wherein at least one of the plurality of horizontal segments has a first end connected to a horizontal connection of a switching means at the intersection with vertical bus $VB_j$, for j equal to 1 through C−1, and a second end connected to a horizontal connection of a switching means at the intersection with vertical bus $VB_k$, where k=j+2.

3. The interconnect structure of claim 2, wherein at least one of the plurality of vertical segments has a first end connected to a vertical connection of a switching means at the intersection with horizontal bus $HB_j$, for j equal to 1 through R−1, and a second end connected to a vertical connection of a switching means at the intersection with horizontal bus $HB_k$, where k=j+2.

4. The interconnect structure of claim 1, wherein at least one horizontal or vertical bus includes at least one committed long line extending across the array and having a fixed connection to an input of a logic cell and wherein the at least one bus also includes a conducting uncommitted long line extending across the array, where said uncommitted long line is not connected to a nonprogrammable interconnect point, the interconnect structure further comprising:
a plurality of programmable interconnect points, each connected to the uncommitted long line, for interconnecting respective outputs of logic cells and input/output cells adjacent to the one bus with the uncommitted long line in response to program data in the configuration store, and
another plurality of programmable interconnect points, each connected to the uncommitted long line, for interconnecting the uncommitted long line with at least one other bus in response to program data in the configuration store.

5. The interconnect structure of claim 1, wherein each member of a subset of the plurality of horizontal segments is connected at the first end to a switching means at the intersection with a vertical bus $VB_1$, and is connected at the second end to a switching means at the intersection with a vertical bus $VB_m$, where $m = 1 + k$ and k is greater than one.

6. The interconnect structure of claim 5, wherein each member of a subset of the plurality of vertical segments is connected at the first end to a switching means at the intersection with a horizontal bus $VB_1$, and is connected at the second end to a switching means at the intersection with a horizontal bus $HB_m$, where $m = 1 + k$ and k is greater than one.

7. The interconnect structure of claim 1, wherein each horizontal bus includes N horizontal segments, and each member of a subset of the plurality of switching means includes M horizontal connections on a left side of the switching means and M horizontal connections on a right side of the switching means, where M is less than N, and wherein at least (N−M) horizontal segments through the intersection at which a member of the subset is located spans two or more columns of logic cells.

8. The interconnect structure of claim 7, wherein each vertical bus includes N vertical segments, and each member of a subset of the plurality of switching means includes M vertical connections on a top side of the switching means and M vertical connections on a bottom side of the switching means, where M is less than N, and wherein at lest (N−M) vertical segments through the intersection at which a member of the subset is located spans two or more rows of logic cells.

9. The interconnect structure of claim 1, further including:
a horizontal control line extending across the array in each of the horizontal buses;
a vertical control line extending across the array in each of the vertical buses;
a conducting line;
a first plurality of programmable interconnect points, each connected to the control line in a given bus, for interconnecting respective outputs of logic cells and input/output cells adjacent to the given bus with the control line in response to program data in the configuration store;
a second plurality of interconnect points, each connected to the control line in a given bus, for interconnecting respective inputs of logic cells and input/output cells adjacent to the control line;
means for driving a control signal to the conducting line; and
a plurality of configurable line driving means, each coupled to the control line in a respective bus and to the conducting line, for driving a signal from the control line in the respective bus to the conducting line, or for driving a signal from the conducting line to the control line in the respective bus, in response to program data in the configuration store.

10. The interconnect structure of claim 1, further including:
configurable repowering means, coupled to at least one horizontal segment, configurable for repowering signals on the one horizontal segment propagating in a first direction, for repowering signals on the one horizontal segment propagating in a second direction, or for passing signals propagating in either the first direction or the second direction, in response to program data in the configuration store.

11. The interconnect structure of claim 10, further including:
configurable repowering means, coupled to at least one vertical segment, configurable for repowering signals on the one vertical segment propagating in a first direction, for repowering signals on the one vertical segment propagating in a second direction, or for passing signals propagating in either the first direction or the second direction, in response to program data in the configuration store.

12. The interconnect structure of claim 1, wherein the configurable interconnect structure is symmetrically disposed relative to the inputs and outputs of the logic cells.

13. The interconnect structure of claim 1, wherein the plurality of interconnect points connected to at least one horizontal segment includes a first subset of fixed connections to inputs of logic cells and a second subset of programmable interconnect means, coupled to the configuration store, interconnecting respective inputs or outputs of logic cells with respective horizontal segments in response to program data in the configuration store.

14. The interconnect structure of claim 13, wherein the plurality of interconnect points connected to at least one vertical segment includes a first subset of fixed connections to inputs of logic cells and a second subset of programmable interconnect means, coupled to the configuration store, interconnecting respective inputs or outputs of logic cells with respective vertical segments in response to program data in the configuration store.

15. A configurable interconnect structure for a configurable logic device,
where the configurable logic device includes:
a configuration store for storing program data specifying a user defined data processing function,
a plurality of configurable logic cells, $CL_{1,1}$ to $CL_{C,R}$, arranged in an array consisting of C columns and R rows, each configurable logic cell being denoted by $CL_{c,r}$ where c designates a column in the range 1 to C, and r designates a row in the range 1 to R, each of the logic cells $CL_{c,r}$ having an input and an output, and being coupled to the configuration store, the plurality of logic cells generating cell output signals at the respective outputs of the logic cells in response to cell input signals supplied to the respective inputs and in response to program data in the configuration store;

a plurality of input/output pads; and a plurality of configurable input/output cells, each coupled to an input/output pad of the configurable logic device, each having an input and an output, and each being coupled to the configuration store, the plurality of input/output cells providing interfaces between the respective input/output pads and its respective inputs and outputs in response to program data in the configuration store;

the configurable interconnect structure comprising:

(a) a plurality of horizontal buses $HB_i$, for i equal to 1 to R+1, extending along the rows of the array;

(b) a plurality of vertical buses $VB_j$, for j equal to 1 to C+1, extending along the columns of the array;

(c) a plurality of switching means at respective intersections of horizontal and vertical buses, each switching means having a plurality of horizontal terminals, a plurality of vertical terminals and interconnect means for interconnecting respective ones of the horizontal or vertical terminals in response to program data in the configuration store;

wherein each horizontal bus $HB_i$ includes:

a plurality of conductive horizontal segments each of a length equal to or greater than a first distance separating two horizontally adjacent ones of said configurable logic cells ($CL_{c,r}$ and $CL_{c+1,r}$), one or more of the horizontal segments having a first end connected to a horizontal terminal of a switching means located at the intersection of the horizontal bus $HB_i$ with a first vertical bus $VB_j$, and a second end connected to a horizontal terminal of a switching means located at the intersection of the horizontal bus $HB_i$ with another vertical bus $VB_k$, wherein each of said one or more horizontal segments is further connected to an interconnect point belonging to a first plurality of interconnect points, the first plurality of interconnect points being provided for interconnecting respective inputs or outputs of logic cells and/or input/output cells with respective ones of the horizontal segments, and wherein each horizontal bus $HB_i$ further includes:

a plurality of conductive horizontal long lines, each of a length substantially greater than one of at least two conductive horizontal segments in the same horizontal bus $HB_i$ such that signal propagation time between ends of the horizontal long line is substantially less than signal propagation time through a like length of a combination of the at least two conductive horizontal segments and a corresponding number of switching means coupling the at least two conductive horizontal segments together, each horizontal long line extending horizontally across the array adjacent to a row of logic cells or input/output cells and intersecting across two or more vertical buses ($VB_j$, $VB_{j+1}$), and each being connected to a second plurality of programmable interconnect points (PIPs) that are provided for interconnecting respective outputs of logic cells and/or input/output cells with the respective horizontal long line in response to program data in the configuration store, and each horizontal long line being nonprogrammably connected directly to a respective plurality of inputs belonging to logic cells or to input/output cells adjacent to the respective horizontal long line;

wherein each vertical bus $VB_j$ includes:

a plurality of conductive vertical segments each of a length equal to or greater than a second distance separating two vertically adjacent ones of said logic cells ($CL_{c,r}$ and $CL_{c,r+1}$), one or more of the vertical segments having a first end connected to a vertical terminal of a switching means located at the intersection of the vertical bus $VB_j$ with a first horizontal bus $HB_i$, and a second end connected to a vertical terminal of a switching means located at the intersection of the vertical bus $VB_j$ with another horizontal bus $HB_m$, wherein each of said one or more vertical segments is further connected to an interconnect point belonging to a third plurality of interconnect points, the third plurality of interconnect points being provided for interconnecting respective inputs or outputs of logic cells and/or input/output cells with respective ones of the vertical segments, and wherein each vertical bus $VB_j$ further includes:

a plurality of conductive vertical long lines, each of a length substantially greater than one of at least two conductive vertical segments in the same vertical bus $VB_j$ such that signal propagation time between ends of the vertical long line is substantially less than signal propagation time through a like length of a combination of the at least two conductive vertical segments and a corresponding number of switching means coupling the at least two conductive vertical segments together, each vertical long line extending vertically across the array adjacent to a column of logic cells or input/output cells and intersecting across two or more horizontal buses ($HB_i$, $HB_{i+1}$), and each being connected to a fourth plurality of programmable interconnect points (PIPs) that are provided for interconnecting respective outputs of logic cells and/or input/output cells with the respective vertical long line in response to program data in the configuration store, and each vertical long line being nonprogrammably connected directly to a respective plurality of inputs belonging to logic cells or to input/output cells adjacent to the respective vertical long line; and the configurable interconnect structure further comprising:

(d) a plurality of programmable interconnect means, at respective intersections of the horizontal and vertical buses, each for interconnecting in response to program data in the configuration store a respective horizontal segment with a vertical long line or a respective vertical segment with a horizontal long line.

16. The interconnect structure of claim 15, wherein at least one of the plurality of horizontal segments has a first end connected to a horizontal connection of a switching means at the intersection with vertical bus $VB_j$, for j equal to 1 through C−1, and a second end connected to a horizontal connection of a switching means at the intersection with vertical bus $VB_k$, where k=j+2.

17. The interconnect structure of claim 16, wherein at least one of the plurality of vertical segments has a first end connected to a vertical connection of a switching means at the intersection with horizontal bus $HB_j$, for j equal to 1 through R−1, and a second end connected to a vertical connection of a switching means at the intersection with horizontal bus $HB_k$, where k=j+2.

18. The interconnect structure of claim 15, wherein at least one horizontal or vertical bus includes at least one committed long line extending across the array and having a fixed connection to an input of a logic cell and wherein the at least one bus also includes a conducting uncommitted long line extending across the array, where said uncommitted long line is not connected to a nonprogrammable interconnect point,
the interconnect structure further comprising:
a plurality of programmable interconnect points, each connected to the uncommitted long line, for interconnecting respective outputs of logic cells and input/output cells adjacent to the one bus with the uncommitted long line in response to program data in the configuration store, and
another plurality of programmable interconnect points, each connected to the uncommitted long line, for interconnecting the uncommitted long line with at least one other bus in response to program data in the configuration store.

19. The interconnect structure of claim 15, wherein each member of a subset of the plurality of horizontal segments is connected at the first end to a switching means at the intersection with a vertical bus $VB_j$, and is connected at the second end to a switching means at the intersection with a vertical bus $VB_m$, where m=1+k and k is greater than one.

20. The interconnect structure of claim 19, wherein each member of a subset of the plurality of vertical segments is connected at the first end to a switching means at the intersection with a horizontal bus $HB_j$, and is connected at the second end to a switching means at the intersection with a horizontal bus $HB_m$, where m=1+k and k is greater than one.

21. The interconnect structure of claim 15, wherein each horizontal bus includes N horizontal segments, and each member of a subset of the plurality of switching means includes M horizontal connections on a left side of the switching means and M horizontal connections on a right side of the switching means, where M is less than N, and wherein at least (N−M) horizontal segments through the intersections at which a member of the subset is located spans two or more columns of configurable logic cells.

22. The interconnect structure of claim 21, wherein each vertical bus includes N vertical segments, and each member of a subset of the plurality of switching means includes M vertical connections on a top side of the switching means and M vertical connections on a bottom side of the switching means, where M is less than N, and wherein at least (N−M) vertical segments through the intersection at which a member of the subset is located spans two or more rows of configurable logic cells.

23. The interconnect structure of claim 15, further including:

a horizontal control line extending across the array in each of the horizontal buses;
a vertical control line extending across the array in each of the vertical buses;
a conducting line;
a first plurality of programmable interconnect points, each connected to the control line in a given bus, for interconnecting respective outputs of configurable logic cells and input/output cells adjacent to the given bus with the control line in response to program data in the configuration store;
a second plurality of interconnect points, each connected to the control line in a given bus, for interconnecting respective inputs of configurable logic cells and input/output cells adjacent to the control line;
means for driving a control signal to the conducting line; and
a plurality of configurable control line driving means, each coupled to the control line in a respective bus and to the conducting line, for driving a signal from the control line in the respective bus to the conducting line, or for driving a signal from the conducting line to the control line in the respective bus, in response to program data in the configuration store.

24. The interconnect structure of claim 15, further including:
configurable repowering means, coupled to at least one horizontal segment, configurable for repowering signals on the one horizontal segment propagating in a first direction, for repowering signals on the one horizontal segment propagating in a second direction, or for passing signals propagating in either the first direction or the second direction, in response to program data in the configuration store.

25. The interconnect structure of claim 15, wherein the configurable interconnect structure is symmetrically disposed relative to the inputs and outputs of the configurable logic cells.

26. The interconnect structure of claim 15, wherein the plurality of interconnect points connected to at least one horizontal segment includes a first subset of fixed connections to inputs of configurable logic cells and a second subset of programmable interconnect means, coupled to the configuration store, interconnecting respective inputs or outputs of configurable logic cells with respective horizontal segments in response to program data in the configuration store.

27. The interconnect structure of claim 26, wherein the plurality of interconnect points connected to at least one vertical segment includes a first subset of fixed connections to inputs of configurable logic cells and a second subset of programmable interconnect means, coupled to the configuration store, interconnecting respective inputs or outputs of configurable logic cells with respective vertical segments in response to program data in the configuration store.

28. A configurable interconnect structure for a configurable logic device,
where the configurable logic device includes:
a configuration store for storing program data specifying a user defined data processing function,
a plurality of configurable logic cells, $CL_{1,1}$ to $C_{C,R}$, arranged in an array consisting of C columns and R rows, each configurable logic cell being denoted by $CL_{c,r}$ where c designates a column in the range 1 to C, and r designates a row in the range 1 to R, each of the logic cells $CL_{c,r}$ having an input and an output, and being coupled to the configuration store, the plurality of logic cells generating cell output signals at the respective outputs of the logic cells in response to cell input signals supplied to the respective inputs and in response to program data in the configuration store;

a plurality of input/output pads; and a plurality of configurable input/output cells, each coupled to an input/output pad of the configurable logic device, each having an input and an output, and each being coupled to the configuration store, the plurality of input/output cells providing interfaces between the respective input/output pads and its respective inputs and outputs in response to program data in the configuration store;

the configurable interconnect structure comprising:

(a) a plurality of horizontal buses $HB_i$, for i equal to 1 to R+1, extending along the rows of the array;

(b) a plurality of vertical buses $VB_j$, for j equal to 1 to C+1, extending along the column of the array;

(c) a plurality of switching means at respective intersections of horizontal and vertical buses, each switching means having a plurality of horizontal terminals, a plurality of vertical terminals and interconnect means for interconnecting respective ones of the horizontal or vertical terminals in response to program data in the configuration store;

wherein each horizontal bus $HB_i$ includes:

a plurality of conductive horizontal segments, at least one of horizontal segments having a first end connected to a horizontal terminal of a switching means located at the intersection of the horizontal bus $HB_i$ with a first vertical bus $VB_j$, and a second end connected to a horizontal terminal of a switching means located at the intersection of the horizontal bus $HB_i$ with another vertical bus $VB_k$, wherein each horizontal segment is connected to an interconnect point belonging to a plurality of interconnect points provided for interconnecting respective inputs or outputs of logic cells and/or input/output cells with a respective horizontal segment, and wherein each horizontal bus $HB_i$ further includes:

a plurality of conductive horizontal long lines, each extending across the array, and each connected to a plurality programmable interconnect points provided for interconnecting respective outputs of logic cells and/or input/output cells with the respective horizontal long line in response to program data in the configuration store, and each horizontal long line being nonprogrammably connected directly to a respective plurality of inputs belonging to logic cells or to input/output cells adjacent to the respective horizontal long line; and wherein each horizontal bus $HB_i$ additionally includes:

a plurality of conductive horizontal uncommitted long lines, each extending across the array, and each connected to a plurality programmable interconnect points provided for interconnecting respective outputs of logic cells and/or input/output cells with the respective horizontal uncommitted long line in response to program data in the configuration store, where each horizontal uncommitted long line is not connected directly to a respective one or more inputs belonging to logic cells or to input/output cells adjacent to the respective horizontal uncommitted long line;

wherein each vertical bus $VB_j$ includes:

a plurality of conductive vertical segments, at least one of vertical segments having a first end connected to a vertical terminal of a switching means located at the intersection of the vertical bus $VB_j$ with a first horizontal bus $HB_i$, and a second end connected to a vertical terminal of a switching means located at the intersection of the vertical bus $VB_j$ with another horizontal bus $HB_m$, wherein each vertical segment is connected to an interconnect point belonging to a plurality of interconnect points provided for interconnecting respective inputs or outputs of logic cells and/or input/output cells with a respective vertical segment, and wherein each vertical bus $VB_j$ further includes:

a plurality of conductive vertical long lines, each extending across the array, and each connected to a plurality programmable interconnect points provided for interconnecting respective outputs of logic cells and/or input/output cells with the respective vertical long line in response to program data in the configuration store, and each vertical long line being nonprogrammably connected directly to a respective plurality of inputs belonging to logic cells or to input/output cells adjacent to the respective vertical long line; and wherein each vertical bus $VB_j$ additionally includes:

a plurality of conductive vertical uncommitted long lines, each extending across the array, and each connected to a plurality programmable interconnect points provided for interconnecting respective outputs of logic cells and/or input/output cells with the respective vertical uncommitted long line in response to program data in the configuration store, where each vertical uncommitted long line is not connected directly to a respective one or more inputs belonging to logic cells or to input/output cells adjacent to the respective vertical uncommitted long line;

the configurable interconnect structure further comprising:

(d) a first plurality of programmable interconnect means, at respective intersections of the horizontal and vertical buses, each for interconnecting in response to program data in the configuration store a respective horizontal segment with a vertical long line or a respective vertical segment with a horizontal long line; and (e) a second plurality of programmable interconnect means, at respective intersections of the horizontal and vertical buses, each for interconnecting in response to program data in the configuration store a respective horizontal segment with a vertical uncommitted long line or a respective vertical segment with a horizontal uncommitted long line.

29. The interconnect structure of claim 28, wherein each member of a subset of the plurality of horizontal segments is connected at the first end to a switching means at the intersection with a vertical bus $VB_j$, and is connected at the second end to a switching means at the intersection with a vertical bus $VB_m$, where $m=1+k$ and k is greater than one.

30. The interconnect structure of claim 29, wherein each member of a subset of the plurality of vertical segments is connected at the first end to a switching means at the intersection with a horizontal bus $HB_j$, and is connected at the second end to a switching means at the intersection with a horizontal bus $HB_m$, where $m=1+k$ and k is greater than one.

31. The interconnect structure of claim 28, wherein each horizontal bus includes N horizontal segments, and each member of a subset of the plurality of switching means includes M horizontal connections on a left side of the switching means and M horizontal connections on a right side of the switching means, where M is less than N, and wherein at least N−M horizontal segments through the intersections at which a member of the subset is located spans two or more columns of configurable logic cells.

32. The interconnect structure of claim 31, wherein each vertical bus includes N vertical segments, and each member of a subset of the plurality of switching means includes M vertical connections on a top side of the switching means and M vertical connections on a bottom side of the switching means, where M is less than N, and wherein at least N−M vertical segments through the intersection at which a member of the subset is located spans two or more rows of configurable logic cells.

33. The interconnect structure of claim 28, further including:
- a horizontal control line extending across the array in each of the horizontal buses;
- a vertical control line extending across the array in each of the vertical buses;
- a conducting line;
- a first plurality of programmable interconnect points, each connected to the control line in a given bus, for interconnecting respective outputs of configurable logic cells and input/output cells adjacent to the given bus with the control line in response to program data in the configuration store;
- a second plurality of interconnect points, each connected to the control line in a given bus, for interconnecting respective inputs of configurable logic cells and input/output cells adjacent to the control line;
- means for driving a control signal to the conducting line; and
- a plurality of configurable control line driving means, each coupled to the control line in a respective bus and to the conducting line, for driving a signal from the control line in the respective bus to the conducting line, or for driving a signal from the conducting line to the control line in the respective bus, in response to program data in the configuration store.

34. The interconnect structure of claim 28, further including:
configurable repowering means, coupled to at least one horizontal segment, configurable for repowering signals on the one horizontal segment propagating in a first direction, for repowering signals on the one horizontal segment propagating in a second direction, or for passing signals propagating in either the first direction or the second direction, in response to program data in the configuration store.

35. The interconnect structure of claim 34, further including:
configurable repowering means, coupled to at least one vertical segment, configurable for repowering signals on the one vertical segment propagating in a first direction, for repowering signals on the one vertical segment propagating in a second direction, or for passing signals propagating in either the first direction or the second direction, in response to program data in the configuration store.

36. The interconnect structure of claim 28, wherein the configurable interconnect structure is symmetrically disposed relative to the inputs and outputs of the configurable logic cells.

37. The interconnect structure of claim 28, wherein the plurality of interconnect points connected to at least one horizontal segment includes a first subset of fixed connections to inputs of configurable logic cells and a second subset of programmable interconnect means, coupled to the configuration store, interconnecting respective inputs or outputs of configurable logic cells with respective horizontal segments in response to program data in the configuration store.

38. The interconnect structure of claim 37, wherein the plurality of interconnect points connected to at least one vertical segment includes a first subset of fixed connections to inputs of configurable logic cells and a second subset of programmable interconnect means, coupled to the configuration store, interconnecting respective inputs or outputs of configurable logic cells with respective vertical segments in response to program data in the configuration store.

39. A configurable logic array comprising:
- a substrate;
- a plurality of logic areas defined on the substrate one near to the next, each logic area having a perimeter and programmable logic circuitry positioned within the perimeter for performing logic operations therein in accordance with user-provided configuration data; and
- an interconnect network defined on the substrate for carrying signals between the logic areas;
- wherein the interconnect network comprises a plurality of interconnect lines, said interconnect lines including a plurality long lines which extend across the substrate in different first and second directions and a plurality of substantially shorter interconnect segments which also extend across the substrate, where the shorter interconnect segments each have a length at least equal to or greater than a distance separating the nearest ones of said logic areas, where ends of the interconnect segments are connectable one to the next by way of a set of segment interconnect means provided at the ends of connectable ones of the segments and each long line is of a length substantially greater than one of at least two interconnect segments such that signal propagation time between ends of the long line is substantially less than signal propagation time through a like length of a combination of the at least two interconnect segments and a corresponding set of segment interconnect means coupling the at least two interconnect segments together;

wherein the interconnect network further comprises a plurality of programmable interconnect points, responsive to user-provided configuration data, for interconnecting interconnect lines coupled thereto in accordance with the configuration data;

wherein at least one of said programmable interconnect points has a long line extending in the first direction coupled thereto and a shorter interconnect segment also coupled thereto; and wherein at least a second of said programmable interconnect points has a long line extending in the second direction coupled thereto and a shorter interconnect segment also coupled thereto.

40. The configurable logic array of claim 39 wherein at least one of the short segments extends in said first direction and a second of the short segments extends in said second direction; and wherein at least one of said programmable interconnect points has a long line extending in the first direction coupled thereto and a shorter interconnect segment extending in the second direction also coupled thereto; and wherein at least a second of said programmable interconnect points has a long line extending in the second direction coupled thereto and a shorter interconnect segment extending in the first direction also coupled thereto.

41. The configurable logic array of claim 39 wherein said logic areas are arranged to define a rectangular matrix and each long line extends a distance corresponding approximately to that separating two opposing sides of the matrix.

42. The configurable logic array of claim 41 wherein each long line extends a distance greater than that separating two opposing sides of the matrix;

wherein horizontal and vertical long lines are provided about the periphery of the matrix;

wherein a subset of said plurality of substantially shorter interconnect segments extend outside the periphery of the matrix; and wherein at least one programmable interconnect point is provided for programmably coupling a peripheral long line to one of the shorter interconnect segments that extend outside the periphery of said rectangular matrix.

43. The configurable logic array of claim 39 further comprising a plurality of programmable switching matrices provided on said substrate, each switching matrix receiving interconnect segments extending in first and second directions, wherein each switching matrix includes a plurality of said segment interconnect means for interconnecting the received segments of the switching matrix in accordance with user-provided configuration data; and wherein at least one programmable interconnect point programmably couples a long line to a shorter interconnect segment which is received by corresponding switching matrix.

44. A configurable logic device comprising:

a substrate having a circuit region of predefined width and length;

three or more logic areas distributed across the circuit region of the substrate, some of the logic areas being relatively near one another and some of the logic areas being relatively further apart from one another, where each logic area has a perimeter, a plurality of input terminals distributed about the perimeter, one or more output terminals also distributed about the perimeter, and logic circuitry positioned within the perimeter of the logic area for performing logic operations on signals received on the input terminals and for generating and outputting a corresponding one or more output signals on the one or more output terminals; and an interconnect network defined on the substrate for carrying signals between the logic areas;

wherein the interconnect network comprises a plurality of interconnect lines, said interconnect lines including a plurality long lines which extend across the substrate in different first and second directions for distances constituting at least a major portion of the width or length of the circuit region;

wherein the interconnect network further comprises a plurality of programmably connectable interconnect segments which also extend across the substrate in at least two different directions, where the shorter interconnect segments are substantially shorter than the long lines such that signal propagation time through a given long line is substantially less than signal propagation time through a corresponding set of programmably connected interconnect segments of like length and where each interconnect segment has a length at least equal to or greater than a distance separating the nearest ones of said logic areas;

wherein the interconnect network further comprises a plurality of programmable interconnect points (PIP's), responsive to user-provided configuration data, for interconnecting interconnect lines coupled thereto in accordance with the configuration data; and wherein at least one of said programmable interconnect points (PIP's) is a short-to-long bridging PIP that has a long line coupled thereto and a shorter interconnect segment also coupled thereto, said short-to-long bridging PIP being for programmably forming a signal routing bridge between its long line and its short segment.

45. A configurable logic device according to claim 44 having at least two short-to-long bridging PIP's, wherein at least a first of said short-to-long bridging PIP's programmably forms a first signal routing bridge between a first long line extending in the first direction and a short interconnect segment extending in a different direction; and wherein at least a second of said short-to-long bridging PIP's programmably forms a second signal routing bridge between a second long line extending in the second direction and a short interconnect segment extending in a different direction.

46. A configurable logic device according to claim 44 having at least eight short-to-long bridging PIP's, wherein the input and/or output terminals of each of said three or more logic areas are symmetrically distributed about the perimeters of their respective logic areas; and said at least eight short-to-long bridging PIP's are symmetrically distributed relative to the symmetrically distributed input and/or output terminals of each of said three or more logic areas.

47. A configurable logic device according to claim 46 wherein each of said three or more logic areas has at least four input terminals and/or four output terminals symmetrically distributed about its perimeter; and wherein there are at least four short-to-long bridging PIP's symmetrically distributed the perimeter of each of said three or more logic areas.

* * * * *

UNITED STATES PATENT AND TRADEMARK OFFICE
CERTIFICATE OF CORRECTION

PATENT NO. : 5,255,203

DATED : October 19, 1993

INVENTOR(S) : Om P. Agrawal et al.

It is certified that error appears in the above-indentified patent and that said Letters Patent is hereby corrected as shown below:

In the Drawings:

Substitute the attached Fig. 7 and Fig. 8 for that shown on Sheet 6 of 41.

Signed and Sealed this

Sixteenth Day of July, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,255,203
DATED : October 19, 1993
INVENTOR(S) : Om P. Agrawal et al.

It is certified that error appears in the above-indentified patent and that said Letters Patent is hereby corrected as shown below:

IN THE DRAWINGS:

Figure 7 and 8 should be deleted to appear as per attached figure 7 and 8.

This certificate supersedes Certificate of Correction issued July 16, 1996.

Signed and Sealed this

First Day of October, 1996

Attest:

BRUCE LEHMAN

Attesting Officer

Commissioner of Patents and Trademarks